United States Patent
Ichihashi et al.

(10) Patent No.: US 11,957,020 B2
(45) Date of Patent: Apr. 9, 2024

(54) LIGHT-EMITTING DEVICE, DISPLAY AND COLOR CONVERSION SUBSTRATE

(71) Applicant: Toray Industries, Inc., Tokyo (JP)

(72) Inventors: Yasunori Ichihashi, Otsu (JP); Daisaku Tanaka, Otsu (JP); Masahito Nishiyama, Otsu (JP); Keizo Udagawa, Otsu (JP); Yuka Tatematsu, Otsu (JP)

(73) Assignee: Toray Industries, Inc., Tokyo (JP)

( * ) Notice: Subject to any disclaimer, the term of this patent is extended or adjusted under 35 U.S.C. 154(b) by 876 days.

(21) Appl. No.: 16/962,967

(22) PCT Filed: Jan. 18, 2019

(86) PCT No.: PCT/JP2019/001501
§ 371 (c)(1),
(2) Date: Jul. 17, 2020

(87) PCT Pub. No.: WO2019/146525
PCT Pub. Date: Aug. 1, 2019

(65) Prior Publication Data
US 2021/0134890 A1 May 6, 2021

(30) Foreign Application Priority Data

Jan. 23, 2018 (JP) ................................. 2018-008614
Mar. 27, 2018 (JP) ................................. 2018-059236
Jul. 4, 2018 (JP) ................................. 2018-127381

(51) Int. Cl.
*H01L 25/075* (2006.01)
*C07F 5/02* (2006.01)
(Continued)

(52) U.S. Cl.
CPC .............. *H10K 59/38* (2023.02); *C07F 5/022* (2013.01); *C09K 11/06* (2013.01); *H10K 85/322* (2023.02); *C09K 2211/1018* (2013.01)

(58) Field of Classification Search
CPC ....... C07F 5/022; H01L 27/156; C09K 11/06; C09K 2211/1018; H10K 59/38
See application file for complete search history.

(56) References Cited

U.S. PATENT DOCUMENTS 5,446,157 A 8/1995 Morgan et al.
2006/0292489 A1 12/2006 Lee et al.
(Continued)

FOREIGN PATENT DOCUMENTS

EP 3305870 A1 4/2018
EP 3418781 A1 12/2018
(Continued)

OTHER PUBLICATIONS

Chinese Office Action for Chinese Application No. 201980008887.X, dated Sep. 1, 2021, with translation, 16 pages.
(Continued)

*Primary Examiner* — Omar F Mojaddedi
(74) *Attorney, Agent, or Firm* — BUCHANAN INGERSOLL & ROONEY PC

(57) ABSTRACT

A light-emitting device is described that includes a plurality of partially drivable light sources, and a color conversion component configured to convert at least part of incident light from at least part of the light sources and emit outgoing light falling in a different wavelength region from the incident light, where the color conversion component includes a pyrromethene derivative.

20 Claims, 1 Drawing Sheet

(51) Int. Cl.
*C09K 9/02* (2006.01)
*C09K 11/06* (2006.01)
*H01L 27/15* (2006.01)
*H10K 50/11* (2023.01)
*H10K 59/38* (2023.01)
*H10K 85/30* (2023.01)

(56) References Cited

U.S. PATENT DOCUMENTS

| | | | |
|---|---|---|---|
| 2008/0044773 A1* | 2/2008 | Kawamura | H10K 59/38 430/314 |
| 2011/0155296 A1* | 6/2011 | Nakamura | H10K 59/38 359/890 |
| 2012/0037890 A1* | 2/2012 | Okuda | C09K 11/06 548/405 |
| 2013/0038205 A1 | 2/2013 | Nakamura et al. | |
| 2017/0260212 A1* | 9/2017 | Lee | C07F 5/02 |
| 2018/0134952 A1 | 5/2018 | Ichihashi et al. | |
| 2019/0103521 A1 | 4/2019 | Umehara et al. | |
| 2019/0300782 A1* | 10/2019 | Kanazawa | H01L 33/50 |
| 2019/0300783 A1* | 10/2019 | Kanazawa | C09K 11/02 |
| 2019/0345380 A1 | 11/2019 | Ichihashi et al. | |

FOREIGN PATENT DOCUMENTS

| | | |
|---|---|---|
| EP | 3435124 A1 | 1/2019 |
| JP | 03152897 A | 6/1991 |
| JP | 08509471 A | 10/1996 |
| JP | 08286033 A | 11/1996 |
| JP | 2000208262 A | 7/2000 |
| JP | 2009043562 A | 2/2009 |
| JP | 2009288476 A | 12/2009 |
| JP | 2010061824 A | 3/2010 |
| JP | 2010159411 A | 7/2010 |
| JP | 2011032298 A | 2/2011 |
| JP | 2011070172 A | 4/2011 |
| JP | 2011241160 A | 12/2011 |
| JP | 2014153592 A | 8/2014 |
| JP | 2017120358 A | 7/2017 |
| JP | 2017128561 A | 7/2017 |
| TW | 200702924 A | 1/2007 |
| TW | 201737522 A | 10/2017 |
| TW | I708777 B | 11/2020 |
| WO | 2009037874 A1 | 3/2009 |
| WO | 2010092694 A1 | 8/2010 |
| WO | 2016098570 A1 | 6/2016 |
| WO | 2016190283 A1 | 12/2016 |
| WO | 2017014795 A1 | 1/2017 |
| WO | 2017164155 A1 | 9/2017 |

OTHER PUBLICATIONS

Taiwanese Office Action will Search Report for Taiwanese Application No. 108102386, dated Aug. 9, 2022 with translation, 14 pages.
Extended European Search Report for European Application No. 19743835.1, dated Mar. 15, 2021, 14 pages.
Burghart et al., "3,5-Diaryl-4,4-difluoro-4-bora-3a,4a-diaza-s-indacene (BODIPY) Dyes: Synthesis, Spectroscopic, Electrochemical, and Structural Properties", J. Org. Chem., 1999, vol. 64, No. 21, pp. 7813-7819.
International Search Report and Written Opinion for International Application PCT/JP2019/001501, dated Mar. 12, 2019, 8 pages.
Kollmannsberger et al., "Electrogenerated Chemiluminescence and Proton-Dependent Switching of Fluorescence: Functionalized Difluoroboradiaza-s-indacenes", Angew. Chem. Int. Ed. Engl., 1997, vol. 36, No. 12, pp. 1333-1335.
Kagakubinran (Chemical Handbook), Basic Edition, 5th revised version (page II:380-381).
Komatsu et al., "Rational design of boron dipyrromethene (BODIPY)-based photobleaching-resistant fluorophores applicable to a protein dynamics study", Chem. Commun., 2011, 47, pp. 10055-10057.
Chinese Office Action for Chinese Application No. 201980008887.X, dated Apr. 15, 2022, with translation, 16 pages.
Kagakubinran (Chemical Handbook), Basic Edition, 5th revised version (page II:380-381) 2004.
Korean Request for the Submission of an Opinion for Korean Application No. 10-2020-7019149, dated Dec. 13, 2023 with English translation, 14 pages.

* cited by examiner

LIGHT-EMITTING DEVICE, DISPLAY AND COLOR CONVERSION SUBSTRATE

CROSS REFERENCE TO RELATED APPLICATIONS

This is the U.S. National Phase application of PCT/JP2019/001501, filed Jan. 18, 2019, which claims priority to Japanese Patent Application No. 2018-008614, filed Jan. 23, 2018, Japanese Patent Application No. 2018-059236, filed Mar. 27, 2018 and Japanese Patent Application No. 2018-127381 filed Jul. 4, 2018, the disclosures of each of these applications being incorporated herein by reference in their entireties for all purposes.

FIELD OF THE INVENTION

The present invention relates to a light-emitting device, a display and a color conversion substrate.

BACKGROUND OF THE INVENTION

Multicolor techniques using color conversion systems have been studied actively to expand their application to liquid crystal displays, organic EL displays, illumination apparatuses, etc. Color conversion is the conversion of an emission from an emitter into a light with a longer wavelength, and means, for example, the conversion of blue emission to green emission or red emission. Compositions having such a color conversion function (hereinafter, appropriately written as the "color conversion compositions") are formed into films and combined with, for example, a blue light source to allow the blue light source to produce three primary colors, i.e., blue, green and red colors, thus enabling the production of white light.

Full color displays can be manufactured by combining a blue light source with films having a color conversion function (hereinafter, appropriately written as the "color conversion films") to form a light source unit that is a white light source, and combining such light source units with liquid crystal drive components and color filters. Furthermore, the white light source may be used as such without liquid crystal drive components, and may be applied as a white light source in, for example, LED illumination or the like.

An example challenge of liquid crystal displays is the enhancement in color reproducibility. The color reproducibility is effectively enhanced by narrowing the full width at half maximum in each of emission spectra of blue light, green light and red light from a light source unit to increase the color purities of the blue, green and red colors. A technique that has been proposed in order to solve this employs quantum dots of inorganic semiconductor microparticles as a component of a color conversion composition (see, for example, Patent Literature 1).

Furthermore, techniques are also proposed which use, in place of quantum dots, organic light-emitting materials as components in color conversion compositions. In exemplary techniques which use organic light-emitting materials as components in color conversion compositions, the use of pyrromethene derivatives is disclosed (see, for example, Patent Literature 1).

Unfortunately, liquid crystal displays have further problems such as slow response speed and low contrast. On the other hand, self-luminous displays such as organic EL displays and micro LED displays are self-luminous devices in which sub-pixels themselves constituting each of pixels emit light separately and independently, and, on account of this, have characteristics such as high response speed, and very low brightness in the non emissive state resulting in high contrast.

Color conversion (CCM) methods have been proposed as one approach to realizing multicolor emission using self-luminous devices (see, for example, Patent Literatures 2 and 3). The CCM method is, for example, a method which produces multiple colors by arranging, in front of an organic EL device, color conversion layers that absorb the emission from the organic EL device and emit light with a wavelength distribution different from the absorption wavelength. This system facilitates the manufacturing of displays on account of the fact that the organic EL device that is used may be monochromatic, and is being actively studied to broaden its application to large-screen displays.

PATENT LITERATURE

Patent Literature 1: Japanese Patent Application Laid-open No. 2011-241160
Patent Literature 2: Japanese Patent Application Laid-open No. H8-286033
Patent Literature 3: WO 2010/092694

SUMMARY OF THE INVENTION

However, the technique described in Patent Literature 1 which uses quantum dots has a problem in that the material is labile to heat, and water and oxygen in the air, and is not satisfactory in durability. Furthermore, light-emitting devices manufactured using the organic light-emitting material described in Patent Literature 1 are still unsatisfactory from the point of view of the enhancements in color reproducibility and durability. In particular, techniques cannot sufficiently concurrently satisfy color reproducibility and high durability.

Patent Literatures 2 and 3 disclose CCM methods using a fluorescent pigment as a light-emitting material, but the spectrum of excitation light and the emission spectrum of the fluorescent material are not sharp and thus the color purity is not sufficiently enhanced. Furthermore, the fluorescent materials are unstable to light and cause a problem in which the chromaticities significantly change during continuous illumination.

Objects of the present invention are to provide an organic light-emitting material suited as a color conversion material in an organic EL display or a micro LED display, and to concurrently achieve enhanced color reproducibility and high durability while maintaining the response speed and the contrast.

To solve the problem described above and to achieve the objects, a light-emitting device according to the present invention includes: a plurality of partially drivable light sources, and a color conversion component configured to convert at least part of incident light from at least part of the light sources and emit outgoing light falling in a different wavelength region from the incident light, the color conversion component including a pyrromethene derivative.

In the light-emitting device according to the present invention, emission from the light sources is blue light emission or blue-green light emission.

In the light-emitting device according to the present invention, the color conversion component includes: partition walls disposed to form a pattern of recesses corresponding to the light sources, and color conversion layers disposed in the recesses.

In the light-emitting device according to the present invention, the color conversion layers includes two or more kinds of color conversion layers configured to emit outgoing lights falling in different wavelength regions from one another.

In the light-emitting device according to the present invention, part of the recesses includes no color conversion layers.

The light-emitting device according to the present invention further includes a color filter.

In the light-emitting device according to the present invention, the light sources are light-emitting diodes.

In the light-emitting device according to the present invention, the light-emitting diodes includes a gallium nitride-based compound semiconductor.

In the light-emitting device according to the present invention, the light sources are organic electroluminescent devices including an organic layer between an anode and a cathode, the organic electroluminescent devices being configured to emit light using electric energy.

In the light-emitting device according to the present invention, the organic electroluminescent devices are top emission-type organic electroluminescent devices.

In the light-emitting device according to the present invention, the organic layer includes a host material and a dopant material, and the dopant material includes at least one material selected from boron complex-based dopant materials, pyrene-based dopant materials, chrysene-based dopant materials, benzofluoranthene-based dopant materials and amine-based dopant materials.

In the light-emitting device according to the present invention, the organic layer includes a host material and a dopant material, and the host material includes an anthracene-based host material.

In the light-emitting device according to the present invention, the organic layer includes a thermally activated delayed fluorescent material.

In the light-emitting device according to the present invention, the pyrromethene derivative is a compound represented by the general formula (1) below:

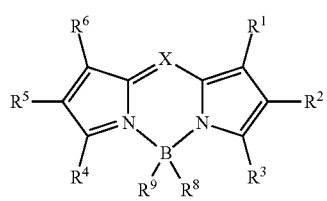

(1)

where in the general formula (1), X is C—$R^7$ or N, and $R^1$ to $R^9$ are the same as or different from one another and are each selected from hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, ester group, carbamoyl group, amino group, nitro group, silyl group, siloxanyl group, boryl group, sulfo group, phosphine oxide group, and fused ring and aliphatic ring formed with an adjacent substituent.

In the light-emitting device according to the present invention, X in the general formula (1) is C—$R^7$, and $R^7$ is a group represented by the general formula (2) below:

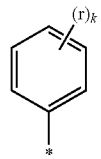

(2)

where in the general formula (2), r is selected from the group consisting of hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, ester group, carbamoyl group, amino group, nitro group, silyl group, siloxanyl group, boryl group, sulfo group and phosphine oxide group, k is an integer of 1 to 3, and when k is 2 or greater, r is the same as or different from one another.

In the light-emitting device according to the present invention, $R^1$, $R^3$, $R^4$ and $R^6$ in the general formula (1) are the same as or different from one another and are each a substituted or unsubstituted alkyl group.

In the light-emitting device according to the present invention, $R^1$, $R^3$, $R^4$ and $R^6$ in the general formula (1) are the same as or different from one another and are each a substituted or unsubstituted aryl group.

In the light-emitting device according to the present invention, at least one of $R^1$ to $R^6$ in the general formula (1) is an electron withdrawing group.

In the light-emitting device according to the present invention, in the general formula (1), the electron withdrawing group is a group containing a fluorine atom.

In the light-emitting device according to the present invention, in the general formula (1), the electron withdrawing group is a group selected from fluorine-containing acyl groups, fluorine-containing ester groups, fluorine-containing amide groups, fluorine-containing sulfonyl groups, fluorine-containing sulfonate ester groups, and fluorine-containing sulfonamide groups.

In the light-emitting device according to the present invention, either $R^8$ or $R^9$ in the general formula (1) is a cyano group.

In the light-emitting device according to the present invention, the pyrromethene derivative is a pyrromethene derivative that, when excited by excitation light, shows emission having a peak wavelength observed in a region of not less than 500 nm and not more than 580 nm.

In the light-emitting device according to the present invention, the pyrromethene derivative is a pyrromethene derivative that, when excited by excitation light, shows emission having a peak wavelength observed in a region of not less than 580 nm and not more than 750 nm.

In the light-emitting device according to the present invention, the color conversion component includes a light-emitting material (a) and a light-emitting material (b) described below, and at least one of the light-emitting material (a) and the light-emitting material (b) is the pyrromethene derivative, light-emitting material (a): a light-emitting material that, when excited by excitation light, shows emission having a peak wavelength observed in a region of not less than 500 nm and not more than 580 nm, light-emitting material (b): a light-emitting material that, when excited by at least one of excitation light and the emission from the light-emitting material (a), shows emission having a peak wavelength observed in a region of not less than 580 nm and not more than 750 nm.

In the light-emitting device according to the present invention, the color conversion component includes a resin.

In the light-emitting device according to the present invention, the resin has an oxygen permeability of not less than 0.1 cc/m²·day·atm.

A display according to the present invention includes: the light-emitting device according to any one of the above-described inventions.

A color conversion substrate according to the present invention includes: a pyrromethene derivative.

The light-emitting device and the color conversion substrate according to the present invention are excellent in response speed and contrast, and can effectively achieve enhanced color reproducibility and high durability in a concurrent manner. The display according to the present invention, by virtue of using the above light-emitting device, is excellent in response speed and contrast, and can effectively achieve enhanced color reproducibility and high durability in a concurrent manner.

DETAILED DESCRIPTION OF EMBODIMENTS OF THE INVENTION

Hereinbelow, preferred embodiments of light-emitting devices, displays and color conversion substrates according to the present invention will be described in detail. However, the present invention is not limited to those embodiments described below, and may be carried out with various modifications in accordance with purposes or use applications.

⟨Light-Emitting Devices⟩

Figure 1:
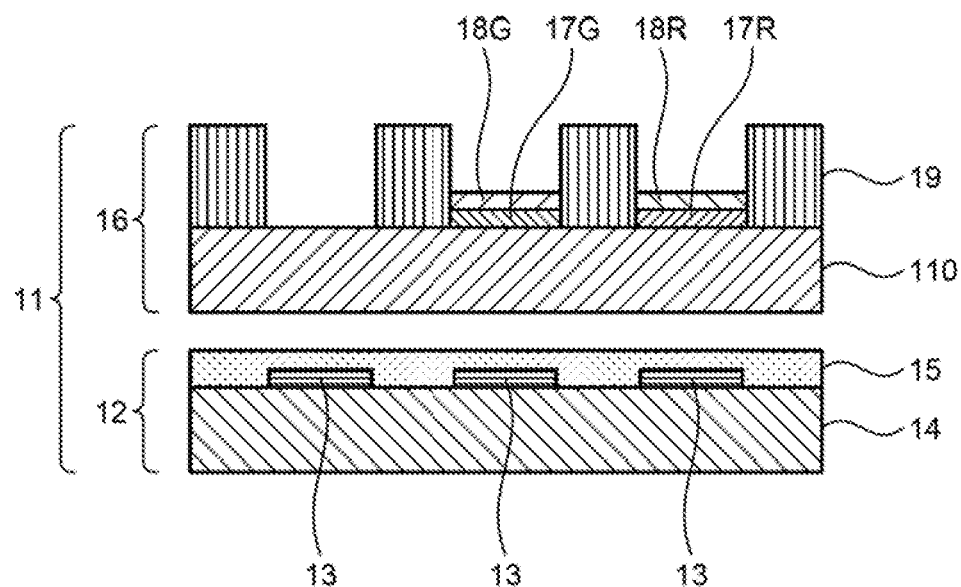
FIG. 1 is a schematic sectional view illustrating a configuration of a first example of light-emitting devices according to an embodiment of the present invention.

Light-emitting devices according to an embodiment of the present invention will be described in detail. FIG. 1 is a schematic sectional view illustrating a configuration of a first example of the light-emitting devices according to an embodiment of the present invention. As illustrated in FIG. 1, a light-emitting device 11 of this first example includes an organic EL substrate 12 and a color conversion substrate 16.

In this first example, the organic EL substrate 12 includes, as illustrated in FIG. 1, a plurality (for example, three) of organic EL devices 13, a transparent substrate 14 and a sealing layer 15. The organic EL devices 13 are an example of partially drivable light sources, and are disposed on the transparent substrate 14. The sealing layer 15 is a layer covering the organic EL devices 13 and, as illustrated in FIG. 1, is disposed on the transparent substrate 14 carrying the organic EL devices 13.

The color conversion substrate 16 is an example of color conversion components in the present invention. The color conversion component in the present invention converts at least part of incident light from at least part of a plurality of light sources (for example, the light sources or at least part of the light sources) and emits outgoing light falling in a different wavelength region from the incident light. Furthermore, this color conversion component includes a pyrromethene derivative.

Specifically, in this first example, the color conversion substrate 16 includes, as illustrated in FIG. 1, a red conversion layer 17R, a green conversion layer 17G, a red color filter 18R, a green color filter 18G, partition walls 19, and a substrate 110. The partition walls 19 are disposed on the substrate 110 so as to form a pattern corresponding to the organic EL devices 13. As illustrated in FIG. 1, the partition walls 19 form a pattern of recesses on the substrate 110 corresponding to the organic EL devices 13. The red conversion layer 17R and the green conversion layer 17G are each an example of color conversion layers disposed in recesses divided by the partition walls 19, and are each a layer including a pyrromethene derivative. As illustrated in FIG. 1, the red conversion layer 17R is disposed at a predetermined location of the recesses defined by the partition walls 19. The red color filter 18R is disposed on the red conversion layer 17R. The green conversion layer 17G is disposed at a different location of the recesses defined by the partition walls 19 from the red conversion layer 17R. The green color filter 18G is disposed on the green conversion layer 17G. Furthermore, part of the recesses defined by the partition walls 19 includes no color conversion layers. For example, the recesses defined by the partition walls 19 in this first example include a first recess in which a red conversion layer 17R and a red color filter 18R are disposed, a second recess in which a green conversion layer 17G and a green color filter 18G are disposed, and a third recess in which there are no red conversion layers 17R or green conversion layers 17G.

The color conversion substrate 16 having the above configuration converts at least part of incident light from at least part of the organic EL devices 13 into colors through the red conversion layer 17R and the green conversion layer 17G. As a result of this, the color conversion substrate 16 emits outgoing lights falling in a different wavelength region from the incident light from the organic EL devices 13. Specifically, the color conversion substrate 16 emits the outgoing lights from the respective recesses defined by the partition walls 19, namely, the recess having the red conversion layer 17R and the recess having the green conversion layer 17G. That is, the color conversion layers in the color conversion substrate 16 include two kinds of color conversion layers (red conversion layer 17R and green conversion layer 17G) emitting outgoing lights in different wavelength regions from each other. The light-emitting device 11 of the first example is composed, as illustrated in FIG. 1, of a combination of the color conversion substrate 16 and the organic EL substrate 12 described hereinabove.

Incidentally, the number of the organic EL devices 13 arranged as the light sources is not limited to three illustrated in FIG. 1, and may be two or more (plural). Furthermore, the color conversion layers in the color conversion substrate 16 are not limited to the red conversion layer 17R and the green conversion layer 17G illustrated in FIG. 1, and may include two or more kinds of color conversion layers.

Figure 2:
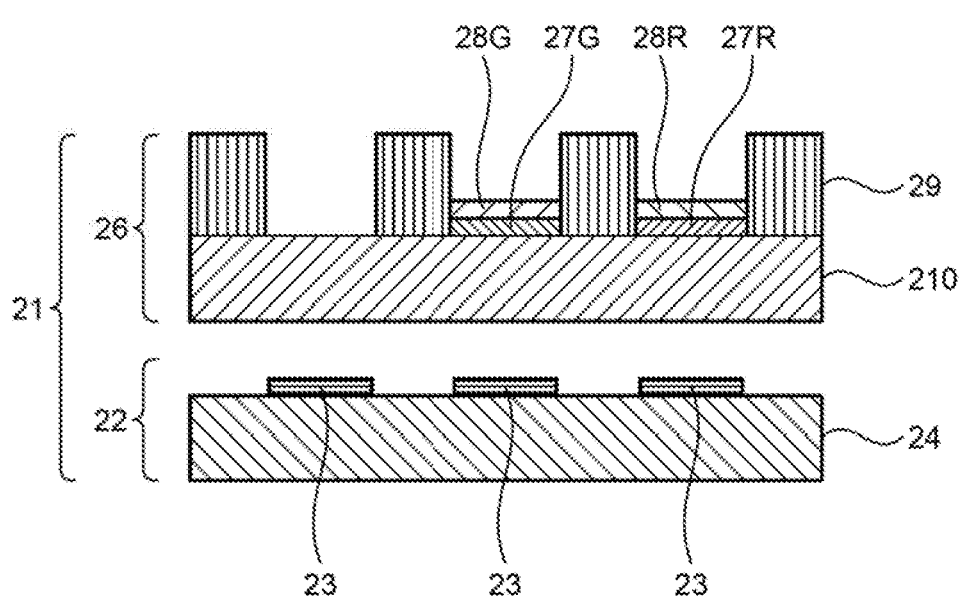
FIG. 2 is a schematic sectional view illustrating a configuration of a second example of light-emitting devices according to an embodiment of the present invention.

FIG. 2 is a schematic sectional view illustrating a configuration of a second example of the light-emitting devices according to an embodiment of the present invention. As illustrated in FIG. 2, a light-emitting device 21 of this second example includes an LED substrate 22 including light-emitting diodes (LEDs), and a color conversion substrate 26.

In this second example, the LED substrate 22 includes, as illustrated in FIG. 2, a plurality (for example, three) of LEDs 23, and a transparent substrate 24. The LEDs 23 are an example of the partially drivable light sources, and are disposed on the transparent substrate 24. Furthermore, the LED substrate 22 is preferably a mini LED substrate or a micro LED substrate having a high-density array of tiny LEDs in individual pixels.

The color conversion substrate 26 is an example of the color conversion components in the present invention. Specifically, in this second example, the color conversion substrate 26 includes, as illustrated in FIG. 2, a red conversion layer 27R, a green conversion layer 27G, a red color filter 28R, a green color filter 28G, partition walls 29, and a substrate 210.

The partition walls 29 are disposed on the substrate 210 so as to form a pattern corresponding to the LEDs 23. As illustrated in FIG. 2, the partition walls 29 form a pattern of recesses on the substrate 210 corresponding to the LEDs 23. The red conversion layer 27R and the green conversion layer 27G are each an example of color conversion layers disposed in recesses divided by the partition walls 29, and are each a layer including a pyrromethene derivative. As illustrated in FIG. 2, the red conversion layer 27R is disposed at a predetermined location of the recesses defined by the partition walls 29. The red color filter 28R is disposed on the red conversion layer 27R. The green conversion layer 27G is disposed at a different location of the recesses defined by the partition walls 29 from the red conversion layer 27R. The green color filter 28G is disposed on the green conversion layer 27G. Furthermore, part of the recesses defined by the partition walls 29 includes no color conversion layers. For example, the recesses defined by the partition walls 29 in this second example include a first recess in which a red conversion layer 27R and a red color filter 28R are disposed, a second recess in which a green conversion layer 27G and a green color filter 28G are disposed, and a third recess in which there are no red conversion layers 27R or green conversion layers 27G.

The color conversion substrate 26 having the above configuration converts at least part of incident light from at least part of the LEDs 23 into colors through the red conversion layer 27R and the green conversion layer 27G. As a result of this, the color conversion substrate 26 emits outgoing lights falling in a different wavelength region from the incident light from the LEDs 23. Specifically, the color conversion substrate 26 emits the outgoing lights from the recesses defined by the partition walls 29, namely, the recess having the red conversion layer 27R and the recess having the green conversion layer 27G. That is, the color conversion layers in the color conversion substrate 26 include two kinds of color conversion layers (red conversion layer 27R and green conversion layer 27G) emitting outgoing lights in different wavelength regions from each other. The light-emitting device 21 of the second example is composed, as illustrated in FIG. 2, of a combination of the color conversion substrate 26 and the LED substrate 22 described hereinabove.

Incidentally, the number of the LEDs 23 arranged as the light sources is not limited to three illustrated in FIG. 2, and may be two or more (plural). Furthermore, the color conversion layers in the color conversion substrate 26 are not limited to the red conversion layer 27R and the green conversion layer 27G illustrated in FIG. 2, and may include two or more kinds of color conversion layers.

⟨Light Sources⟩

The light-emitting devices according to the present invention (for example, the light-emitting devices 11 and 21 illustrated in FIGS. 1 and 2) each include a plurality of light sources which are partially drivable. The light sources that are used may be any type of light sources as long as they can radiate an emission capable of exciting the phosphors in the color conversion layers. In principle, excitation light from any light source may be used, for example, light from fluorescent light sources such as hot cathode tubes, cold cathode tubes and inorganic electroluminescence (EL), organic EL device light sources, LED light sources and incandescent light sources, sunlight, etc. In FIG. 1, the organic EL devices 13 correspond to the light sources, and in FIG. 2 the LEDs 23 correspond to the light sources. The excitation light may be light having a single kind of emission peak or light having two or more kinds of emission peaks. In order to increase the color purity, light having a single kind of emission peak is preferable. Furthermore, it is possible to use an appropriate combination of a plurality of light sources having different kinds of emission peaks.

From the point of view of the fact that the color purity of blue light can be increased, it is preferable that in displays and illumination applications, the emission from at least part of the light sources in the present invention be blue light emission or blue-green light emission. The blue light or the blue-green light is preferably light having a maximum wavelength in the wavelength range of not less than 430 nm and not more than 500 nm. The emission spectrum of the blue light or the blue-green light may be of a single peak or double peaks. While the light having a maximum wavelength in the wavelength range of not less than 430 nm and not more than 500 nm may be one, such as YAG-based LED, that has a first peak in the wavelength range of not less than 430 nm and not more than 500 nm, and a second peak in the wavelength range of not less than 500 nm and not more than 700 nm, it is preferable from the point of view of the fact that the blue color purity is enhanced that the light do not have a maximum wavelength in the wavelength range of not less than 500 nm and not more than 700 nm. Furthermore, more preferred excitation light is light having a peak in the wavelength range of not less than 430 nm and not more than 500 nm. The excitation light in the wavelength range of not less than 430 nm and not more than 500 nm is light with relatively small excitation energy and thus the decomposition of the pyrromethene derivatives that are the light-emitting substances can be prevented. Thus, the light sources used in the light-emitting device are preferably light sources having a maximum emission in the wavelength range of not less than 430 nm and not more than 500 nm. Furthermore, the light sources preferably have a maximum emission in the wavelength range of not less than 440 nm and not more than 470 nm.

The light sources in the light-emitting device are preferably light-emitting diodes. When the light sources are light-emitting diodes, the light sources can be arranged with high definition to enable high-resolution displays. Furthermore, light-emitting diodes have high emission intensity to enable high-brightness displays.

Furthermore, from the point of view of the fact that the color purity of blue light can be increased, the light-emitting diodes as the light sources preferably have a gallium nitride-based compound semiconductor. Light-emitting diodes having a gallium nitride-based compound semiconductor can emit sharp excitation light, and consequently the color purity is enhanced.

The light sources in the light-emitting device are preferably organic electroluminescent devices that have an organic layer between an anode and a cathode and emit light using electric energy. When the light sources are such organic electroluminescent devices, the light sources can be arranged with high definition to enable high-resolution displays. Furthermore, the organic electroluminescent devices can be reduced in thickness to contribute to slimming of displays themselves.

More specifically, the organic electroluminescent devices have an anode, a cathode, and an organic layer disposed between the anode and the cathode. The organic layer includes at least an emission layer and an electron transport layer. The organic electroluminescent devices are preferably light sources that emit light from the organic layer, in particular the emission layer, using electric energy.

An exemplary stack structure of the organic layer is a stack structure composed of an emission layer and an electron transport layer (emission layer/electron transport layer). Furthermore, in addition to the stack structure consisting solely of emission layer/electron transport layer, other exemplary stack structures of the organic layers include the following first to third stack structures. Examples of the first stack structures include structures in which a hole transport layer, an emission layer and an electron transport layer are stacked (hole transport layer/emission layer/electron transport layer). Examples of the second stack structures include structures in which a hole transport layer, an emission layer, an electron transport layer and an electron injection layer are stacked (hole transport layer/emission layer/electron transport layer/electron injection layer). Examples of the third stack structures include structures in which a hole injection layer, a hole transport layer, an emission layer, an electron transport layer and an electron injection layer are stacked (hole injection layer/hole transport layer/emission layer/electron transport layer/electron injection layer). Furthermore, each type of the layers may include a single layer or a plurality of layers. Furthermore, the organic electroluminescent devices may be each a stack type including a plurality of phosphorescent emission layers or fluorescent emission layers in the organic layer, or may be light-emitting devices combining a fluorescent emission layer and a phosphorescent emission layer. Furthermore, in the organic layer, a plurality of emission layers differing in the color of emissions may be stacked together.

Furthermore, the organic electroluminescent devices may be each of a tandem type in which a plurality of the stacks of organic layers described above are stacked through an intermediate layer. In the stack structure of such tandem-type organic electroluminescent devices, at least one layer is preferably a phosphorescent emission layer. The intermediate layer is generally also called an intermediate electrode, an intermediate conductive layer, a charge generating layer, an electron withdrawing layer, a connection layer or an intermediate insulating layer. The intermediate layer may be a layer of known material configuration. Specific examples of the stack structures of the tandem-type organic electroluminescent devices include stack structures which include a charge generating layer as an intermediate layer between an anode and a cathode, as is the case in the following fourth and fifth stack structures. Examples of the fourth stack structures include stack structures including hole transport layer/emission layer/electron transport layer, a charge generating layer, and hole transport layer/emission layer/electron transport layer (hole transport layer/emission layer/electron transport layer/charge generating layer/hole transport layer/emission layer/electron transport layer). Examples of the fifth stack structures include stack structures including hole injection layer/hole transport layer/emission layer/electron transport layer/electron injection layer, a charge generating layer, and hole injection layer/hole transport layer/emission layer/electron transport layer/electron injection layer (hole injection layer/hole transport layer/emission layer/electron transport layer/electron injection layer/charge generating layer/hole injection layer/hole transport layer/emission layer/electron transport layer/electron injection layer). Specifically, pyridine derivatives and phenanthroline derivatives are preferably used as materials which constitute the intermediate layers.

Furthermore, the light sources in the light-emitting device are preferably top emission-type organic electroluminescent devices. When the light sources are top emission-type organic electroluminescent devices, for example, a method may be adopted in which the anode is made of a multilayer structure including a reflective electrode layer and a transparent electrode layer, and the film thickness of the transparent electrode layer on the reflective electrode layer is changed. Organic layers may be stacked appropriately on the anode, and thereafter a semi-transparent electrode, for example, a semi-transparent thin silver film or the like may be used as the cathode to introduce a microcavity structure in the organic electroluminescent device. When a microcavity structure is introduced in the organic electroluminescent devices, the spectrum of light emitted from the organic layer and coming out through the cathode is sharp as compared to when the organic electroluminescent devices do not have a microcavity structure, and further the front radiation intensity is significantly increased. When this is used in a display, contributions are made to enhancements in color gamut and brightness.

⟨Emission Layers⟩

When the light sources in the present invention have the organic layer described above, the organic layer preferably has, as already mentioned, an emission layer and preferably has a host material and a dopant material in the emission layer. In the present invention, the emission layer may be a single layer or a plurality of layers and, in both cases, is formed of a light-emitting material (host material, dopant material). The material forming the emission layer may be a mixture of a host material and a dopant material, or may be a host material alone. Furthermore, the host material and the dopant material may be each a single material or a combination of materials. The dopant material may be included throughout the entirety of the host material, or may be included partially in the host material. The dopant material may be stacked or dispersed in the host material. An emission layer including a mixture of a host material and a dopant material may be formed by a method in which the host material and the dopant material are co-deposited, or a method in which the host material and the dopant material are mixed together beforehand and then deposited.

Specifically, some light-emitting materials which may be used in the emission layers are those conventionally known as emitters, including fused ring derivatives such as anthracene and pyrene, metal chelated oxinoid compounds such as tris(8-quinolinolato)aluminum, bisstyryl derivatives such as bisstyrylanthracene derivatives and distyrylbenzene derivatives, dibenzofuran derivatives, carbazole derivatives and indolocarbazole derivatives. However, the light-emitting materials are not particularly limited thereto.

Examples of the host materials include, although not limited to, compounds having a fused aryl ring and derivatives thereof such as naphthalene, anthracene, phenanthrene, pyrene, chrysene, naphthacene, triphenylene, perylene, fluoranthene, fluorene and indene. Of these, anthracene derivatives and naphthacene derivatives are particularly preferable as the host materials.

In particular, it is preferable that the host material include an anthracene-based host material. The host material including an anthracene-based host material enables high color purity and highly efficient emission, and contributes to saving the power consumption of displays.

Examples of the dopant materials include, although not limited to, compounds having a fused aryl ring such as naphthalene, anthracene, phenanthrene, pyrene, chrysene, triphenylene, perylene, fluoranthene, fluorene and indene, and derivatives thereof (for example, 2-(benzothiazol-2-yl)-9,10-diphenylanthracene and 5,6,11,12-tetraphenylnaphthacene), aminostyryl derivatives such as 4,4'-bis(2-(4-diphenylaminophenyl)ethenyl)biphenyl and 4,4'-bis(N-(stilben-4-yl)-N-phenylamino)stilbene, pyrromethene derivatives, and aromatic amine derivatives represented by N,N'-diphenyl-N,N'-di(3-methylphenyl)-4,4'-diphenyl-1,1'-diamine.

In particular, the dopant material preferably includes at least one material selected from boron complex-based dopant materials, pyrene-based dopant materials, chrysene-based dopant materials, benzofluoranthene-based dopant materials and amine-based dopant materials. The boron complex-based dopant materials, the pyrene-based dopant materials, the chrysene-based dopant materials, the benzofluoranthene-based dopant materials and the amine-based dopant materials exhibit very sharp emission, and thus the color purity is enhanced. Furthermore, when the dopant material is an amine-based dopant material, the brightness is advantageously enhanced. When, on the other hand, the dopant material is a boron complex-based dopant material, the color gamut is advantageously enhanced. Of the boron complex-based dopant materials, quinoline boron complex-based dopant materials are preferable because they exhibit particularly sharp emission.

Furthermore, the emission layer in the present invention may include a phosphorescent material. A phosphorescent material is a material that shows phosphorescent emission even at room temperature. When a phosphorescent material is used as a dopant material, phosphorescent emission needs to be basically obtained even at room temperature. As long as this phosphorescent emission is obtained, the phosphorescent material as a dopant material is not particularly limited. For example, the phosphorescent material is preferably an organometal complex compound containing at least one metal selected from the group consisting of iridium (Ir), ruthenium (Ru), rhodium (Rh), palladium (Pd), platinum (Pt), osmium (Os) and rhenium (Re). In particular, an organometal complex containing iridium or platinum is more preferable from the point of view of the fact that it has a high phosphorescent emission yield even at room temperature. Examples of the host materials suitably used in combination with phosphorescent-emitting dopant materials include aromatic hydrocarbon compound derivatives such as indole derivatives, carbazole derivatives, indolocarbazole derivatives, nitrogen-containing aromatic compound derivatives having a pyridine, pyrimidine or triazine skeleton, polyarylbenzene derivatives, spirofluorene derivatives, truxene derivatives and triphenylene derivatives, compounds containing a chalcogen element such as dibenzofuran derivatives and dibenzothiophene derivatives, and organometal complexes such as beryllium quinolinol complexes. However, the host materials are not limited to those described above as long as the materials have higher triplet energy than generally used dopant materials and allow electrons and holes to be injected or transported from the respective transport layers smoothly. Furthermore, the host material may include two or more kinds of triplet-emitting dopant materials, or may include two or more kinds of host materials. Furthermore, the host material may include one or more kinds of triplet-emitting dopant materials and one or more kinds of fluorescent dopant materials.

Furthermore, the organic layer in the light sources in the present invention preferably contains a thermally activated delayed fluorescent material in the emission layer. Thermally activated delayed fluorescent materials are generally also called TADF materials. In these materials, the energy gap between the energy level of a singlet excited state and the energy level of a triplet excited state is reduced to promote the reverse intersystem crossing from the triplet excited state to the singlet excited state, thus improving the probability of singlet exciton generation. When the emission layer in the organic layer contains a thermally activated delayed fluorescent material, more efficient emission becomes possible and contributions are made to lowering the power consumption of displays. The thermally activated delayed fluorescent material may be a single material that exhibits thermally activated delayed fluorescence by itself, or may be a plurality of materials that exhibit thermally activated delayed fluorescence in combination. The thermally activated delayed fluorescent material used in the emission layer may be a single material or a plurality of materials, and known such materials may be used. Specifically, examples of the thermally activated delayed fluorescent materials include benzonitrile derivatives, triazine derivatives, disulfoxide derivatives, carbazole derivatives, indolocarbazole derivatives, dihydrophenazine derivatives, thiazole derivatives and oxadiazole derivatives.

⟨Recesses⟩

In the present invention, the recesses used in the color conversion components (for example, the color conversion substrates 16 and 26 illustrated in FIGS. 1 and 2) are regions which are divided by partition walls arranged in a pattern corresponding to the light sources. In FIG. 1, the regions which are divided by the partition walls 19 arranged in a pattern on the substrate 110 correspond to the recesses. In FIG. 2, the regions which are divided by the partition walls 29 arranged in a pattern on the substrate 210 correspond to the recesses. Any photosensitive or non-photosensitive materials may be used as partition wall materials. Specifically, epoxy resins, acrylic resins, siloxane polymer-based resins, polyimide resins, etc. may be preferably used as the partition wall materials.

In the partition wall formation, a pattern of the partition walls may be fabricated by a process in which a predetermined thin film is formed by a wet coating method such as spin coating, dip coating, roll coating, gravure coating or dispenser, and the film is patterned using a photolithographic method including resist application, prebaking, photoexposure, development, postbaking, etching, resist removal and the like. Furthermore, in the case where partition walls are formed using a solid material such as LiF or $MgF_2$, a predetermined pattern of the partition walls may be formed by forming a film by a dry process such as vacuum deposition or sputtering, and further subjecting the film to a dry process such as the above-mentioned photolithographic method or etching.

The film thickness of the partition walls is preferably larger than the film thickness of the color conversion layers formed in the recesses of the color conversion component, and is preferably in the range of, for example, not less than 0.5 μm and not more than 50 μm. Furthermore, the width of the pattern of the partition walls may be a length that is sufficient for preventing the mixing of colors emitted from the color conversion layers disposed in the adjacent recesses. For example, the pattern of the partition walls is preferably formed with a width of not less than 1 μm and not more than 20 μm, and is more preferably formed with a width of not less than 5 μm and not more than 15 μm.

⟨Color Conversion Components⟩

The color conversion component in the light-emitting device according to the present invention is one of the components constituting the light-emitting device which includes a recess accommodating a color conversion layer capable of emitting green light or a color conversion layer capable of emitting red light described later. For example, the color conversion substrate 16 in FIG. 1 corresponds to the color conversion component. In FIG. 2, the color conversion substrate 26 corresponds to the color conversion component. The color conversion component is preferably a color conversion component in which color conversion layers are disposed in a plurality of recesses. As a result of the color conversion layers being disposed in the recesses, it is possible to prevent the mixing of colors emitted from the adjacent color conversion layers, and consequently high-resolution displays become possible.

Furthermore, it is preferable in the present invention that the color conversion layers disposed in the recesses in the color conversion component be two or more kinds of color conversion layers that emit outgoing lights falling in different wavelength regions from one another. When the color conversion layers are at least two kinds of color conversion layers, different colors can be emitted in a controlled manner to enable multicolor displays. Furthermore, full-color displays become possible when, for example, there are two kinds of color conversion layers emitting green light and red light, and the light sources that are used are blue light sources.

⟨Recesses without Color Conversion Layers⟩

In the light-emitting device according to the present invention, part of the recesses in the color conversion component is more preferably free from a color conversion layer. When the color conversion component is designed so that some recesses have a color conversion layer and some recesses are free from a color conversion layer, for example, the recesses free from a color conversion layer can pass blue light from the light sources therethrough to allow the blue light to be used efficiently, thus contributing to the enhancement in the efficiency of displays.

Furthermore, the whole of the recesses in the color conversion component is preferably such that regions which are divided by the partition walls to define recesses and have a color conversion layer therein (hereinafter, such regions will be appropriately written as the recessed regions with a color conversion layer) are disposed immediately above the respective light sources. By virtue of the recessed regions with a color conversion layer being disposed immediately above the respective light sources, three colors, i.e., blue, green and red, can be emitted in an independently controlled manner to enable high-resolution displays. It is more preferable that the recessed regions with a color conversion layer be arranged on the same plane of the color conversion component and be disposed immediately above the respective light sources.

⟨Color Conversion Layers⟩

The color conversion layers in the present invention are layers that have a function to convert the color (convert the wavelength) of at least part of incident light from the light sources and to emit outgoing light falling in a different wavelength region from the incident light. The color conversion layers used in the light-emitting device according to the present invention include a pyrromethene derivative. Pyrromethene derivatives are phosphors having high fluorescent quantum yield and high color purity. Thus, the light-emitting device which includes the color conversion layers (the color conversion component) including a pyrromethene derivative may be used in displays to enable enhancements in the efficiency and color gamut of the displays.

The pyrromethene derivative contained in the color conversion layer is preferably a compound represented by the following general formula (1).

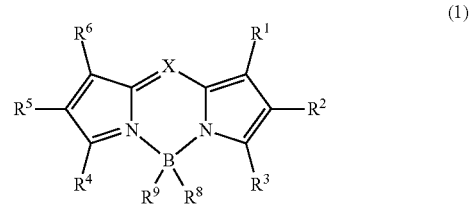

In the general formula (1), X is C—$R^7$ or N. $R^1$ to $R^9$ may be the same as or different from one another and are each selected from hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, ester group, carbamoyl group, amino group, nitro group, silyl group, siloxanyl group, boryl group, sulfo group, phosphine oxide group, and fused ring and aliphatic ring formed with an adjacent substituent.

In all the groups described above, hydrogen may be deuterium. The same applies to the compounds and partial structures thereof which will be described hereinbelow. Furthermore, in the following description, for example, a substituted or unsubstituted aryl group with 6 to 40 carbon atoms is an aryl group having a total number of carbon atoms of 6 to 40 including any carbon atoms contained in a substituent on the aryl group. The same applies to other substituents having a specified number of carbon atoms.

Furthermore, in all the groups described above, the substituents in substituted groups are preferably alkyl groups, cycloalkyl groups, heterocyclic groups, alkenyl groups, cycloalkenyl groups, alkynyl groups, hydroxy groups, thiol groups, alkoxy groups, alkylthio groups, aryl ether groups, aryl thioether groups, aryl groups, heteroaryl groups, halogens, cyano groups, aldehyde groups, carbonyl groups, carboxy groups, ester groups, carbamoyl groups, amino groups, nitro groups, silyl groups, siloxanyl groups, boryl groups, sulfo groups and phosphine oxide groups, and more preferably specific substituents which are described as preferable in the description of the respective substituents. Furthermore, these substituents may be further substituted with the substituents described above.

The term "unsubstituted" in "substituted or unsubstituted" means that the substituents are hydrogen atoms or deuterium atoms. The same applies when the compounds or partial structures thereof which will be described later are "substituted or unsubstituted".

Among all the groups described above, the alkyl groups indicate, for example, saturated aliphatic hydrocarbon groups such as methyl group, ethyl group, n-propyl group, isopropyl group, n-butyl group, sec-butyl group and tert-butyl group, and may have or may not have a substituent. When they are substituted, the additional substituents are not particularly limited, with examples including alkyl groups, halogens, aryl groups and heteroaryl groups, and the same applies hereinbelow. Furthermore, the number of carbon atoms in the alkyl groups is not particularly limited, but, from the points of view of availability and cost, is preferably in the range of not less than 1 and not more than 20, and more preferably not less than 1 and not more than 8.

The cycloalkyl groups indicate, for example, saturated alicyclic hydrocarbon groups such as cyclopropyl group, cyclohexyl group, norbornyl group and adamantyl group, and may have or may not have a substituent. The number of carbon atoms in the alkyl group moieties is not particularly limited, but is preferably in the range of not less than 3 and not more than 20.

The heterocyclic groups indicate, for example, aliphatic rings having an atom other than carbon in the ring, such as pyran ring, piperidine ring and cyclic amides, and may have or may not have a substituent. The number of carbon atoms in the heterocyclic groups is not particularly limited, but is preferably in the range of not less than 2 and not more than 20.

The alkenyl groups indicate, for example, unsaturated aliphatic hydrocarbon groups containing a double bond, such as vinyl group, allyl group and butadienyl group, and may have or may not have a substituent. The number of carbon atoms in the alkenyl groups is not particularly limited, but is preferably in the range of not less than 2 and not more than 20.

The cycloalkenyl groups indicate, for example, unsaturated alicyclic hydrocarbon groups containing a double bond, such as cyclopentenyl group, cyclopentadienyl group and cyclohexenyl group, and may have or may not have a substituent.

The alkynyl groups indicate, for example, unsaturated aliphatic hydrocarbon groups containing a triple bond, such as ethynyl group, and may have or may not have a substituent. The number of carbon atoms in the alkynyl groups is not particularly limited, but is preferably in the range of not less than 2 and not more than 20.

The alkoxy groups indicate, for example, functional groups which are aliphatic hydrocarbon groups bonded through an ether bond, such as methoxy group, ethoxy group and propoxy group, and the aliphatic hydrocarbon groups may have or may not have a substituent. The number of carbon atoms in the alkoxy groups is not particularly limited, but is preferably in the range of not less than 1 and not more than 20.

The alkylthio groups are groups resulting from the substitution of alkoxy groups with a sulfur atom in place of the oxygen atom in the ether bond. The hydrocarbon groups in the alkylthio groups may have or may not have a substituent. The number of carbon atoms in the alkylthio groups is not particularly limited, but is preferably in the range of not less than 1 and not more than 20.

The aryl ether groups indicate, for example, functional groups which are aromatic hydrocarbon groups bonded through an ether bond, such as phenoxy group, and the aromatic hydrocarbon groups may have or may not have a substituent. The number of carbon atoms in the aryl ether groups is not particularly limited, but is preferably in the range of not less than 6 and not more than 40.

The aryl thioether groups are groups resulting from the substitution of aryl ether groups with a sulfur atom in place of the oxygen atom in the ether bond. The aromatic hydrocarbon groups in the aryl thioether groups may have or may not have a substituent. The number of carbon atoms in the aryl thioether groups is not particularly limited, but is preferably in the range of not less than 6 and not more than 40.

The aryl groups indicate, for example, aromatic hydrocarbon groups such as phenyl group, biphenyl group, terphenyl group, naphthyl group, fluorenyl group, benzofluorenyl group, dibenzofluorenyl group, phenanthryl group, anthracenyl group, benzophenanthryl group, benzoanthracenyl group, chrysenyl group, pyrenyl group, fluoranthenyl group, triphenylenyl group, benzofluoranthenyl group, dibenzoanthracenyl group, perylenyl group and helicenyl group. In particular, phenyl group, biphenyl group, terphenyl group, naphthyl group, fluorenyl group, phenanthryl group, anthracenyl group, pyrenyl group, fluoranthenyl group and triphenylenyl group are preferable. The aryl groups may have or may not have a substituent. The number of carbon atoms in the aryl groups is not particularly limited, but is preferably in the range of not less than 6 and not more than 40, and more preferably not less than 6 and not more than 30.

When $R^1$ to $R^9$ are substituted or unsubstituted aryl groups, the aryl group is preferably a phenyl group, a biphenyl group, a terphenyl group, a naphthyl group, a fluorenyl group, a phenanthryl group or an anthracenyl group, more preferably a phenyl group, a biphenyl group, a terphenyl group or a naphthyl group, still more preferably a phenyl group, a biphenyl group or a terphenyl group, and particularly preferably a phenyl group.

In the case where the substituents are each further substituted with an aryl group, the aryl group is preferably a phenyl group, a biphenyl group, a terphenyl group, a naphthyl group, a fluorenyl group, a phenanthryl group or an anthracenyl group, more preferably a phenyl group, a biphenyl group, a terphenyl group or a naphthyl group, and particularly preferably a phenyl group.

The heteroaryl groups indicate, for example, cyclic aromatic groups having one or a plurality of atoms other than carbon in the ring, such as pyridyl group, furanyl group, thienyl group, quinolinyl group, isoquinolinyl group, pyrazinyl group, pyrimidyl group, pyridazinyl group, triazinyl group, naphthyridinyl group, cinnolinyl group, phthalazinyl group, quinoxalinyl group, quinazolinyl group, benzofuranyl group, benzothienyl group, indolyl group, dibenzofuranyl group, dibenzothienyl group, carbazolyl group, benzocarbazolyl group, carbolinyl group, indolocarbazolyl group, benzofurocarbazolyl group, benzothienocarbazolyl group, dihydroindenocarbazolyl group, benzoquinolinyl group, acridinyl group, dibenzoacridinyl group, benzimidazolyl group, imidazopyridyl group, benzoxazolyl group, benzothiazolyl group and phenanthrolinyl group. Here, the naphthyridinyl group indicates any of 1,5-naphthyridinyl group, 1,6-naphthyridinyl group, 1,7-naphthyridinyl group, 1,8-naphthyridinyl group, 2,6-naphthyridinyl group and 2,7-naphthyridinyl group. The heteroaryl groups may have or may not have a substituent. The number of carbon atoms in the heteroaryl groups is not particularly limited, but is preferably in the range of not less than 2 and not more than 40, and more preferably not less than 2 and not more than 30.

When $R^1$ to $R^9$ are substituted or unsubstituted heteroaryl groups, the heteroaryl group is preferably a pyridyl group, a furanyl group, a thienyl group, a quinolinyl group, a pyrimidyl group, a triazinyl group, a benzofuranyl group, a benzothienyl group, an indolyl group, a dibenzofuranyl group, a dibenzothienyl group, a carbazolyl group, a benzimidazolyl group, an imidazopyridyl group, a benzoxazolyl group, a benzothiazolyl group or a phenanthrolinyl group, more preferably a pyridyl group, a furanyl group, a thienyl group or a quinolinyl group, and particularly preferably a pyridyl group.

In the case where the substituents are each further substituted with a heteroaryl group, the heteroaryl group is preferably a pyridyl group, a furanyl group, a thienyl group, a quinolinyl group, a pyrimidyl group, a triazinyl group, a benzofuranyl group, a benzothienyl group, an indolyl group, a dibenzofuranyl group, a dibenzothienyl group, a carbazolyl group, a benzimidazolyl group, an imidazopyridyl group, a benzoxazolyl group, a benzothiazolyl group or a phenanthrolinyl group, more preferably a pyridyl group, a furanyl group, a thienyl group or a quinolinyl group, and particularly preferably a pyridyl group.

The halogen indicates an atom selected from fluorine, chlorine, bromine and iodine. Furthermore, the carbonyl group, the carboxy group, the ester group and the carbamoyl group may have or may not have a substituent. Here, examples of the substituents include alkyl groups, cycloalkyl groups, aryl groups and heteroaryl groups. The substituents may be further substituted.

The amino groups are substituted or unsubstituted amino groups. When they are substituted, examples of the substituents include aryl groups, heteroaryl groups, linear alkyl groups and branched alkyl groups. Preferred aryl groups and heteroaryl groups are phenyl group, naphthyl group, pyridyl group and quinolinyl group. The substituents may be further substituted. The number of carbon atoms is not particularly limited, but is preferably in the range of not less than 2 and not more than 50, more preferably not less than 6 and not more than 40, and particularly preferably not less than 6 and not more than 30.

The silyl groups indicate, for example, alkylsilyl groups such as trimethylsilyl group, triethylsilyl group, tert-butyldimethylsilyl group, propyldimethylsilyl group and vinyldimethylsilyl group, and arylsilyl groups such as phenyldimethylsilyl group, tert-butyldiphenylsilyl group, triphenylsilyl group and trinaphthylsilyl group. The substituents on silicon may be further substituted. The number of carbon atoms in the silyl groups is not particularly limited, but is preferably in the range of not less than 1 and not more than 30.

The siloxanyl groups indicate, for example, silicon compound groups having an ether bond, such as trimethylsiloxanyl group. The substituents on silicon may be further substituted. Furthermore, the boryl groups are substituted or unsubstituted boryl groups. When the boryl groups are substituted, examples of the substituents include aryl groups, heteroaryl groups, linear alkyl groups, branched alkyl groups, aryl ether groups, alkoxy groups and hydroxy groups. In particular, aryl groups and aryl ether groups are preferable. Furthermore, the sulfo groups are substituted or unsubstituted sulfo groups. When the sulfo groups are substituted, examples of the substituents include aryl groups, heteroaryl groups, linear alkyl groups, branched alkyl groups, aryl ether groups and alkoxy groups. In particular, linear alkyl groups and aryl groups are preferable. Furthermore, the phosphine oxide groups are groups represented by —P(=O) $R^{10}R^{11}$. $R^{10}$ and $R^{11}$ are selected from the same group as $R^1$ to $R^9$.

The fused ring and the aliphatic ring formed between adjacent substituents are conjugated or non-conjugated cyclic skeletons formed by the bonding of any two adjacent substituents to each other (for example, $R^1$ and $R^2$ in the general formula (1)). The constituent elements in such a fused ring or an aliphatic ring may include, in addition to carbon, an element selected from nitrogen, oxygen, sulfur, phosphorus and silicon. Furthermore, the fused ring or the aliphatic ring may be further condensed with other ring.

The compound represented by the general formula (1) can concurrently achieve efficient color conversion and high color purity by virtue of its high emission quantum yield and a narrow full width at half maximum in an emission spectrum. Furthermore, the compound represented by the general formula (1) has appropriate substituents which are introduced at appropriate positions so as to make it possible to control various characteristics and properties such as emission efficiency, color purity, thermal stability, photo stability and dispersibility. For example, better thermal stability and photo stability are exhibited when at least one of $R^1$, $R^3$, $R^4$ and $R^6$ is a substituted or unsubstituted alkyl group, a substituted or unsubstituted aryl group, or a substituted or unsubstituted heteroaryl group as compared to when $R^1$, $R^3$, $R^4$ and $R^6$ are all hydrogen. In the general formula (1), $R^1$, $R^3$, $R^4$ and $R^6$ may be the same as or different from one another.

When at least one of $R^1$, $R^3$, $R^4$ and $R^6$ is a substituted or unsubstituted alkyl group, the alkyl group is preferably an alkyl group having 1 to 6 carbon atoms such as a methyl group, an ethyl group, an n-propyl group, an isopropyl group, an n-butyl group, a sec-butyl group, a tert-butyl group, a pentyl group or a hexyl group. Furthermore, from the point of view of the fact that thermal stability is excellent, the alkyl group is preferably a methyl group, an ethyl group, an n-propyl group, an isopropyl group, an n-butyl group, a sec-butyl group or a tert-butyl group. Furthermore, from the point of view of preventing concentration quenching and enhancing the emission quantum yield, the alkyl group is more preferably a sterically bulky tert-butyl group. Furthermore, from the points of view of easy synthesis and the availability of raw materials, a methyl group is also preferably used as the alkyl group.

When at least one of $R^1$, $R^3$, $R^4$ and $R^6$ is a substituted or unsubstituted aryl group, the aryl group is preferably a phenyl group, a biphenyl group, a terphenyl group or a naphthyl group, and more preferably a phenyl group or a biphenyl group. The aryl group is particularly preferably a phenyl group.

When at least one of $R^1$, $R^3$, $R^4$ and $R^6$ is a substituted or unsubstituted heteroaryl group, the heteroaryl group is preferably a pyridyl group, a quinolinyl group or a thienyl group, and more preferably a pyridyl group or a quinolinyl group. The heteroaryl group is particularly preferably a pyridyl group.

$R^1$, $R^3$, $R^4$ and $R^6$ may be all the same as or different from one another, and are preferably each a substituted or unsubstituted alkyl group, because in this case the compound represented by the general formula (1) exhibits good solubility with respect to a binder resin or a solvent. In this case, the alkyl group is preferably a methyl group from the points of view of easy synthesis and the availability of raw materials.

$R^1$, $R^3$, $R^4$ and $R^6$ may be all the same as or different from one another, and are preferably each a substituted or unsubstituted aryl group, or a substituted or unsubstituted heteroaryl group, because in this case the compound exhibits better thermal stability and photo stability. In this case, $R^1$, $R^3$, $R^4$ and $R^6$ may be more preferably all the same as or different from one another and each a substituted or unsubstituted aryl group.

While some substituents offer enhancements in a plurality of properties, few substituents exhibit perfectly sufficient performance. In particular, it is difficult to concurrently satisfy high efficiency emission and high color purity. Thus, several types of substituents are introduced into the compound represented by the general formula (1) so as to allow the compound to achieve balanced properties such as emission characteristics and color purity.

When, in particular, $R^1$, $R^3$, $R^4$ and $R^6$ may be all the same as or different from one another and are each a substituted or unsubstituted aryl group, it is preferable that the substituents introduced be of a plurality of types such as, for example, $R^1 \neq R^4$, $R^3 \neq R^6$, $R^1 \neq R^3$, or $R^4 \neq R^6$. Here, "≠" indicates that the groups have different structures. For example, $R^1 \neq R^4$ indicates that $R^1$ and $R^4$ are groups with different structures. The introduction of a plurality of types of substituents as described above allows an aryl group which affects color purity, and an aryl group which affects emission efficiency to be contained at the same time, thus enabling delicate control.

In particular, from the point of view of enhancing the emission efficiency and the color purity in a well-balanced manner, it is preferable that $R^1 \neq R^3$, or $R^4 \neq R^6$. In this case, one or more aryl groups which affect color purity may be introduced into each of the pyrrole rings on both sides of the compound represented by the general formula (1), and aryl groups which affect emission efficiency may be introduced into other positions, and both of these properties can be enhanced to the maximum. Furthermore, when $R^1 \neq R^3$, or $R^4 \neq R^6$, it is more preferable that $R^1 = R^4$, and $R^3 = R^6$ from the point of view of enhancing both heat resistance and color purity.

The aryl groups which mainly affect color purity are preferably aryl groups substituted with an electron donating group. The electron donating group is an atomic group which in the organic electronic theory, donates an electron to an atomic group substituted therewith by the inductive effect and the resonance effect. Examples of the electron donating groups include those having a negative value of substituent constant (σp (para)) of the Hammett rule. The substituent constants (σp (para)) of the Hammett rule can be quoted from KAGAKU BINRAN (Chemical Handbook), Basic Edition, 5th revised version (page II-380).

Specific examples of the electron donating groups include alkyl groups (σp of methyl group: −0.17), alkoxy groups (σp of methoxy group: −0.27) and amino groups (σp of —NH₂: −0.66). In particular, alkyl groups having 1 to 8 carbon atoms, or alkoxy groups having 1 to 8 carbon atoms are preferable, and methyl group, ethyl group, tert-butyl group and methoxy group are more preferable. From the point of view of dispersibility, tert-butyl group and methoxy group are particularly preferable; when these are used as the electron donating groups described above, it is possible to prevent the quenching of the compound represented by the general formula (1) due to the aggregation of the molecules. The position substituted with the substituent is not particularly limited, but the substituent is preferably bonded at a meta position or a para position relative to the position of bonding with the pyrromethene skeleton because the twisting of bonds needs to be small for the compound represented by the general formula (1) to attain enhanced photo stability. On the other hand, the aryl groups which mainly affect emission efficiency are preferably aryl groups having a bulky substituent such as a tert-butyl group, an adamantyl group or a methoxy group.

When $R^1$, $R^3$, $R^4$ and $R^6$ may be all the same as or different from one another and are each a substituted or unsubstituted aryl group, these $R^1$, $R^3$, $R^4$ and $R^6$ may be preferably all the same as or different from one another and each a substituted or unsubstituted phenyl group. In this case, it is more preferable that $R^1$, $R^3$, $R^4$ and $R^6$ be each selected from Ar-1 to Ar-6 illustrated below. Some preferred combinations of $R^1$, $R^3$, $R^4$ and $R^6$ in this case are described in Table 1-1 to Table 1-11, but the combinations are not limited thereto.

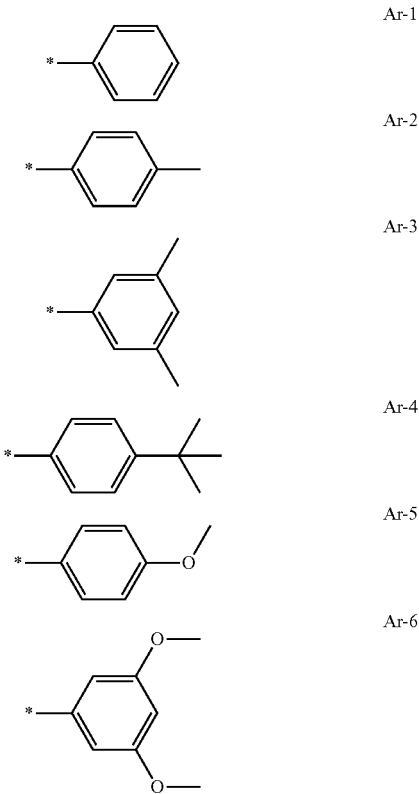

TABLE 1-1

| R1 | R3 | R4 | R6 |
|---|---|---|---|
| Ar-1 | Ar-1 | Ar-1 | Ar-1 |
| Ar-1 | Ar-1 | Ar-1 | Ar-2 |
| Ar-1 | Ar-1 | Ar-1 | Ar-3 |
| Ar-1 | Ar-1 | Ar-1 | Ar-4 |
| Ar-1 | Ar-1 | Ar-1 | Ar-5 |
| Ar-1 | Ar-1 | Ar-1 | Ar-6 |
| Ar-1 | Ar-1 | Ar-2 | Ar-1 |
| Ar-1 | Ar-1 | Ar-2 | Ar-2 |
| Ar-1 | Ar-1 | Ar-2 | Ar-3 |
| Ar-1 | Ar-1 | Ar-2 | Ar-4 |
| Ar-1 | Ar-1 | Ar-2 | Ar-5 |
| Ar-1 | Ar-1 | Ar-2 | Ar-6 |
| Ar-1 | Ar-1 | Ar-3 | Ar-1 |
| Ar-1 | Ar-1 | Ar-3 | Ar-2 |
| Ar-1 | Ar-1 | Ar-3 | Ar-3 |
| Ar-1 | Ar-1 | Ar-3 | Ar-4 |
| Ar-1 | Ar-1 | Ar-3 | Ar-5 |
| Ar-1 | Ar-1 | Ar-3 | Ar-6 |
| Ar-1 | Ar-1 | Ar-4 | Ar-1 |
| Ar-1 | Ar-1 | Ar-4 | Ar-2 |
| Ar-1 | Ar-1 | Ar-4 | Ar-3 |
| Ar-1 | Ar-1 | Ar-4 | Ar-4 |
| Ar-1 | Ar-1 | Ar-4 | Ar-5 |
| Ar-1 | Ar-1 | Ar-4 | Ar-6 |
| Ar-1 | Ar-1 | Ar-5 | Ar-1 |
| Ar-1 | Ar-1 | Ar-5 | Ar-2 |
| Ar-1 | Ar-1 | Ar-5 | Ar-3 |
| Ar-1 | Ar-1 | Ar-5 | Ar-4 |
| Ar-1 | Ar-1 | Ar-5 | Ar-5 |
| Ar-1 | Ar-1 | Ar-5 | Ar-6 |

TABLE 1-1-continued

| R1 | R3 | R4 | R6 |
|---|---|---|---|
| Ar-1 | Ar-1 | Ar-6 | Ar-1 |
| Ar-1 | Ar-1 | Ar-6 | Ar-2 |
| Ar-1 | Ar-1 | Ar-6 | Ar-3 |
| Ar-1 | Ar-1 | Ar-6 | Ar-4 |
| Ar-1 | Ar-1 | Ar-6 | Ar-5 |
| Ar-1 | Ar-1 | Ar-6 | Ar-6 |
| Ar-1 | Ar-2 | Ar-1 | Ar-2 |
| Ar-1 | Ar-2 | Ar-1 | Ar-3 |
| Ar-1 | Ar-2 | Ar-1 | Ar-4 |
| Ar-1 | Ar-2 | Ar-1 | Ar-5 |
| Ar-1 | Ar-2 | Ar-1 | Ar-6 |
| Ar-1 | Ar-2 | Ar-2 | Ar-1 |
| Ar-1 | Ar-2 | Ar-2 | Ar-2 |
| Ar-1 | Ar-2 | Ar-2 | Ar-3 |
| Ar-1 | Ar-2 | Ar-2 | Ar-4 |
| Ar-1 | Ar-2 | Ar-2 | Ar-5 |
| Ar-1 | Ar-2 | Ar-2 | Ar-6 |
| Ar-1 | Ar-2 | Ar-3 | Ar-1 |
| Ar-1 | Ar-2 | Ar-3 | Ar-2 |
| Ar-1 | Ar-2 | Ar-3 | Ar-3 |
| Ar-1 | Ar-2 | Ar-3 | Ar-4 |
| Ar-1 | Ar-2 | Ar-3 | Ar-5 |
| Ar-1 | Ar-2 | Ar-3 | Ar-6 |
| Ar-1 | Ar-2 | Ar-4 | Ar-1 |
| Ar-1 | Ar-2 | Ar-4 | Ar-2 |
| Ar-1 | Ar-2 | Ar-4 | Ar-3 |
| Ar-1 | Ar-2 | Ar-4 | Ar-4 |
| Ar-1 | Ar-2 | Ar-4 | Ar-5 |
| Ar-1 | Ar-2 | Ar-4 | Ar-6 |

TABLE 1-2

| R1 | R3 | R4 | R6 |
|---|---|---|---|
| Ar-1 | Ar-2 | Ar-5 | Ar-1 |
| Ar-1 | Ar-2 | Ar-5 | Ar-2 |
| Ar-1 | Ar-2 | Ar-5 | Ar-3 |
| Ar-1 | Ar-2 | Ar-5 | Ar-4 |
| Ar-1 | Ar-2 | Ar-5 | Ar-5 |
| Ar-1 | Ar-2 | Ar-5 | Ar-6 |
| Ar-1 | Ar-2 | Ar-6 | Ar-1 |
| Ar-1 | Ar-2 | Ar-6 | Ar-2 |
| Ar-1 | Ar-2 | Ar-6 | Ar-3 |
| Ar-1 | Ar-2 | Ar-6 | Ar-4 |
| Ar-1 | Ar-2 | Ar-6 | Ar-5 |
| Ar-1 | Ar-2 | Ar-6 | Ar-6 |
| Ar-1 | Ar-3 | Ar-1 | Ar-2 |
| Ar-1 | Ar-3 | Ar-1 | Ar-3 |
| Ar-1 | Ar-3 | Ar-1 | Ar-4 |
| Ar-1 | Ar-3 | Ar-1 | Ar-5 |
| Ar-1 | Ar-3 | Ar-1 | Ar-6 |
| Ar-1 | Ar-3 | Ar-2 | Ar-2 |
| Ar-1 | Ar-3 | Ar-2 | Ar-3 |
| Ar-1 | Ar-3 | Ar-2 | Ar-4 |
| Ar-1 | Ar-3 | Ar-2 | Ar-5 |
| Ar-1 | Ar-3 | Ar-2 | Ar-6 |
| Ar-1 | Ar-3 | Ar-3 | Ar-1 |
| Ar-1 | Ar-3 | Ar-3 | Ar-2 |
| Ar-1 | Ar-3 | Ar-3 | Ar-3 |
| Ar-1 | Ar-3 | Ar-3 | Ar-4 |
| Ar-1 | Ar-3 | Ar-3 | Ar-5 |
| Ar-1 | Ar-3 | Ar-3 | Ar-6 |
| Ar-1 | Ar-3 | Ar-4 | Ar-1 |
| Ar-1 | Ar-3 | Ar-4 | Ar-2 |
| Ar-1 | Ar-3 | Ar-4 | Ar-3 |
| Ar-1 | Ar-3 | Ar-4 | Ar-4 |
| Ar-1 | Ar-3 | Ar-4 | Ar-5 |
| Ar-1 | Ar-3 | Ar-4 | Ar-6 |
| Ar-1 | Ar-3 | Ar-5 | Ar-1 |
| Ar-1 | Ar-3 | Ar-5 | Ar-2 |
| Ar-1 | Ar-3 | Ar-5 | Ar-3 |
| Ar-1 | Ar-3 | Ar-5 | Ar-4 |
| Ar-1 | Ar-3 | Ar-5 | Ar-5 |
| Ar-1 | Ar-3 | Ar-5 | Ar-6 |
| Ar-1 | Ar-3 | Ar-6 | Ar-1 |

TABLE 1-2-continued

| R1 | R3 | R4 | R6 |
|---|---|---|---|
| Ar-1 | Ar-3 | Ar-6 | Ar-2 |
| Ar-1 | Ar-3 | Ar-6 | Ar-3 |
| Ar-1 | Ar-3 | Ar-6 | Ar-4 |
| Ar-1 | Ar-3 | Ar-6 | Ar-5 |
| Ar-1 | Ar-3 | Ar-6 | Ar-6 |
| Ar-1 | Ar-4 | Ar-1 | Ar-2 |
| Ar-1 | Ar-4 | Ar-1 | Ar-3 |
| Ar-1 | Ar-4 | Ar-1 | Ar-4 |
| Ar-1 | Ar-4 | Ar-1 | Ar-5 |
| Ar-1 | Ar-4 | Ar-1 | Ar-6 |
| Ar-1 | Ar-4 | Ar-2 | Ar-2 |
| Ar-1 | Ar-4 | Ar-2 | Ar-3 |
| Ar-1 | Ar-4 | Ar-2 | Ar-4 |
| Ar-1 | Ar-4 | Ar-2 | Ar-5 |
| Ar-1 | Ar-4 | Ar-2 | Ar-6 |
| Ar-1 | Ar-4 | Ar-3 | Ar-2 |
| Ar-1 | Ar-4 | Ar-3 | Ar-3 |
| Ar-1 | Ar-4 | Ar-3 | Ar-4 |
| Ar-1 | Ar-4 | Ar-3 | Ar-5 |
| Ar-1 | Ar-4 | Ar-3 | Ar-6 |

TABLE 1-3

| R1 | R3 | R4 | R6 |
|---|---|---|---|
| Ar-1 | Ar-4 | Ar-4 | Ar-1 |
| Ar-1 | Ar-4 | Ar-4 | Ar-2 |
| Ar-1 | Ar-4 | Ar-4 | Ar-3 |
| Ar-1 | Ar-4 | Ar-4 | Ar-4 |
| Ar-1 | Ar-4 | Ar-4 | Ar-5 |
| Ar-1 | Ar-4 | Ar-4 | Ar-6 |
| Ar-1 | Ar-4 | Ar-5 | Ar-1 |
| Ar-1 | Ar-4 | Ar-5 | Ar-2 |
| Ar-1 | Ar-4 | Ar-5 | Ar-3 |
| Ar-1 | Ar-4 | Ar-5 | Ar-4 |
| Ar-1 | Ar-4 | Ar-5 | Ar-5 |
| Ar-1 | Ar-4 | Ar-5 | Ar-6 |
| Ar-1 | Ar-4 | Ar-6 | Ar-1 |
| Ar-1 | Ar-4 | Ar-6 | Ar-2 |
| Ar-1 | Ar-4 | Ar-6 | Ar-3 |
| Ar-1 | Ar-4 | Ar-6 | Ar-4 |
| Ar-1 | Ar-4 | Ar-6 | Ar-5 |
| Ar-1 | Ar-4 | Ar-6 | Ar-6 |
| Ar-1 | Ar-5 | Ar-1 | Ar-2 |
| Ar-1 | Ar-5 | Ar-1 | Ar-3 |
| Ar-1 | Ar-5 | Ar-1 | Ar-4 |
| Ar-1 | Ar-5 | Ar-1 | Ar-5 |
| Ar-1 | Ar-5 | Ar-1 | Ar-6 |
| Ar-1 | Ar-5 | Ar-2 | Ar-2 |
| Ar-1 | Ar-5 | Ar-2 | Ar-3 |
| Ar-1 | Ar-5 | Ar-2 | Ar-4 |
| Ar-1 | Ar-5 | Ar-2 | Ar-5 |
| Ar-1 | Ar-5 | Ar-2 | Ar-6 |
| Ar-1 | Ar-5 | Ar-3 | Ar-2 |
| Ar-1 | Ar-5 | Ar-3 | Ar-3 |
| Ar-1 | Ar-5 | Ar-3 | Ar-4 |
| Ar-1 | Ar-5 | Ar-3 | Ar-5 |
| Ar-1 | Ar-5 | Ar-3 | Ar-6 |
| Ar-1 | Ar-5 | Ar-4 | Ar-2 |
| Ar-1 | Ar-5 | Ar-4 | Ar-3 |
| Ar-1 | Ar-5 | Ar-4 | Ar-4 |
| Ar-1 | Ar-5 | Ar-4 | Ar-5 |
| Ar-1 | Ar-5 | Ar-4 | Ar-6 |
| Ar-1 | Ar-5 | Ar-5 | Ar-1 |
| Ar-1 | Ar-5 | Ar-5 | Ar-2 |
| Ar-1 | Ar-5 | Ar-5 | Ar-3 |
| Ar-1 | Ar-5 | Ar-5 | Ar-4 |
| Ar-1 | Ar-5 | Ar-5 | Ar-5 |
| Ar-1 | Ar-5 | Ar-5 | Ar-6 |
| Ar-1 | Ar-5 | Ar-6 | Ar-1 |
| Ar-1 | Ar-5 | Ar-6 | Ar-2 |
| Ar-1 | Ar-5 | Ar-6 | Ar-3 |
| Ar-1 | Ar-5 | Ar-6 | Ar-4 |
| Ar-1 | Ar-5 | Ar-6 | Ar-5 |
| Ar-1 | Ar-5 | Ar-6 | Ar-6 |

TABLE 1-3-continued

| R1 | R3 | R4 | R6 |
|---|---|---|---|
| Ar-1 | Ar-6 | Ar-1 | Ar-2 |
| Ar-1 | Ar-6 | Ar-1 | Ar-3 |
| Ar-1 | Ar-6 | Ar-1 | Ar-4 |
| Ar-1 | Ar-6 | Ar-1 | Ar-5 |
| Ar-1 | Ar-6 | Ar-1 | Ar-6 |
| Ar-1 | Ar-6 | Ar-2 | Ar-2 |
| Ar-1 | Ar-6 | Ar-2 | Ar-3 |
| Ar-1 | Ar-6 | Ar-2 | Ar-4 |
| Ar-1 | Ar-6 | Ar-2 | Ar-5 |
| Ar-1 | Ar-6 | Ar-2 | Ar-6 |

TABLE 1-4

| R1 | R3 | R4 | R6 |
|---|---|---|---|
| Ar-1 | Ar-6 | Ar-3 | Ar-2 |
| Ar-1 | Ar-6 | Ar-3 | Ar-3 |
| Ar-1 | Ar-6 | Ar-3 | Ar-4 |
| Ar-1 | Ar-6 | Ar-3 | Ar-5 |
| Ar-1 | Ar-6 | Ar-3 | Ar-6 |
| Ar-1 | Ar-6 | Ar-4 | Ar-2 |
| Ar-1 | Ar-6 | Ar-4 | Ar-3 |
| Ar-1 | Ar-6 | Ar-4 | Ar-4 |
| Ar-1 | Ar-6 | Ar-4 | Ar-5 |
| Ar-1 | Ar-6 | Ar-4 | Ar-6 |
| Ar-1 | Ar-6 | Ar-5 | Ar-2 |
| Ar-1 | Ar-6 | Ar-5 | Ar-3 |
| Ar-1 | Ar-6 | Ar-5 | Ar-4 |
| Ar-1 | Ar-6 | Ar-5 | Ar-5 |
| Ar-1 | Ar-6 | Ar-5 | Ar-6 |
| Ar-1 | Ar-6 | Ar-6 | Ar-1 |
| Ar-1 | Ar-6 | Ar-6 | Ar-2 |
| Ar-1 | Ar-6 | Ar-6 | Ar-3 |
| Ar-1 | Ar-6 | Ar-6 | Ar-4 |
| Ar-1 | Ar-6 | Ar-6 | Ar-5 |
| Ar-1 | Ar-6 | Ar-6 | Ar-6 |
| Ar-2 | Ar-1 | Ar-1 | Ar-2 |
| Ar-2 | Ar-1 | Ar-1 | Ar-3 |
| Ar-2 | Ar-1 | Ar-1 | Ar-4 |
| Ar-2 | Ar-1 | Ar-1 | Ar-5 |
| Ar-2 | Ar-1 | Ar-1 | Ar-6 |
| Ar-2 | Ar-1 | Ar-2 | Ar-2 |
| Ar-2 | Ar-1 | Ar-2 | Ar-3 |
| Ar-2 | Ar-1 | Ar-2 | Ar-4 |
| Ar-2 | Ar-1 | Ar-2 | Ar-5 |
| Ar-2 | Ar-1 | Ar-2 | Ar-6 |
| Ar-2 | Ar-1 | Ar-3 | Ar-2 |
| Ar-2 | Ar-1 | Ar-3 | Ar-3 |
| Ar-2 | Ar-1 | Ar-3 | Ar-4 |
| Ar-2 | Ar-1 | Ar-3 | Ar-5 |
| Ar-2 | Ar-1 | Ar-3 | Ar-6 |
| Ar-2 | Ar-1 | Ar-4 | Ar-2 |
| Ar-2 | Ar-1 | Ar-4 | Ar-3 |
| Ar-2 | Ar-1 | Ar-4 | Ar-4 |
| Ar-2 | Ar-1 | Ar-4 | Ar-5 |
| Ar-2 | Ar-1 | Ar-4 | Ar-6 |
| Ar-2 | Ar-1 | Ar-5 | Ar-2 |
| Ar-2 | Ar-1 | Ar-5 | Ar-3 |
| Ar-2 | Ar-1 | Ar-5 | Ar-4 |
| Ar-2 | Ar-1 | Ar-5 | Ar-5 |
| Ar-2 | Ar-1 | Ar-5 | Ar-6 |
| Ar-2 | Ar-1 | Ar-6 | Ar-2 |
| Ar-2 | Ar-1 | Ar-6 | Ar-3 |
| Ar-2 | Ar-1 | Ar-6 | Ar-4 |
| Ar-2 | Ar-1 | Ar-6 | Ar-5 |
| Ar-2 | Ar-1 | Ar-6 | Ar-6 |
| Ar-2 | Ar-2 | Ar-1 | Ar-3 |
| Ar-2 | Ar-2 | Ar-1 | Ar-4 |
| Ar-2 | Ar-2 | Ar-1 | Ar-5 |
| Ar-2 | Ar-2 | Ar-1 | Ar-6 |
| Ar-2 | Ar-2 | Ar-2 | Ar-2 |
| Ar-2 | Ar-2 | Ar-2 | Ar-3 |

TABLE 1-4-continued

| R1 | R3 | R4 | R6 |
|---|---|---|---|
| Ar-2 | Ar-2 | Ar-2 | Ar-4 |
| Ar-2 | Ar-2 | Ar-2 | Ar-5 |
| Ar-2 | Ar-2 | Ar-2 | Ar-6 |

TABLE 1-5

| R1 | R3 | R4 | R6 |
|---|---|---|---|
| Ar-2 | Ar-2 | Ar-3 | Ar-2 |
| Ar-2 | Ar-2 | Ar-3 | Ar-3 |
| Ar-2 | Ar-2 | Ar-3 | Ar-4 |
| Ar-2 | Ar-2 | Ar-3 | Ar-5 |
| Ar-2 | Ar-2 | Ar-3 | Ar-6 |
| Ar-2 | Ar-2 | Ar-4 | Ar-2 |
| Ar-2 | Ar-2 | Ar-4 | Ar-3 |
| Ar-2 | Ar-2 | Ar-4 | Ar-4 |
| Ar-2 | Ar-2 | Ar-4 | Ar-5 |
| Ar-2 | Ar-2 | Ar-4 | Ar-6 |
| Ar-2 | Ar-2 | Ar-5 | Ar-2 |
| Ar-2 | Ar-2 | Ar-5 | Ar-3 |
| Ar-2 | Ar-2 | Ar-5 | Ar-4 |
| Ar-2 | Ar-2 | Ar-5 | Ar-5 |
| Ar-2 | Ar-2 | Ar-5 | Ar-6 |
| Ar-2 | Ar-2 | Ar-6 | Ar-2 |
| Ar-2 | Ar-2 | Ar-6 | Ar-3 |
| Ar-2 | Ar-2 | Ar-6 | Ar-4 |
| Ar-2 | Ar-2 | Ar-6 | Ar-5 |
| Ar-2 | Ar-2 | Ar-6 | Ar-6 |
| Ar-2 | Ar-3 | Ar-1 | Ar-3 |
| Ar-2 | Ar-3 | Ar-1 | Ar-4 |
| Ar-2 | Ar-3 | Ar-1 | Ar-5 |
| Ar-2 | Ar-3 | Ar-1 | Ar-6 |
| Ar-2 | Ar-3 | Ar-2 | Ar-3 |
| Ar-2 | Ar-3 | Ar-2 | Ar-4 |
| Ar-2 | Ar-3 | Ar-2 | Ar-5 |
| Ar-2 | Ar-3 | Ar-2 | Ar-6 |
| Ar-2 | Ar-3 | Ar-3 | Ar-2 |
| Ar-2 | Ar-3 | Ar-3 | Ar-3 |
| Ar-2 | Ar-3 | Ar-3 | Ar-4 |
| Ar-2 | Ar-3 | Ar-3 | Ar-5 |
| Ar-2 | Ar-3 | Ar-3 | Ar-6 |
| Ar-2 | Ar-3 | Ar-4 | Ar-2 |
| Ar-2 | Ar-3 | Ar-4 | Ar-3 |
| Ar-2 | Ar-3 | Ar-4 | Ar-4 |
| Ar-2 | Ar-3 | Ar-4 | Ar-5 |
| Ar-2 | Ar-3 | Ar-4 | Ar-6 |
| Ar-2 | Ar-3 | Ar-5 | Ar-2 |
| Ar-2 | Ar-3 | Ar-5 | Ar-3 |
| Ar-2 | Ar-3 | Ar-5 | Ar-4 |
| Ar-2 | Ar-3 | Ar-5 | Ar-5 |
| Ar-2 | Ar-3 | Ar-5 | Ar-6 |
| Ar-2 | Ar-3 | Ar-6 | Ar-2 |
| Ar-2 | Ar-3 | Ar-6 | Ar-3 |
| Ar-2 | Ar-3 | Ar-6 | Ar-4 |
| Ar-2 | Ar-3 | Ar-6 | Ar-5 |
| Ar-2 | Ar-3 | Ar-6 | Ar-6 |
| Ar-2 | Ar-4 | Ar-1 | Ar-3 |
| Ar-2 | Ar-4 | Ar-1 | Ar-4 |
| Ar-2 | Ar-4 | Ar-1 | Ar-5 |
| Ar-2 | Ar-4 | Ar-1 | Ar-6 |
| Ar-2 | Ar-4 | Ar-2 | Ar-3 |
| Ar-2 | Ar-4 | Ar-2 | Ar-4 |
| Ar-2 | Ar-4 | Ar-2 | Ar-5 |
| Ar-2 | Ar-4 | Ar-2 | Ar-6 |
| Ar-2 | Ar-4 | Ar-3 | Ar-3 |
| Ar-2 | Ar-4 | Ar-3 | Ar-4 |
| Ar-2 | Ar-4 | Ar-3 | Ar-5 |
| Ar-2 | Ar-4 | Ar-3 | Ar-6 |

TABLE 1-6

| R1 | R3 | R4 | R6 |
| --- | --- | --- | --- |
| Ar-2 | Ar-4 | Ar-4 | Ar-2 |
| Ar-2 | Ar-4 | Ar-4 | Ar-3 |
| Ar-2 | Ar-4 | Ar-4 | Ar-4 |
| Ar-2 | Ar-4 | Ar-4 | Ar-5 |
| Ar-2 | Ar-4 | Ar-4 | Ar-6 |
| Ar-2 | Ar-4 | Ar-5 | Ar-2 |
| Ar-2 | Ar-4 | Ar-5 | Ar-3 |
| Ar-2 | Ar-4 | Ar-5 | Ar-4 |
| Ar-2 | Ar-4 | Ar-5 | Ar-5 |
| Ar-2 | Ar-4 | Ar-5 | Ar-6 |
| Ar-2 | Ar-4 | Ar-6 | Ar-2 |
| Ar-2 | Ar-4 | Ar-6 | Ar-3 |
| Ar-2 | Ar-4 | Ar-6 | Ar-4 |
| Ar-2 | Ar-4 | Ar-6 | Ar-5 |
| Ar-2 | Ar-4 | Ar-6 | Ar-6 |
| Ar-2 | Ar-5 | Ar-1 | Ar-3 |
| Ar-2 | Ar-5 | Ar-1 | Ar-4 |
| Ar-2 | Ar-5 | Ar-1 | Ar-5 |
| Ar-2 | Ar-5 | Ar-1 | Ar-6 |
| Ar-2 | Ar-5 | Ar-2 | Ar-3 |
| Ar-2 | Ar-5 | Ar-2 | Ar-4 |
| Ar-2 | Ar-5 | Ar-2 | Ar-5 |
| Ar-2 | Ar-5 | Ar-2 | Ar-6 |
| Ar-2 | Ar-5 | Ar-3 | Ar-3 |
| Ar-2 | Ar-5 | Ar-3 | Ar-4 |
| Ar-2 | Ar-5 | Ar-3 | Ar-5 |
| Ar-2 | Ar-5 | Ar-3 | Ar-6 |
| Ar-2 | Ar-5 | Ar-4 | Ar-3 |
| Ar-2 | Ar-5 | Ar-4 | Ar-4 |
| Ar-2 | Ar-5 | Ar-4 | Ar-5 |
| Ar-2 | Ar-5 | Ar-4 | Ar-6 |
| Ar-2 | Ar-5 | Ar-5 | Ar-2 |
| Ar-2 | Ar-5 | Ar-5 | Ar-3 |
| Ar-2 | Ar-5 | Ar-5 | Ar-4 |
| Ar-2 | Ar-5 | Ar-5 | Ar-5 |
| Ar-2 | Ar-5 | Ar-5 | Ar-6 |
| Ar-2 | Ar-5 | Ar-6 | Ar-2 |
| Ar-2 | Ar-5 | Ar-6 | Ar-3 |
| Ar-2 | Ar-5 | Ar-6 | Ar-4 |
| Ar-2 | Ar-5 | Ar-6 | Ar-5 |
| Ar-2 | Ar-5 | Ar-6 | Ar-6 |
| Ar-2 | Ar-6 | Ar-1 | Ar-3 |
| Ar-2 | Ar-6 | Ar-1 | Ar-4 |
| Ar-2 | Ar-6 | Ar-1 | Ar-5 |
| Ar-2 | Ar-6 | Ar-1 | Ar-6 |
| Ar-2 | Ar-6 | Ar-2 | Ar-3 |
| Ar-2 | Ar-6 | Ar-2 | Ar-4 |
| Ar-2 | Ar-6 | Ar-2 | Ar-5 |
| Ar-2 | Ar-6 | Ar-2 | Ar-6 |
| Ar-2 | Ar-6 | Ar-3 | Ar-3 |
| Ar-2 | Ar-6 | Ar-3 | Ar-4 |
| Ar-2 | Ar-6 | Ar-3 | Ar-5 |
| Ar-2 | Ar-6 | Ar-3 | Ar-6 |
| Ar-2 | Ar-6 | Ar-4 | Ar-3 |
| Ar-2 | Ar-6 | Ar-4 | Ar-4 |
| Ar-2 | Ar-6 | Ar-4 | Ar-5 |
| Ar-2 | Ar-6 | Ar-4 | Ar-6 |
| Ar-2 | Ar-6 | Ar-5 | Ar-3 |
| Ar-2 | Ar-6 | Ar-5 | Ar-4 |
| Ar-2 | Ar-6 | Ar-5 | Ar-5 |
| Ar-2 | Ar-6 | Ar-5 | Ar-6 |

TABLE 1-7

| R1 | R3 | R4 | R6 |
| --- | --- | --- | --- |
| Ar-2 | Ar-6 | Ar-6 | Ar-2 |
| Ar-2 | Ar-6 | Ar-6 | Ar-3 |
| Ar-2 | Ar-6 | Ar-6 | Ar-4 |
| Ar-2 | Ar-6 | Ar-6 | Ar-5 |
| Ar-2 | Ar-6 | Ar-6 | Ar-6 |
| Ar-3 | Ar-1 | Ar-1 | Ar-3 |
| Ar-3 | Ar-1 | Ar-1 | Ar-4 |
| Ar-3 | Ar-1 | Ar-1 | Ar-5 |
| Ar-3 | Ar-1 | Ar-1 | Ar-6 |
| Ar-3 | Ar-1 | Ar-2 | Ar-3 |
| Ar-3 | Ar-1 | Ar-2 | Ar-4 |
| Ar-3 | Ar-1 | Ar-2 | Ar-5 |
| Ar-3 | Ar-1 | Ar-2 | Ar-6 |
| Ar-3 | Ar-1 | Ar-3 | Ar-3 |
| Ar-3 | Ar-1 | Ar-3 | Ar-4 |
| Ar-3 | Ar-1 | Ar-3 | Ar-5 |
| Ar-3 | Ar-1 | Ar-3 | Ar-6 |
| Ar-3 | Ar-1 | Ar-4 | Ar-3 |
| Ar-3 | Ar-1 | Ar-4 | Ar-4 |
| Ar-3 | Ar-1 | Ar-4 | Ar-5 |
| Ar-3 | Ar-1 | Ar-4 | Ar-6 |
| Ar-3 | Ar-1 | Ar-5 | Ar-3 |
| Ar-3 | Ar-1 | Ar-5 | Ar-4 |
| Ar-3 | Ar-1 | Ar-5 | Ar-5 |
| Ar-3 | Ar-1 | Ar-5 | Ar-6 |
| Ar-3 | Ar-1 | Ar-6 | Ar-3 |
| Ar-3 | Ar-1 | Ar-6 | Ar-4 |
| Ar-3 | Ar-1 | Ar-6 | Ar-5 |
| Ar-3 | Ar-1 | Ar-6 | Ar-6 |
| Ar-3 | Ar-2 | Ar-1 | Ar-4 |
| Ar-3 | Ar-2 | Ar-1 | Ar-5 |
| Ar-3 | Ar-2 | Ar-1 | Ar-6 |
| Ar-3 | Ar-2 | Ar-2 | Ar-3 |
| Ar-3 | Ar-2 | Ar-2 | Ar-4 |
| Ar-3 | Ar-2 | Ar-2 | Ar-5 |
| Ar-3 | Ar-2 | Ar-2 | Ar-6 |
| Ar-3 | Ar-2 | Ar-3 | Ar-3 |
| Ar-3 | Ar-2 | Ar-3 | Ar-4 |
| Ar-3 | Ar-2 | Ar-3 | Ar-5 |
| Ar-3 | Ar-2 | Ar-3 | Ar-6 |
| Ar-3 | Ar-2 | Ar-4 | Ar-3 |
| Ar-3 | Ar-2 | Ar-4 | Ar-4 |
| Ar-3 | Ar-2 | Ar-4 | Ar-5 |
| Ar-3 | Ar-2 | Ar-4 | Ar-6 |
| Ar-3 | Ar-2 | Ar-5 | Ar-3 |
| Ar-3 | Ar-2 | Ar-5 | Ar-4 |
| Ar-3 | Ar-2 | Ar-5 | Ar-5 |
| Ar-3 | Ar-2 | Ar-5 | Ar-6 |
| Ar-3 | Ar-2 | Ar-6 | Ar-3 |
| Ar-3 | Ar-2 | Ar-6 | Ar-4 |
| Ar-3 | Ar-2 | Ar-6 | Ar-5 |
| Ar-3 | Ar-2 | Ar-6 | Ar-6 |
| Ar-3 | Ar-3 | Ar-1 | Ar-4 |
| Ar-3 | Ar-3 | Ar-1 | Ar-5 |
| Ar-3 | Ar-3 | Ar-1 | Ar-6 |
| Ar-3 | Ar-3 | Ar-2 | Ar-4 |
| Ar-3 | Ar-3 | Ar-2 | Ar-5 |
| Ar-3 | Ar-3 | Ar-2 | Ar-6 |
| Ar-3 | Ar-3 | Ar-3 | Ar-3 |
| Ar-3 | Ar-3 | Ar-3 | Ar-4 |
| Ar-3 | Ar-3 | Ar-3 | Ar-5 |

TABLE 1-8

| R1 | R3 | R4 | R6 |
| --- | --- | --- | --- |
| Ar-3 | Ar-3 | Ar-3 | Ar-6 |
| Ar-3 | Ar-3 | Ar-4 | Ar-3 |
| Ar-3 | Ar-3 | Ar-4 | Ar-4 |
| Ar-3 | Ar-3 | Ar-4 | Ar-5 |
| Ar-3 | Ar-3 | Ar-4 | Ar-6 |
| Ar-3 | Ar-3 | Ar-5 | Ar-3 |
| Ar-3 | Ar-3 | Ar-5 | Ar-4 |
| Ar-3 | Ar-3 | Ar-5 | Ar-5 |
| Ar-3 | Ar-3 | Ar-5 | Ar-6 |
| Ar-3 | Ar-3 | Ar-6 | Ar-3 |
| Ar-3 | Ar-3 | Ar-6 | Ar-4 |
| Ar-3 | Ar-3 | Ar-6 | Ar-5 |
| Ar-3 | Ar-3 | Ar-6 | Ar-6 |
| Ar-3 | Ar-4 | Ar-1 | Ar-4 |
| Ar-3 | Ar-4 | Ar-1 | Ar-5 |
| Ar-3 | Ar-4 | Ar-1 | Ar-6 |
| Ar-3 | Ar-4 | Ar-2 | Ar-4 |
| Ar-3 | Ar-4 | Ar-2 | Ar-5 |

TABLE 1-8-continued

| R1 | R3 | R4 | R6 |
|---|---|---|---|
| Ar-3 | Ar-4 | Ar-2 | Ar-6 |
| Ar-3 | Ar-4 | Ar-3 | Ar-5 |
| Ar-3 | Ar-4 | Ar-3 | Ar-6 |
| Ar-3 | Ar-4 | Ar-4 | Ar-3 |
| Ar-3 | Ar-4 | Ar-4 | Ar-4 |
| Ar-3 | Ar-4 | Ar-4 | Ar-5 |
| Ar-3 | Ar-4 | Ar-4 | Ar-6 |
| Ar-3 | Ar-4 | Ar-5 | Ar-3 |
| Ar-3 | Ar-4 | Ar-5 | Ar-4 |
| Ar-3 | Ar-4 | Ar-5 | Ar-5 |
| Ar-3 | Ar-4 | Ar-5 | Ar-6 |
| Ar-3 | Ar-4 | Ar-6 | Ar-3 |
| Ar-3 | Ar-4 | Ar-6 | Ar-4 |
| Ar-3 | Ar-4 | Ar-6 | Ar-5 |
| Ar-3 | Ar-4 | Ar-6 | Ar-6 |
| Ar-3 | Ar-5 | Ar-1 | Ar-4 |
| Ar-3 | Ar-5 | Ar-1 | Ar-5 |
| Ar-3 | Ar-5 | Ar-1 | Ar-6 |
| Ar-3 | Ar-5 | Ar-2 | Ar-4 |
| Ar-3 | Ar-5 | Ar-2 | Ar-5 |
| Ar-3 | Ar-5 | Ar-2 | Ar-6 |
| Ar-3 | Ar-5 | Ar-3 | Ar-4 |
| Ar-3 | Ar-5 | Ar-3 | Ar-5 |
| Ar-3 | Ar-5 | Ar-3 | Ar-6 |
| Ar-3 | Ar-5 | Ar-4 | Ar-4 |
| Ar-3 | Ar-5 | Ar-4 | Ar-5 |
| Ar-3 | Ar-5 | Ar-4 | Ar-6 |
| Ar-3 | Ar-5 | Ar-5 | Ar-3 |
| Ar-3 | Ar-5 | Ar-5 | Ar-4 |
| Ar-3 | Ar-5 | Ar-5 | Ar-5 |
| Ar-3 | Ar-5 | Ar-5 | Ar-6 |
| Ar-3 | Ar-5 | Ar-6 | Ar-3 |
| Ar-3 | Ar-5 | Ar-6 | Ar-4 |
| Ar-3 | Ar-5 | Ar-6 | Ar-5 |
| Ar-3 | Ar-5 | Ar-6 | Ar-6 |
| Ar-3 | Ar-6 | Ar-1 | Ar-4 |
| Ar-3 | Ar-6 | Ar-1 | Ar-5 |
| Ar-3 | Ar-6 | Ar-1 | Ar-6 |
| Ar-3 | Ar-6 | Ar-2 | Ar-4 |
| Ar-3 | Ar-6 | Ar-2 | Ar-5 |
| Ar-3 | Ar-6 | Ar-2 | Ar-6 |

TABLE 1-9

| R1 | R3 | R4 | R6 |
|---|---|---|---|
| Ar-3 | Ar-6 | Ar-3 | Ar-4 |
| Ar-3 | Ar-6 | Ar-3 | Ar-5 |
| Ar-3 | Ar-6 | Ar-3 | Ar-6 |
| Ar-3 | Ar-6 | Ar-4 | Ar-4 |
| Ar-3 | Ar-6 | Ar-4 | Ar-5 |
| Ar-3 | Ar-6 | Ar-4 | Ar-6 |
| Ar-3 | Ar-6 | Ar-5 | Ar-4 |
| Ar-3 | Ar-6 | Ar-5 | Ar-5 |
| Ar-3 | Ar-6 | Ar-5 | Ar-6 |
| Ar-3 | Ar-6 | Ar-6 | Ar-3 |
| Ar-3 | Ar-6 | Ar-6 | Ar-4 |
| Ar-3 | Ar-6 | Ar-6 | Ar-5 |
| Ar-3 | Ar-6 | Ar-6 | Ar-6 |
| Ar-4 | Ar-1 | Ar-1 | Ar-4 |
| Ar-4 | Ar-1 | Ar-1 | Ar-5 |
| Ar-4 | Ar-1 | Ar-1 | Ar-6 |
| Ar-4 | Ar-1 | Ar-2 | Ar-4 |
| Ar-4 | Ar-1 | Ar-2 | Ar-5 |
| Ar-4 | Ar-1 | Ar-2 | Ar-6 |
| Ar-4 | Ar-1 | Ar-3 | Ar-4 |
| Ar-4 | Ar-1 | Ar-3 | Ar-5 |
| Ar-4 | Ar-1 | Ar-3 | Ar-6 |
| Ar-4 | Ar-1 | Ar-4 | Ar-4 |
| Ar-4 | Ar-1 | Ar-4 | Ar-5 |
| Ar-4 | Ar-1 | Ar-4 | Ar-6 |
| Ar-4 | Ar-1 | Ar-5 | Ar-4 |
| Ar-4 | Ar-1 | Ar-5 | Ar-5 |
| Ar-4 | Ar-1 | Ar-5 | Ar-6 |
| Ar-4 | Ar-1 | Ar-6 | Ar-4 |
| Ar-4 | Ar-1 | Ar-6 | Ar-5 |
| Ar-4 | Ar-1 | Ar-6 | Ar-6 |
| Ar-4 | Ar-2 | Ar-1 | Ar-5 |
| Ar-4 | Ar-2 | Ar-1 | Ar-6 |
| Ar-4 | Ar-2 | Ar-2 | Ar-4 |
| Ar-4 | Ar-2 | Ar-2 | Ar-5 |
| Ar-4 | Ar-2 | Ar-2 | Ar-6 |
| Ar-4 | Ar-2 | Ar-3 | Ar-4 |
| Ar-4 | Ar-2 | Ar-3 | Ar-5 |
| Ar-4 | Ar-2 | Ar-3 | Ar-6 |
| Ar-4 | Ar-2 | Ar-4 | Ar-4 |
| Ar-4 | Ar-2 | Ar-4 | Ar-5 |
| Ar-4 | Ar-2 | Ar-4 | Ar-6 |
| Ar-4 | Ar-2 | Ar-5 | Ar-4 |
| Ar-4 | Ar-2 | Ar-5 | Ar-5 |
| Ar-4 | Ar-2 | Ar-5 | Ar-6 |
| Ar-4 | Ar-2 | Ar-6 | Ar-4 |
| Ar-4 | Ar-2 | Ar-6 | Ar-5 |
| Ar-4 | Ar-2 | Ar-6 | Ar-6 |
| Ar-4 | Ar-3 | Ar-1 | Ar-5 |
| Ar-4 | Ar-3 | Ar-1 | Ar-6 |
| Ar-4 | Ar-3 | Ar-2 | Ar-5 |
| Ar-4 | Ar-3 | Ar-2 | Ar-6 |
| Ar-4 | Ar-3 | Ar-3 | Ar-4 |
| Ar-4 | Ar-3 | Ar-3 | Ar-5 |
| Ar-4 | Ar-3 | Ar-3 | Ar-6 |
| Ar-4 | Ar-3 | Ar-4 | Ar-4 |
| Ar-4 | Ar-3 | Ar-4 | Ar-5 |
| Ar-4 | Ar-3 | Ar-4 | Ar-6 |
| Ar-4 | Ar-3 | Ar-5 | Ar-4 |
| Ar-4 | Ar-3 | Ar-5 | Ar-5 |
| Ar-4 | Ar-3 | Ar-5 | Ar-6 |

TABLE 1-10

| R1 | R3 | R4 | R6 |
|---|---|---|---|
| Ar-4 | Ar-3 | Ar-6 | Ar-4 |
| Ar-4 | Ar-3 | Ar-6 | Ar-5 |
| Ar-4 | Ar-3 | Ar-6 | Ar-6 |
| Ar-4 | Ar-4 | Ar-1 | Ar-5 |
| Ar-4 | Ar-4 | Ar-1 | Ar-6 |
| Ar-4 | Ar-4 | Ar-2 | Ar-5 |
| Ar-4 | Ar-4 | Ar-2 | Ar-6 |
| Ar-4 | Ar-4 | Ar-3 | Ar-5 |
| Ar-4 | Ar-4 | Ar-3 | Ar-6 |
| Ar-4 | Ar-4 | Ar-4 | Ar-4 |
| Ar-4 | Ar-4 | Ar-4 | Ar-5 |
| Ar-4 | Ar-4 | Ar-4 | Ar-6 |
| Ar-4 | Ar-4 | Ar-5 | Ar-4 |
| Ar-4 | Ar-4 | Ar-5 | Ar-5 |
| Ar-4 | Ar-4 | Ar-5 | Ar-6 |
| Ar-4 | Ar-4 | Ar-6 | Ar-4 |
| Ar-4 | Ar-4 | Ar-6 | Ar-5 |
| Ar-4 | Ar-4 | Ar-6 | Ar-6 |
| Ar-4 | Ar-5 | Ar-1 | Ar-5 |
| Ar-4 | Ar-5 | Ar-1 | Ar-6 |
| Ar-4 | Ar-5 | Ar-2 | Ar-5 |
| Ar-4 | Ar-5 | Ar-2 | Ar-6 |
| Ar-4 | Ar-5 | Ar-3 | Ar-5 |
| Ar-4 | Ar-5 | Ar-3 | Ar-6 |
| Ar-4 | Ar-5 | Ar-4 | Ar-5 |
| Ar-4 | Ar-5 | Ar-4 | Ar-6 |
| Ar-4 | Ar-5 | Ar-5 | Ar-4 |
| Ar-4 | Ar-5 | Ar-5 | Ar-5 |
| Ar-4 | Ar-5 | Ar-5 | Ar-6 |
| Ar-4 | Ar-5 | Ar-6 | Ar-4 |
| Ar-4 | Ar-5 | Ar-6 | Ar-5 |
| Ar-4 | Ar-5 | Ar-6 | Ar-6 |
| Ar-4 | Ar-6 | Ar-1 | Ar-5 |
| Ar-4 | Ar-6 | Ar-1 | Ar-6 |
| Ar-4 | Ar-6 | Ar-2 | Ar-5 |
| Ar-4 | Ar-6 | Ar-2 | Ar-6 |
| Ar-4 | Ar-6 | Ar-3 | Ar-5 |

TABLE 1-10-continued

| R1 | R3 | R4 | R6 |
|---|---|---|---|
| Ar-4 | Ar-6 | Ar-3 | Ar-6 |
| Ar-4 | Ar-6 | Ar-4 | Ar-5 |
| Ar-4 | Ar-6 | Ar-4 | Ar-6 |
| Ar-4 | Ar-6 | Ar-5 | Ar-5 |
| Ar-4 | Ar-6 | Ar-5 | Ar-6 |
| Ar-4 | Ar-6 | Ar-6 | Ar-4 |
| Ar-4 | Ar-6 | Ar-6 | Ar-5 |
| Ar-4 | Ar-6 | Ar-6 | Ar-6 |
| Ar-5 | Ar-1 | Ar-1 | Ar-5 |
| Ar-5 | Ar-1 | Ar-1 | Ar-6 |
| Ar-5 | Ar-1 | Ar-2 | Ar-5 |
| Ar-5 | Ar-1 | Ar-2 | Ar-6 |
| Ar-5 | Ar-1 | Ar-3 | Ar-5 |
| Ar-5 | Ar-1 | Ar-3 | Ar-6 |
| Ar-5 | Ar-1 | Ar-4 | Ar-5 |
| Ar-5 | Ar-1 | Ar-4 | Ar-6 |
| Ar-5 | Ar-1 | Ar-5 | Ar-5 |
| Ar-5 | Ar-1 | Ar-5 | Ar-6 |
| Ar-5 | Ar-1 | Ar-6 | Ar-5 |
| Ar-5 | Ar-1 | Ar-6 | Ar-6 |
| Ar-5 | Ar-2 | Ar-1 | Ar-6 |
| Ar-5 | Ar-2 | Ar-2 | Ar-5 |
| Ar-5 | Ar-2 | Ar-2 | Ar-6 |
| Ar-5 | Ar-2 | Ar-3 | Ar-5 |
| Ar-5 | Ar-2 | Ar-3 | Ar-6 |

TABLE 1-11

| R1 | R3 | R4 | R6 |
|---|---|---|---|
| Ar-5 | Ar-2 | Ar-4 | Ar-5 |
| Ar-5 | Ar-2 | Ar-4 | Ar-6 |
| Ar-5 | Ar-2 | Ar-5 | Ar-5 |
| Ar-5 | Ar-2 | Ar-5 | Ar-6 |
| Ar-5 | Ar-2 | Ar-6 | Ar-5 |
| Ar-5 | Ar-2 | Ar-6 | Ar-6 |
| Ar-5 | Ar-3 | Ar-1 | Ar-6 |
| Ar-5 | Ar-3 | Ar-2 | Ar-6 |
| Ar-5 | Ar-3 | Ar-3 | Ar-5 |
| Ar-5 | Ar-3 | Ar-3 | Ar-6 |
| Ar-5 | Ar-3 | Ar-4 | Ar-5 |
| Ar-5 | Ar-3 | Ar-4 | Ar-6 |
| Ar-5 | Ar-3 | Ar-5 | Ar-5 |
| Ar-5 | Ar-3 | Ar-5 | Ar-6 |
| Ar-5 | Ar-3 | Ar-6 | Ar-5 |
| Ar-5 | Ar-3 | Ar-6 | Ar-6 |
| Ar-5 | Ar-4 | Ar-1 | Ar-6 |
| Ar-5 | Ar-4 | Ar-2 | Ar-6 |
| Ar-5 | Ar-4 | Ar-3 | Ar-6 |
| Ar-5 | Ar-4 | Ar-4 | Ar-5 |
| Ar-5 | Ar-4 | Ar-4 | Ar-6 |
| Ar-5 | Ar-4 | Ar-5 | Ar-5 |
| Ar-5 | Ar-4 | Ar-5 | Ar-6 |
| Ar-5 | Ar-4 | Ar-6 | Ar-5 |
| Ar-5 | Ar-4 | Ar-6 | Ar-6 |
| Ar-5 | Ar-5 | Ar-1 | Ar-6 |
| Ar-5 | Ar-5 | Ar-2 | Ar-6 |
| Ar-5 | Ar-5 | Ar-3 | Ar-6 |
| Ar-5 | Ar-5 | Ar-4 | Ar-6 |
| Ar-5 | Ar-5 | Ar-5 | Ar-5 |
| Ar-5 | Ar-5 | Ar-5 | Ar-6 |
| Ar-5 | Ar-5 | Ar-6 | Ar-5 |
| Ar-5 | Ar-5 | Ar-6 | Ar-6 |
| Ar-5 | Ar-6 | Ar-1 | Ar-6 |
| Ar-5 | Ar-6 | Ar-2 | Ar-6 |
| Ar-5 | Ar-6 | Ar-3 | Ar-6 |
| Ar-5 | Ar-6 | Ar-4 | Ar-6 |
| Ar-5 | Ar-6 | Ar-5 | Ar-6 |
| Ar-5 | Ar-6 | Ar-6 | Ar-5 |
| Ar-5 | Ar-6 | Ar-6 | Ar-6 |
| Ar-6 | Ar-1 | Ar-1 | Ar-6 |
| Ar-6 | Ar-1 | Ar-2 | Ar-6 |
| Ar-6 | Ar-1 | Ar-3 | Ar-6 |
| Ar-6 | Ar-1 | Ar-4 | Ar-6 |
| Ar-6 | Ar-1 | Ar-5 | Ar-6 |

TABLE 1-11-continued

| R1 | R3 | R4 | R6 |
|---|---|---|---|
| Ar-6 | Ar-1 | Ar-6 | Ar-6 |
| Ar-6 | Ar-2 | Ar-2 | Ar-6 |
| Ar-6 | Ar-2 | Ar-3 | Ar-6 |
| Ar-6 | Ar-2 | Ar-4 | Ar-6 |
| Ar-6 | Ar-2 | Ar-5 | Ar-6 |
| Ar-6 | Ar-2 | Ar-6 | Ar-6 |
| Ar-6 | Ar-3 | Ar-3 | Ar-6 |
| Ar-6 | Ar-3 | Ar-4 | Ar-6 |
| Ar-6 | Ar-3 | Ar-5 | Ar-6 |
| Ar-6 | Ar-3 | Ar-6 | Ar-6 |
| Ar-6 | Ar-4 | Ar-4 | Ar-6 |
| Ar-6 | Ar-4 | Ar-5 | Ar-6 |
| Ar-6 | Ar-4 | Ar-6 | Ar-6 |
| Ar-6 | Ar-5 | Ar-5 | Ar-6 |
| Ar-6 | Ar-5 | Ar-6 | Ar-6 |
| Ar-6 | Ar-6 | Ar-6 | Ar-6 |

Furthermore, in the general formula (1), $R^2$ and $R^5$ are preferably each any of hydrogen, an alkyl group, a carbonyl group, an ester group and an aryl group. In particular, $R^2$ and $R^5$ are preferably each hydrogen or an alkyl group from the point of view of the thermal stability of the compound represented by the general formula (1), and are more preferably each hydrogen from the point of view of the fact that a narrow full width at half maximum in an emission spectrum can be obtained easily.

Furthermore, $R^8$ and $R^9$ in the general formula (1) are preferably each an alkyl group, an aryl group, a heteroaryl group, an alkoxy group, an aryl ether group, fluorine, a fluorine-containing alkyl group, a fluorine-containing heteroaryl group, a fluorine-containing aryl group, a fluorine-containing alkoxy group, a fluorine-containing aryl ether group or a cyano group. In particular, $R^8$ and $R^9$ are more preferably each fluorine, a cyano group or a fluorine-containing aryl group because stability against excitation light and higher fluorescent quantum yield can be obtained. Furthermore, $R^8$ and $R^9$ are more preferably each fluorine or a cyano group from the point of view of easy synthesis. In particular, either $R^8$ or $R^9$ is preferably a cyano group. The introduction of a cyano group as $R^8$ or $R^9$ results in enhancements in the durability of the compound represented by the general formula (1).

Here, the fluorine-containing aryl group is an aryl group containing fluorine. Examples of the fluorine-containing aryl groups include fluorophenyl group, trifluoromethylphenyl group and pentafluorophenyl group. The fluorine-containing heteroaryl group is a heteroaryl group containing fluorine. Examples of the fluorine-containing heteroaryl groups include fluoropyridyl group, trifluoromethylpyridyl group and trifluoropyridyl group. The fluorine-containing alkyl group is an alkyl group containing fluorine. Examples of the fluorine-containing alkyl groups include trifluoromethyl group and pentafluoroethyl group.

Furthermore, from the point of view of photo stability, X in the general formula (1) is preferably C—$R^7$. Furthermore, when X is C—$R^7$, the durability of the compound represented by the general formula (1) tends to be affected by the substituent $R^7$. That is, the substituent $R^7$ greatly affects the decrease with time in the emission intensity of the compound. Specifically, when $R^7$ is hydrogen, this site shows high reactivity and the site tends to react easily with water or oxygen in the air. This reaction of $R^7$ can cause the decomposition of the compound represented by the general formula (1). Furthermore, when $R^7$ is a substituent with a high degree of freedom of molecular chain movement such as, for example, an alkyl group, the reactivity of $R^7$ is indeed low but the molecules of the compound tend to aggregate with time in the inside of the color conversion layer. This aggregation of the compound results in a decrease in emission intensity due to concentration quenching. Thus, $R^7$ may be hydrogen or an alkyl group but is preferably a group which is rigid and has a small degree of freedom of movement to reduce the probability of aggregation. Specifically, $R^7$ is preferably any of a substituted or unsubstituted aryl group, and a substituted or unsubstituted heteroaryl group.

From the point of view of the fact that the compound gives a higher fluorescent quantum yield and is more resistant to thermal decomposition, and also from the point of view of photo stability, it is preferable that X Be C—$R^7$ and $R^7$ be a substituted or unsubstituted aryl group. From the point of view of ensuring that the emission wavelength is not impaired, this aryl group is preferably a phenyl group, a biphenyl group, a terphenyl group, a naphthyl group, a fluorenyl group, a phenanthryl group or an anthracenyl group.

Furthermore, the twisting of the carbon-carbon bond between R and the pyrromethene skeleton needs to be appropriately small in order to increase the photo stability of the compound represented by the general formula (1). A reason for this is because if the twisting is excessively large, the photo stability is lowered due to factors such as the increase in reactivity with respect to excitation light. From such points of view, $R^7$ is preferably a substituted or unsubstituted phenyl group, a substituted or unsubstituted biphenyl group, a substituted or unsubstituted terphenyl group, or a substituted or unsubstituted naphthyl group, and more preferably a substituted or unsubstituted phenyl group, a substituted or unsubstituted biphenyl group, or a substituted or unsubstituted terphenyl group. $R^7$ is particularly preferably a substituted or unsubstituted phenyl group.

Furthermore, $R^7$ is preferably an appropriately bulky substituent. By virtue of $R^7$ having a certain degree of bulkiness, the aggregation of the molecules can be prevented. As a result, the compound represented by the general formula (1) attains further enhancements in emission efficiency and durability.

More preferred examples of the bulky substituents as $R^7$ include groups having a structure represented by the general formula (2) below. That is, when X in the general formula (1) is C—$R^7$, $R^7$ is preferably a group represented by the general formula (2) below.

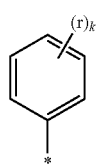

(2)

In the general formula (2), r is selected from the group consisting of hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, ester group, carbamoyl group, amino group, nitro group, silyl group, siloxanyl group, boryl group, sulfo group and phosphine oxide group.

The letter k is an integer of 1 to 3. When k is 2 or greater, r may be the same as or different from one another.

From the point of view of the fact that the compound can give higher emission quantum yield, r is preferably a substituted or unsubstituted aryl group. In particular, preferred examples of the aryl groups include phenyl group and naphthyl group. When r is an aryl group, k in the general formula (2) is preferably 1 or 2, and in particular, from the point of view of preventing the aggregation of molecules more effectively, is more preferably 2. Furthermore, when k is 2 or greater, at least one of the plurality of r is preferably substituted with an alkyl group. From the point of view of thermal stability, particularly preferred examples of the alkyl groups in this case include methyl group, ethyl group and tert-butyl group.

Furthermore, from the points of view of controlling the fluorescent wavelength and absorption wavelength of the compound represented by the general formula (1), and enhancing the compatibility with solvents, r is preferably a substituted or unsubstituted alkyl group, a substituted or unsubstituted alkoxy group or a halogen, and more preferably a methyl group, an ethyl group, a tert-butyl group or a methoxy group. From the point of view of dispersibility, r is particularly preferably a tert-butyl group or a methoxy group. The quenching due to the aggregation of molecules is more effectively prevented when r is a tert-butyl group or a methoxy group.

Furthermore, in a further sub-embodiment of the compounds represented by the general formula (1), it is preferable that at least one of $R^1$ to $R^7$ be an electron withdrawing group. In particular, the first to third sub-embodiments described below are preferable. In the first preferred sub-embodiment, at least one of $R^1$ to $R^6$ may be an electron withdrawing group. In the second preferred sub-embodiment, $R^7$ may be an electron withdrawing group. In the third preferred sub-embodiment, at least one of $R^1$ to $R^6$ may be an electron withdrawing group, and $R^7$ may be an electron withdrawing group. The introduction of an electron withdrawing group into the pyrromethene skeleton of the compound represented by the general formula (1) as described above makes it possible to significantly lower the electron density of the pyrromethene skeleton. As a result of this, the compound represented by the general formula (1) attains still enhanced stability against oxygen, and consequently the durability of the compound represented by the general formula (1) can be further enhanced.

The electron withdrawing group is an atomic group which is also called an electron accepting group and which in the organic electronic theory, attracts an electron from an atomic group substituted therewith by the inductive effect and the resonance effect. Examples of the electron withdrawing groups include those having a positive value of substituent constant (σp (para)) of the Hammett rule. The substituent constants (σp (para)) of the Hammett rule can be quoted from KAGAKU BINRAN (Chemical Handbook), Basic Edition, 5th revised version (page II-380). Incidentally, the phenyl group is described as having a positive value of the above constant in some examples, but the phenyl group is not included in the electron withdrawing groups in the present invention.

Examples of the electron withdrawing groups include —F (σp: +0.06), —Cl (σp: +0.23), —Br (σp: +0.23), —I (σp: +0.18), —$CO_2R^{12}$ (σp: +0.45 when $R^{12}$ is an ethyl group), —$CONH_2$ (σp: +0.38), —$COR^{12}$ (σp: +0.49 when $R^{12}$ is a methyl group), —$CF_3$ (σp: +0.50), —$SO_2R^{12}$ (σp: +0.69 when $R^{12}$ is a methyl group) and —$NO_2$ (σp: +0.81). $R^{12}$ denotes a hydrogen atom, a substituted or unsubstituted aromatic hydrocarbon group having 6 to 30 ring-forming carbon atoms, a substituted or unsubstituted heterocyclic group having 5 to 30 ring-forming atoms, a substituted or unsubstituted alkyl group having 1 to 30 carbon atoms, or a substituted or unsubstituted cycloalkyl group having 1 to 30 carbon atoms. Specific examples of these groups include those described hereinabove.

In the general formula (1), at least one of $R^2$ and $R^5$ is preferably an electron withdrawing group. A reason for this is described below. That is, $R^2$ and $R^5$ in the general formula (1) are substituents at substitution positions which significantly affect the electron density of the pyrromethene skeleton. The introduction of electron withdrawing groups as $R^2$ and $R^5$ makes it possible to efficiently lower the electron density of the pyrromethene skeleton. As a result of this, the compound represented by the general formula (1) attains a further enhancement in the stability against oxygen, and consequently the durability of the compound can be further enhanced.

Furthermore, it is more preferable that $R^2$ and $R^5$ in the general formula (1) be electron withdrawing groups. A reason for this is because this configuration still further enhances the stability against oxygen of the compound represented by the general formula (1), and consequently the durability of the compound can be markedly enhanced.

Furthermore, in the general formula (1), the electron withdrawing group is preferably a group containing a fluorine atom. When the electron withdrawing group is a group containing a fluorine atom, the electron density of the pyrromethene skeleton can be further lowered. As a result of this, the stability against oxygen of the compound represented by the general formula (1) is enhanced, and the durability of the compound can be enhanced.

Preferred examples of the electron withdrawing groups include fluorine, fluorine-containing aryl groups, fluorine-containing heteroaryl groups, fluorine-containing alkyl groups, substituted or unsubstituted acyl groups, substituted or unsubstituted ester groups, substituted or unsubstituted amide groups, substituted or unsubstituted sulfonyl groups, substituted or unsubstituted sulfonate ester groups, substituted or unsubstituted sulfonamide groups, and cyano group. A reason for this is because these are chemically stable against decomposition.

More preferred examples of the electron withdrawing groups include fluorine-containing alkyl groups, substituted or unsubstituted acyl groups, substituted or unsubstituted ester groups, substituted or unsubstituted amide groups, substituted or unsubstituted sulfonyl groups, substituted or unsubstituted sulfonate ester groups, substituted or unsubstituted sulfonamide groups, and cyano group. A reason for this is because these groups effectively prevent concentration quenching and enhance the emission quantum yield. Particularly preferred electron withdrawing groups are substituted or unsubstituted ester groups. Furthermore, substituted ester groups are more preferable as the electron withdrawing groups because the probability of the aggregation of molecules in the inside of the color conversion layer is reduced, and the durability is enhanced.

Still more preferred examples of the electron withdrawing groups include fluorine-containing acyl groups, fluorine-containing ester groups, fluorine-containing amide groups, fluorine-containing sulfonyl groups, fluorine-containing sulfonate ester groups, and fluorine-containing sulfonamide groups. These groups can efficiently lower the electron density of the pyrromethene boron complex skeleton. As a result of this, the compound represented by the general formula (1) attains enhanced stability against oxygen and consequently the durability of the compound can be further enhanced.

In particular, at least one of $R^2$ and $R^5$ may be preferably the same as or different from one another and each a substituted or unsubstituted ester group. A reason for this is because in this case, the durability can be enhanced without impairing the color purity. In particular, from the point of view of enhancing the durability, $R^2$ and $R^5$ may be more preferably the same as or different from one another and both substituted or unsubstituted ester groups.

A preferred example of the compounds represented by the general formula (1) is a case in which $R^1$, $R^3$, $R^4$ and $R^6$ may be all the same as or different from one another and each a substituted or unsubstituted alkyl group, and further X is C—$R^7$ and $R^7$ is a group represented by the general formula (2). In this case, $R^7$ is particularly preferably a group represented by the general formula (2) in which r is a substituted or unsubstituted phenyl group.

Furthermore, another preferred example of the compounds represented by the general formula (1) is a case in which $R^1$, $R^3$, $R^4$ and $R^6$ may be all the same as or different from one another and selected from Ar-1 to Ar-6 described hereinabove, and further X is C—$R^7$ and $R^7$ is a group represented by the general formula (2). In this case, $R^7$ is more preferably a group represented by the general formula (2) in which r is a tert-butyl group or a methoxy group, and particularly preferably a group represented by the general formula (2) in which r is a methoxy group.

Furthermore, another preferred example of the compounds represented by the general formula (1) is a case in which $R^1$, $R^3$, $R^4$ and $R^6$ may be all the same as or different from one another and each a substituted or unsubstituted alkyl group, $R^2$ and $R^5$ may be the same as or different from one another and each a substituted or unsubstituted ester group, and further X is C—$R^7$ and $R^7$ is a group represented by the general formula (2). In this case, R is particularly preferably a group represented by the general formula (2) in which r is a substituted or unsubstituted phenyl group.

Furthermore, another preferred example of the compounds represented by the general formula (1) is a case in which $R^1$, $R^3$, $R^4$ and $R^6$ may be all the same as or different from one another and selected from Ar-1 to Ar-6 described hereinabove, $R^2$ and $R^5$ may be the same as or different from one another and each a substituted or unsubstituted ester group, and further X is C—$R^7$ and $R^7$ is a group represented by the general formula (2). In this case, $R^7$ is more preferably a group represented by the general formula (2) in which r is a tert-butyl group or a methoxy group, and is particularly preferably a group represented by the general formula (2) in which r is a methoxy group.

Some examples of the compounds represented by the general formula (1) will be illustrated hereinbelow, but the compounds are not limited thereto.

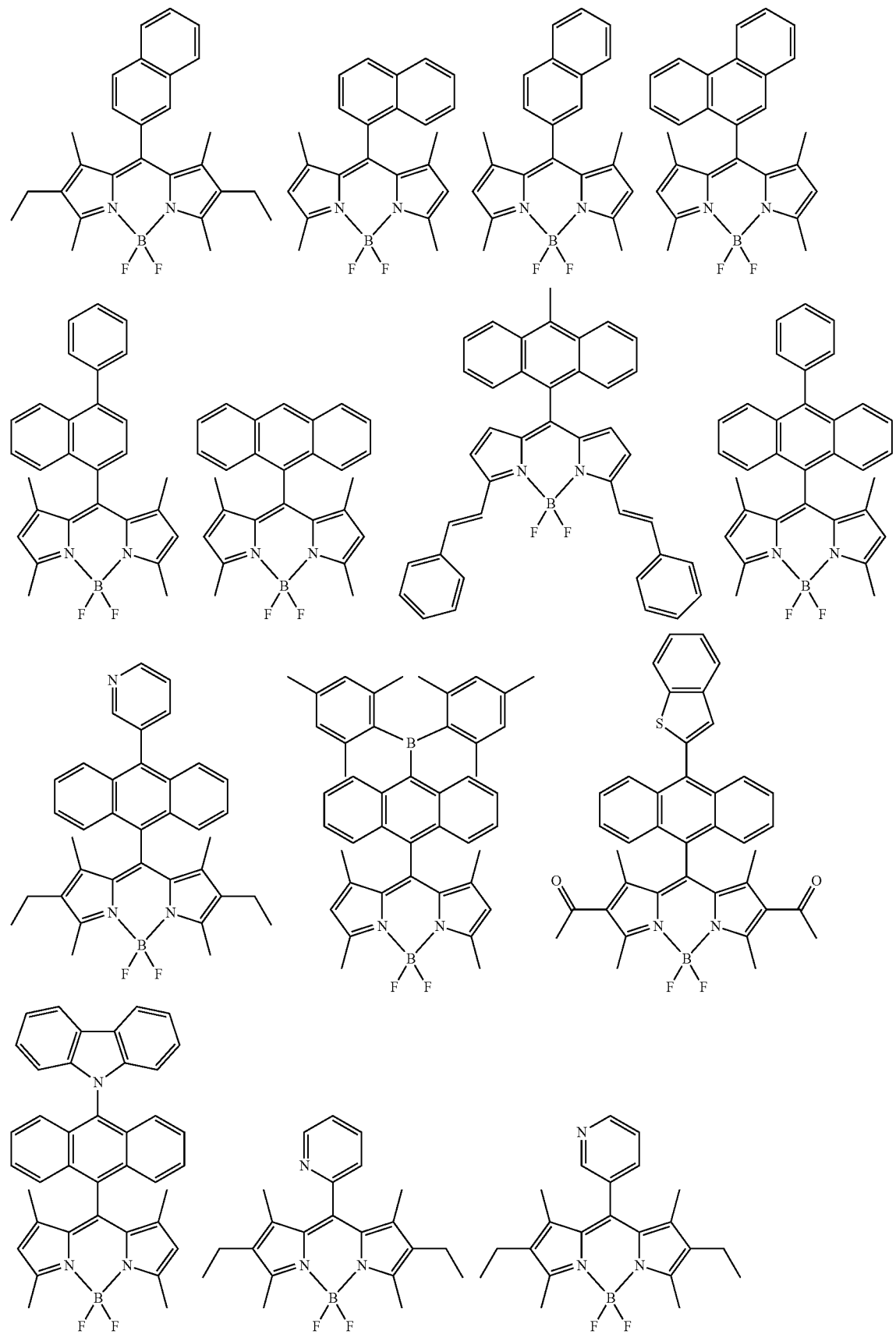

-continued
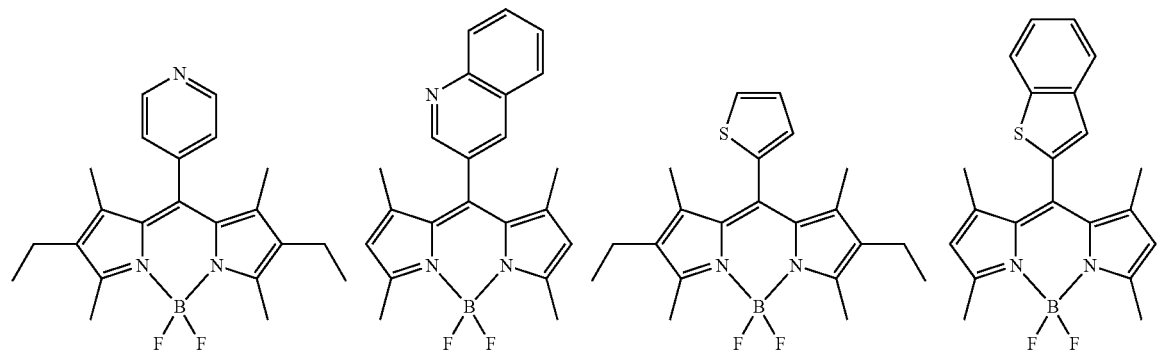
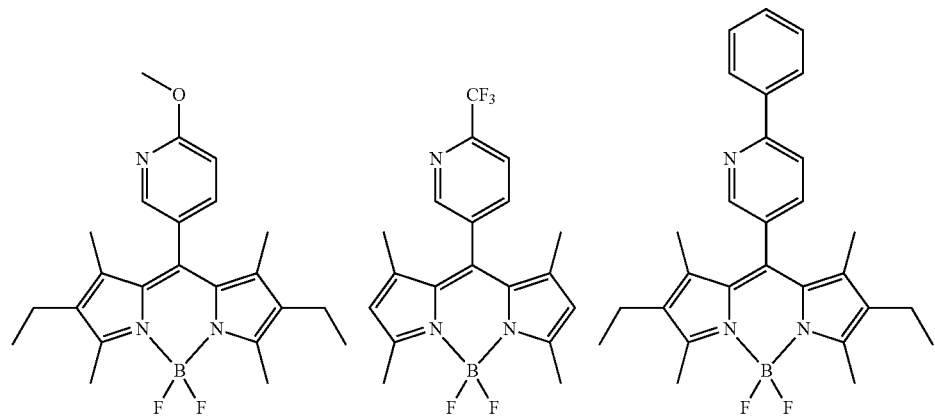
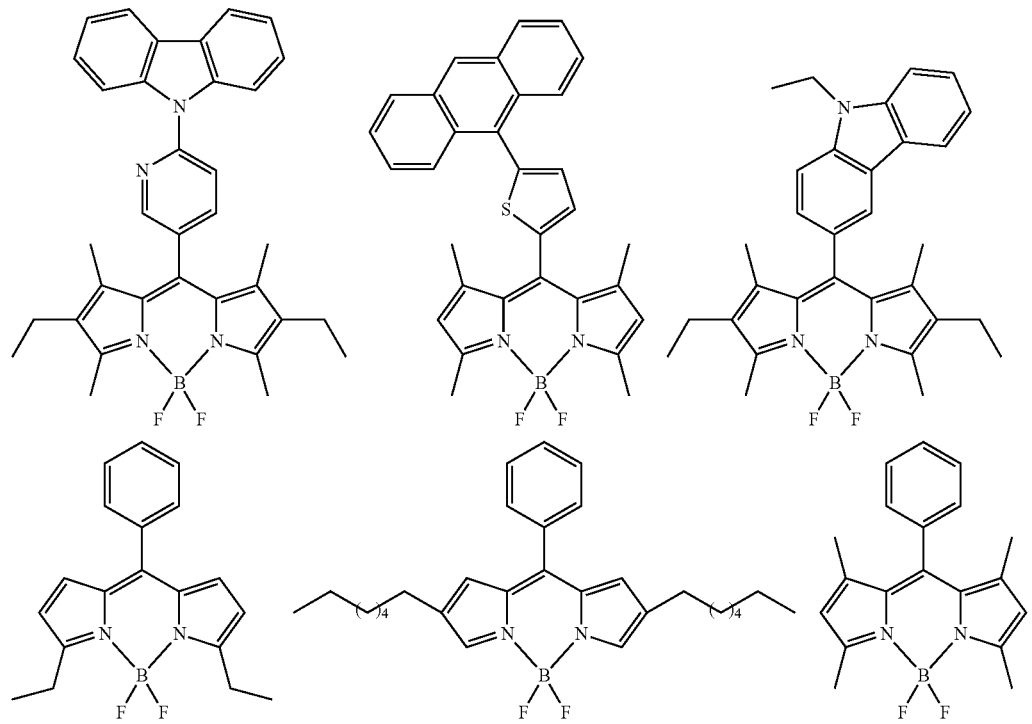

-continued
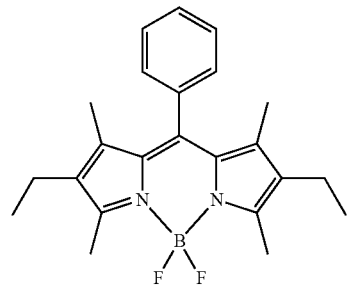 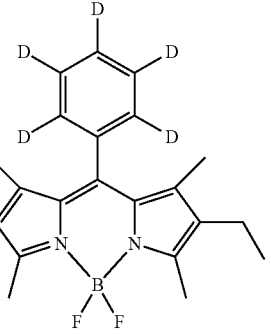 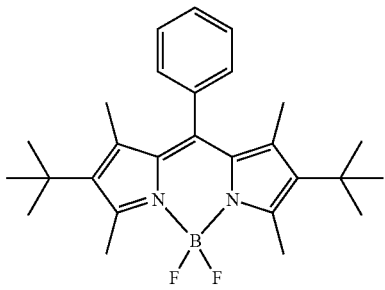
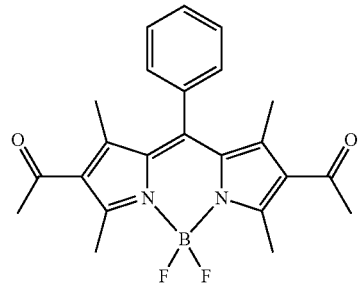 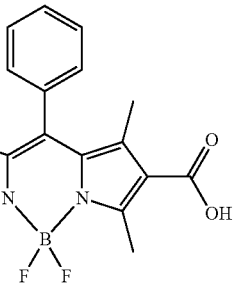
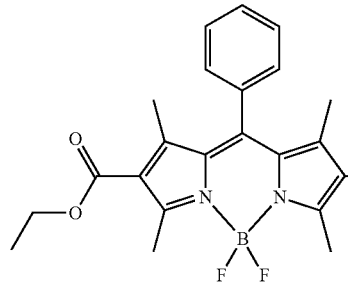 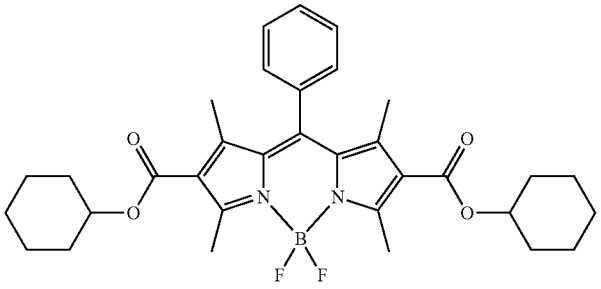
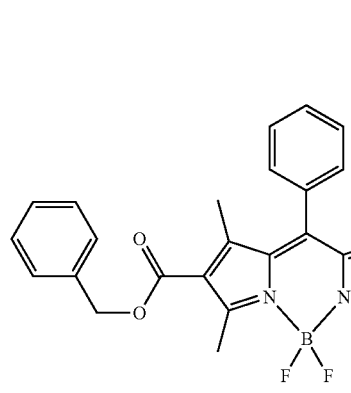 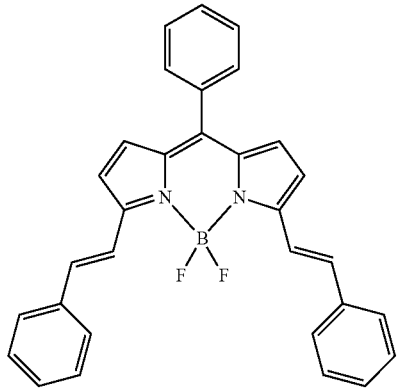
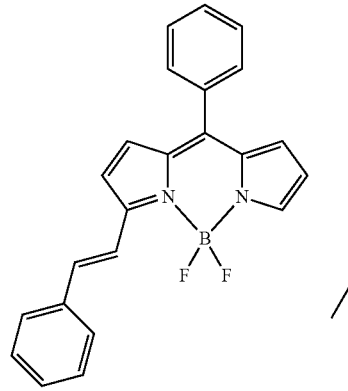 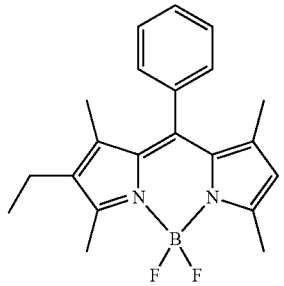 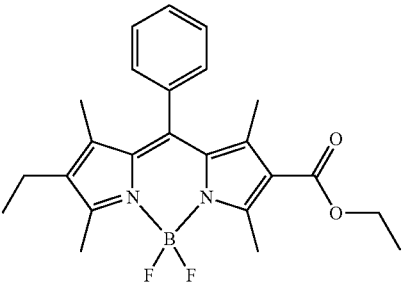

-continued
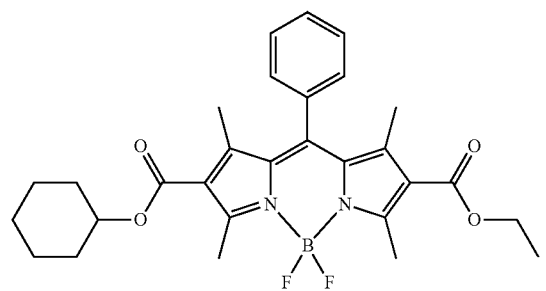
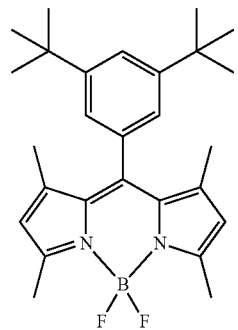
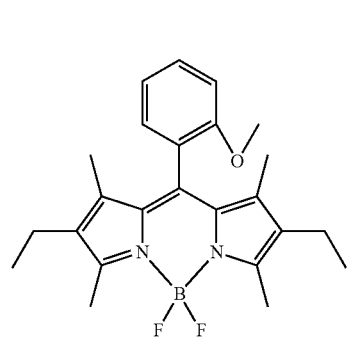
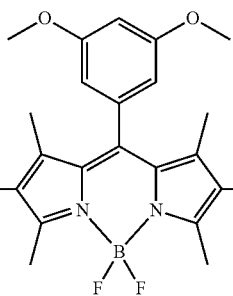
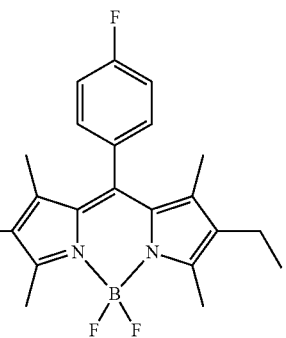
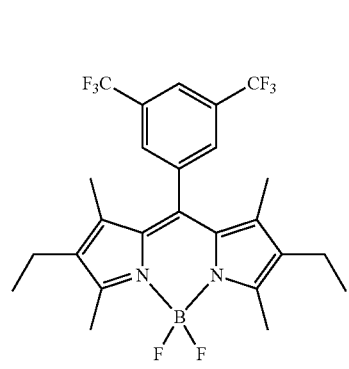
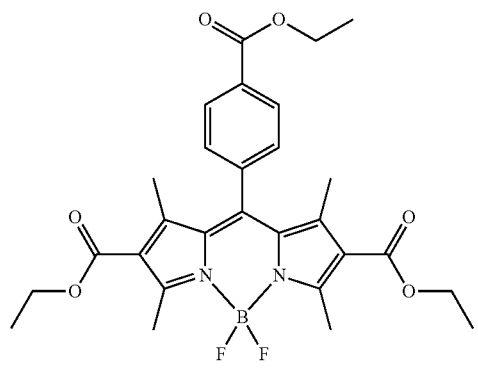
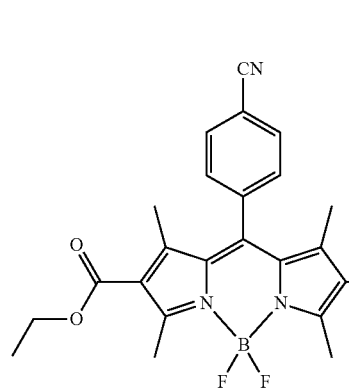
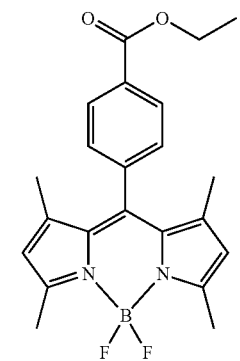
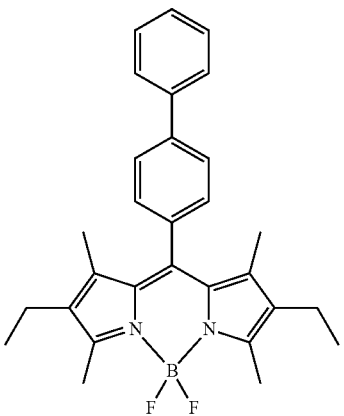

-continued
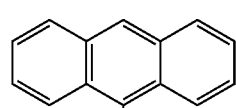 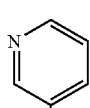 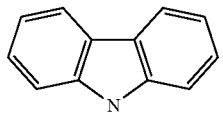 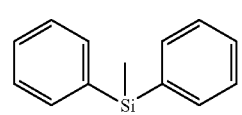
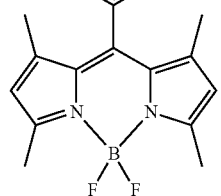 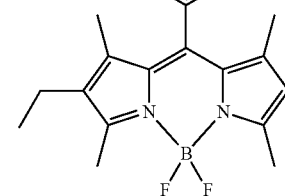 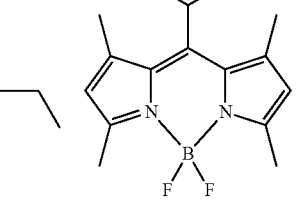 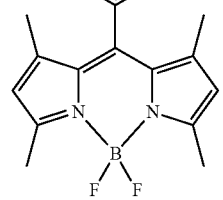
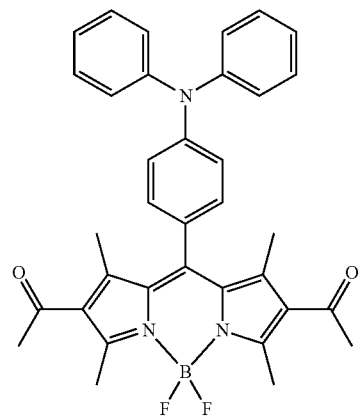 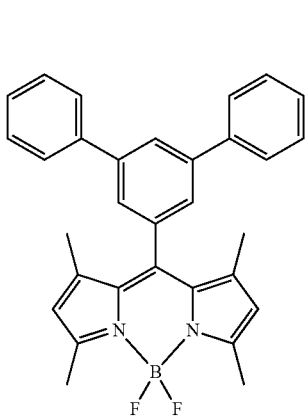 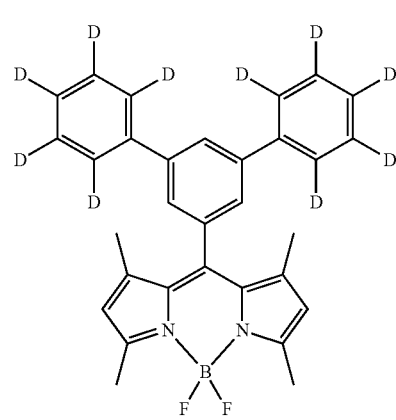
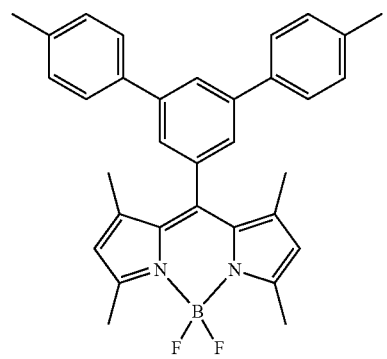 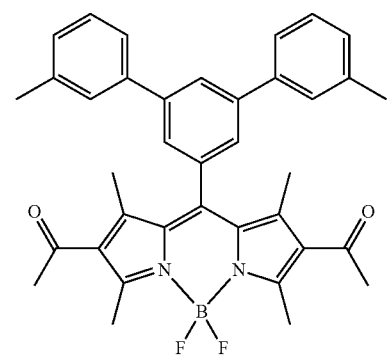 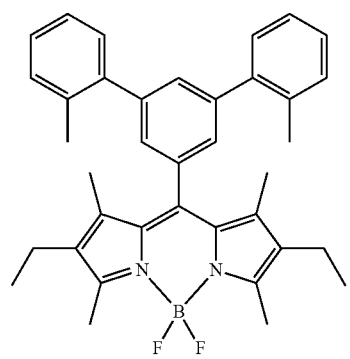
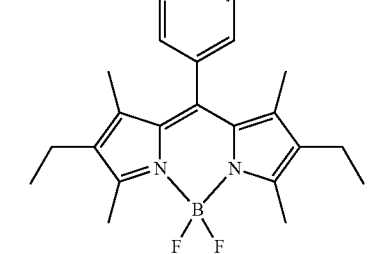 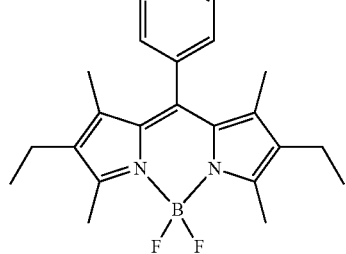

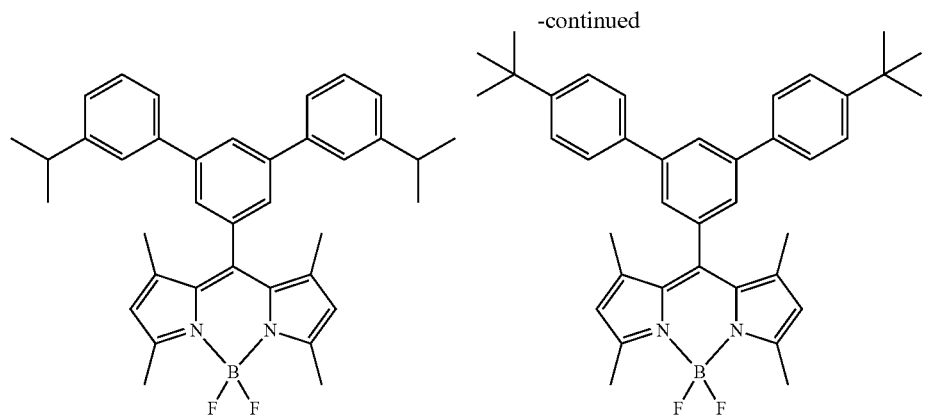
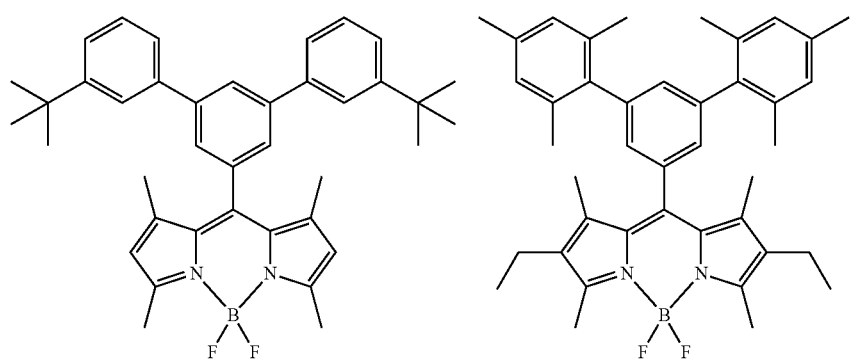
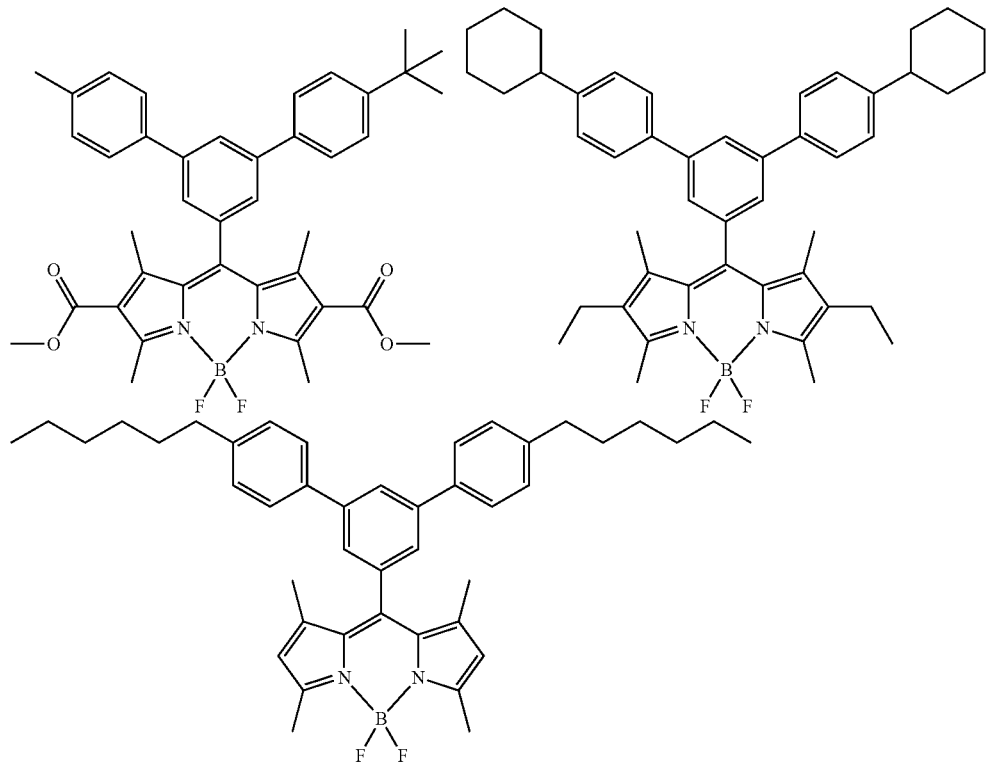

-continued
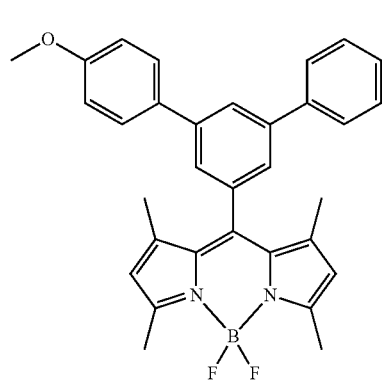
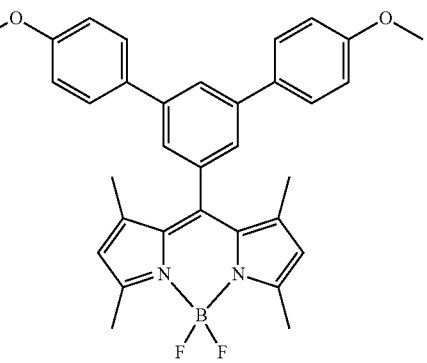
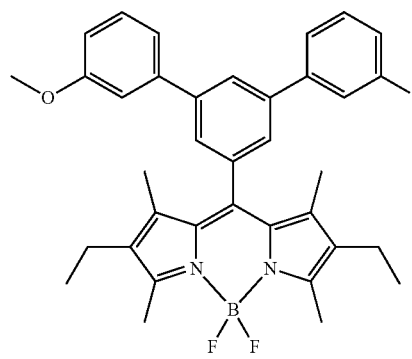
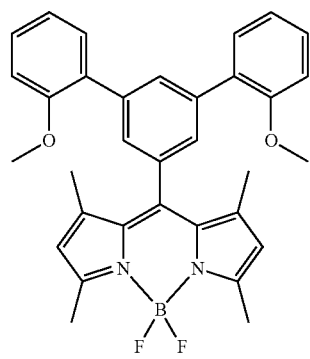
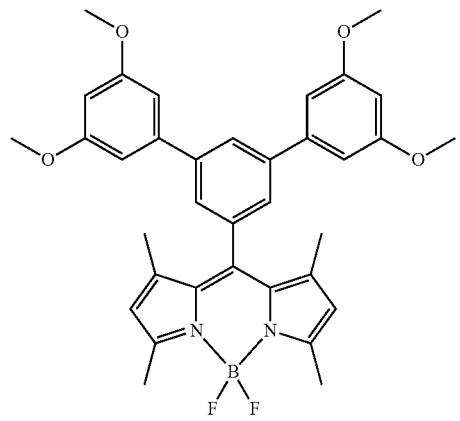
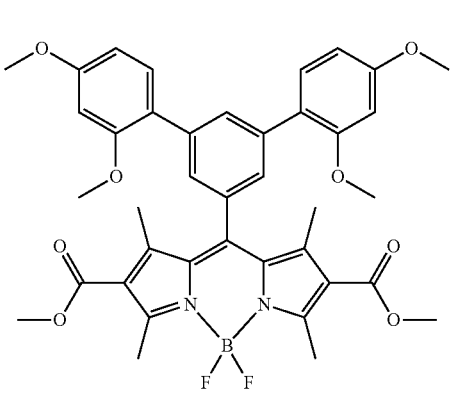
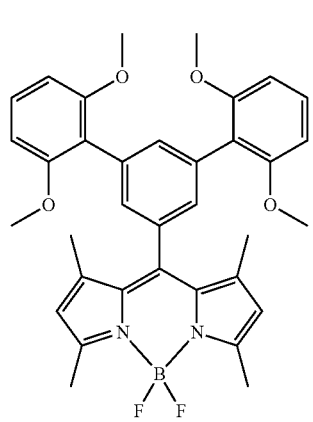
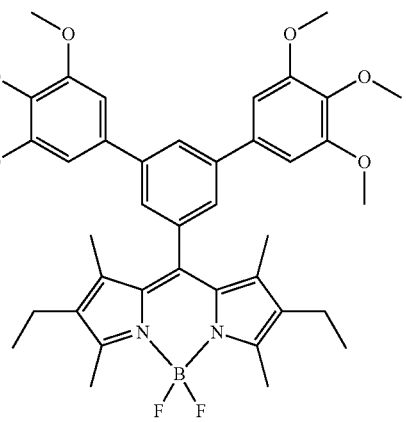

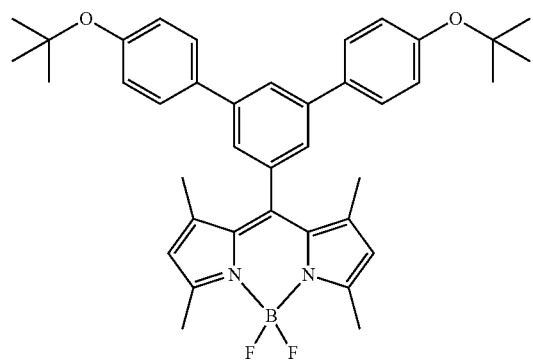
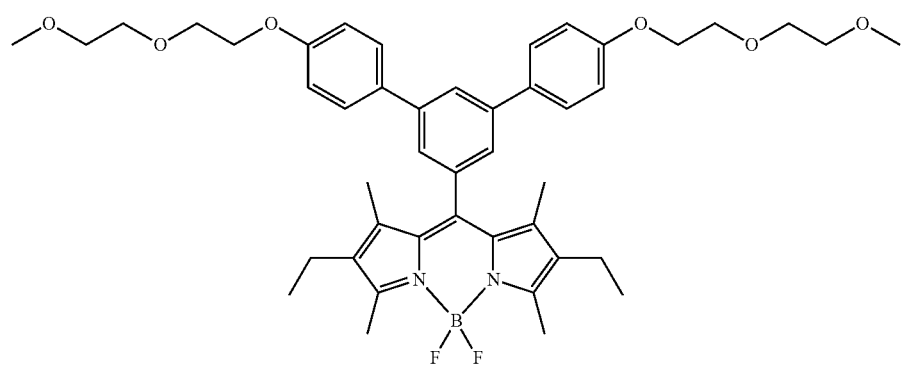
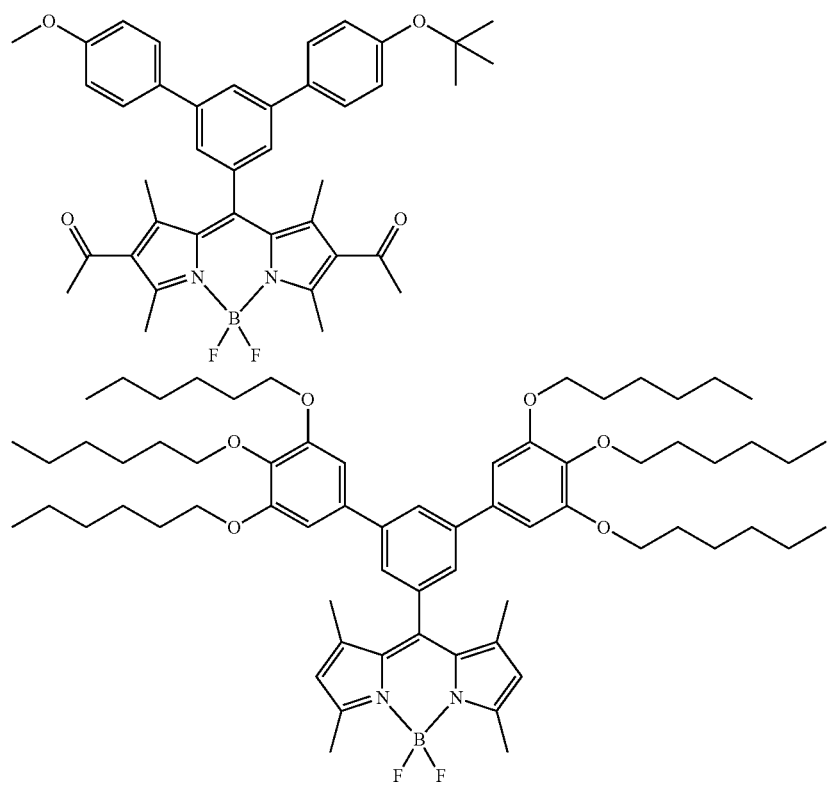

-continued
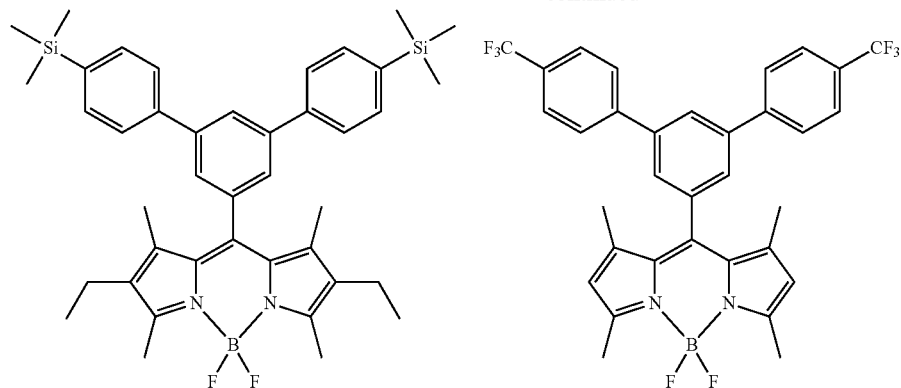
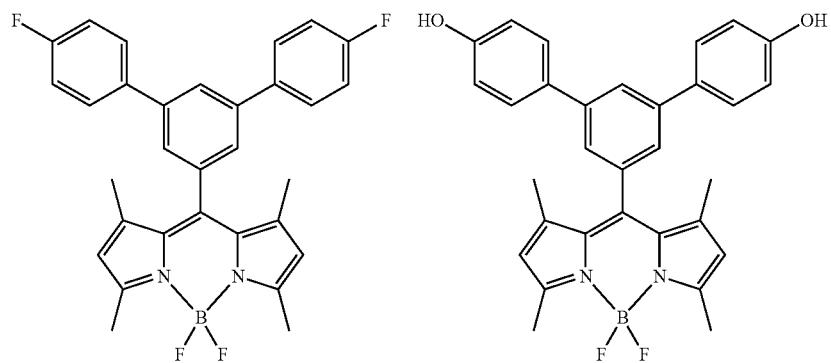
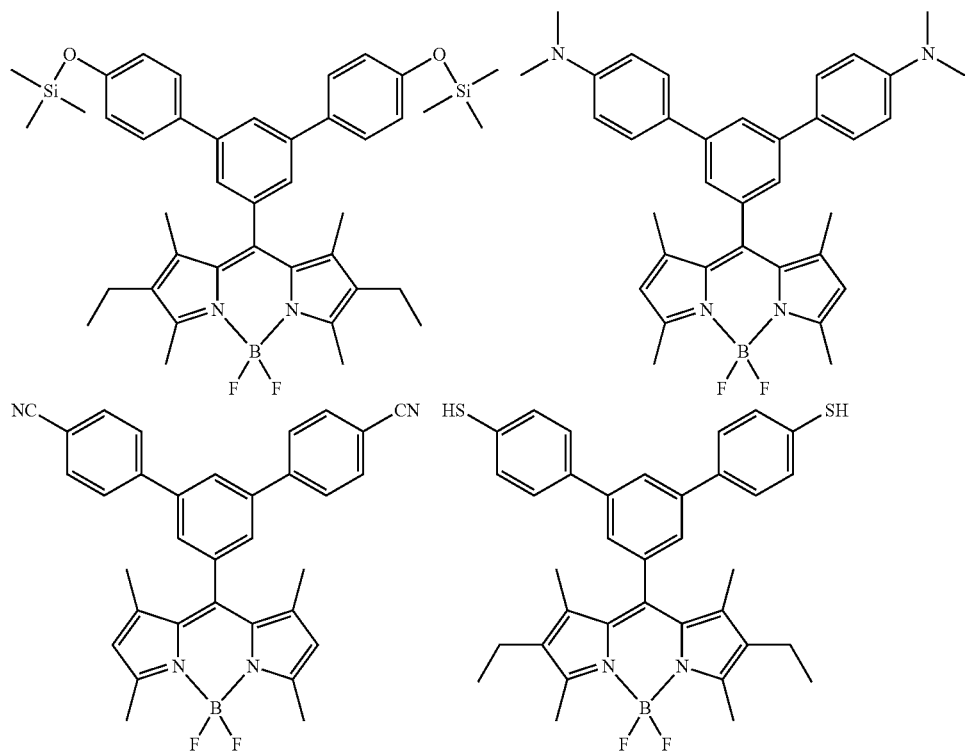
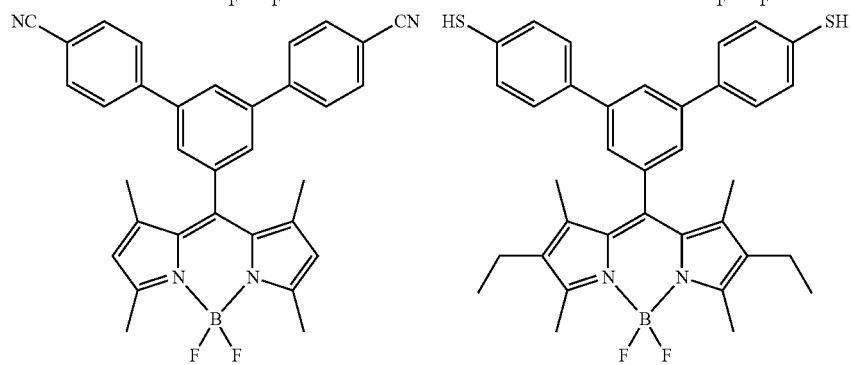

-continued
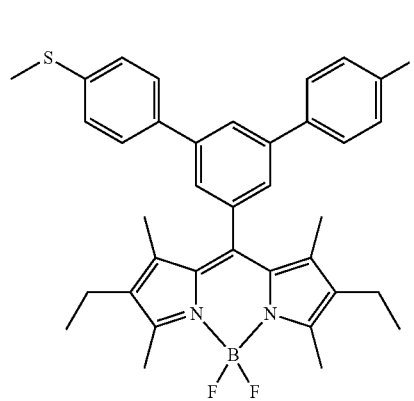
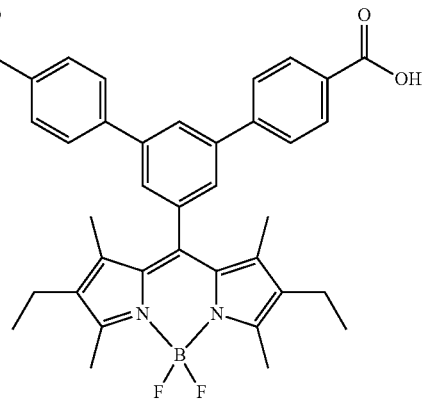
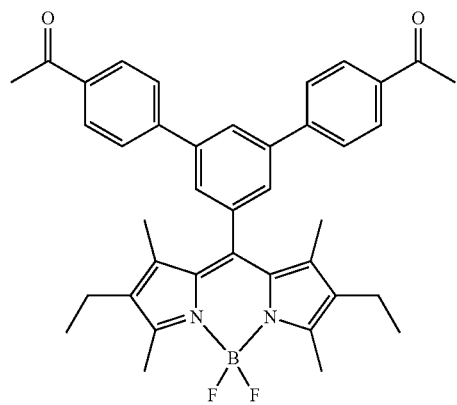
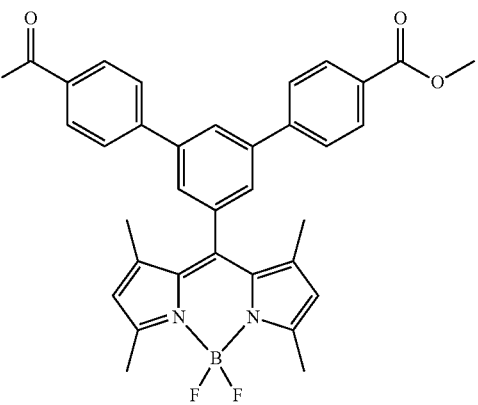
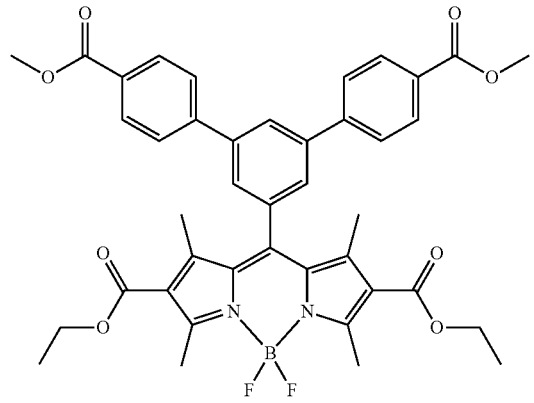
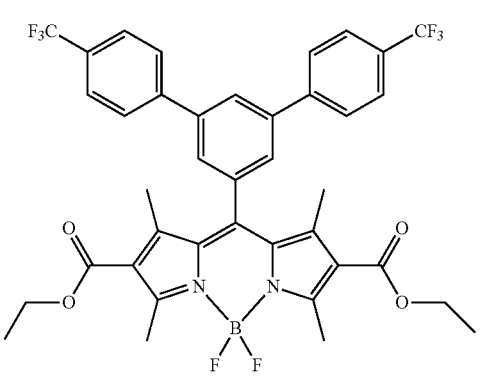
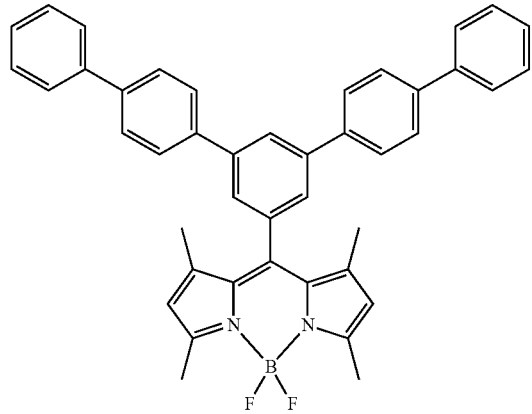
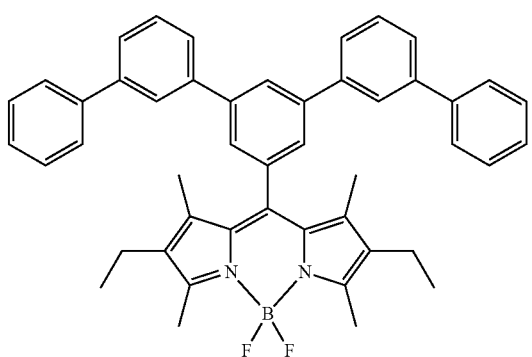

-continued
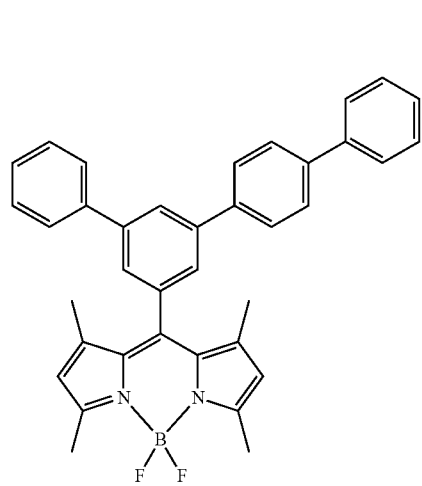
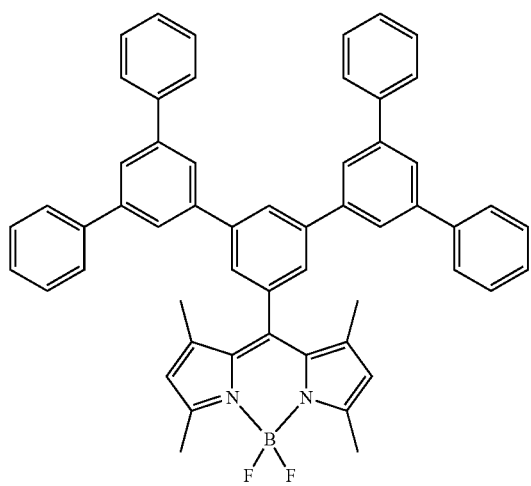
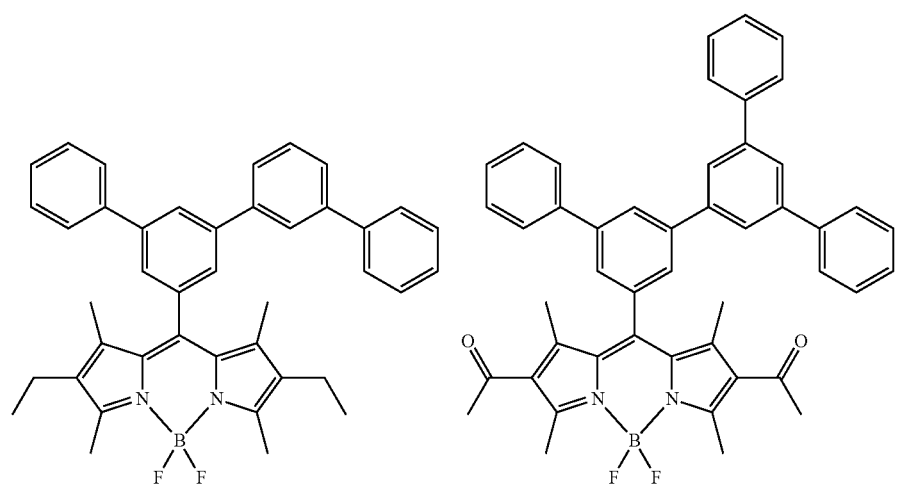
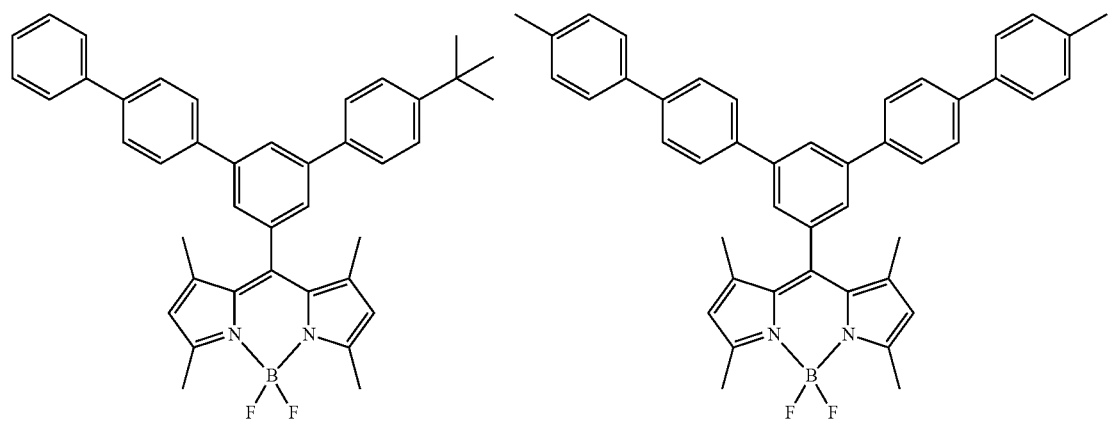

-continued
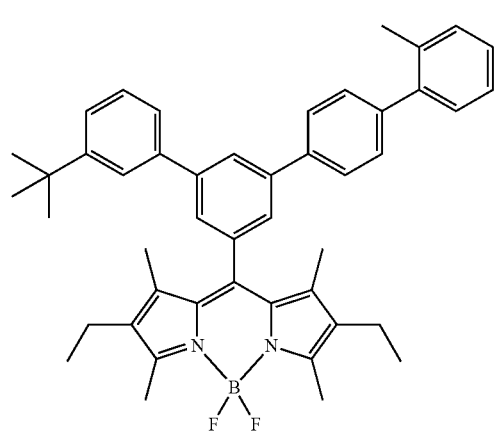
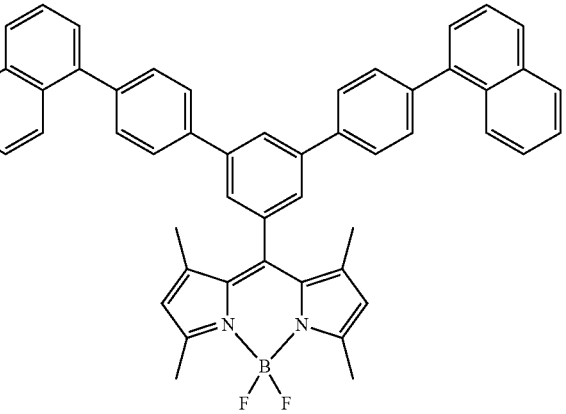
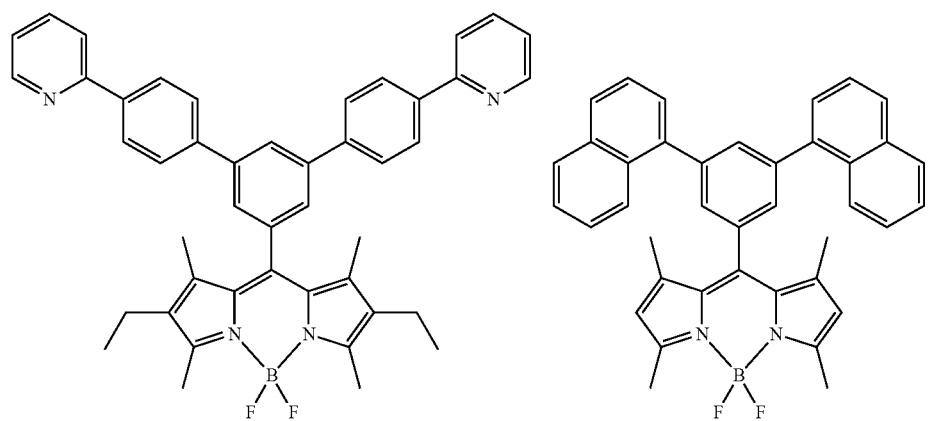
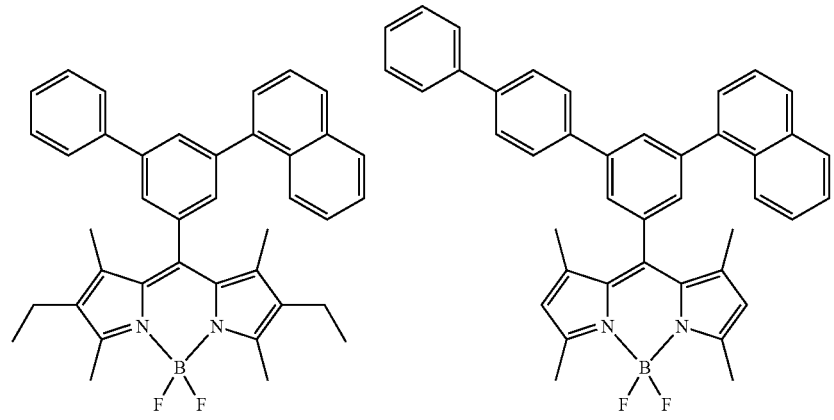
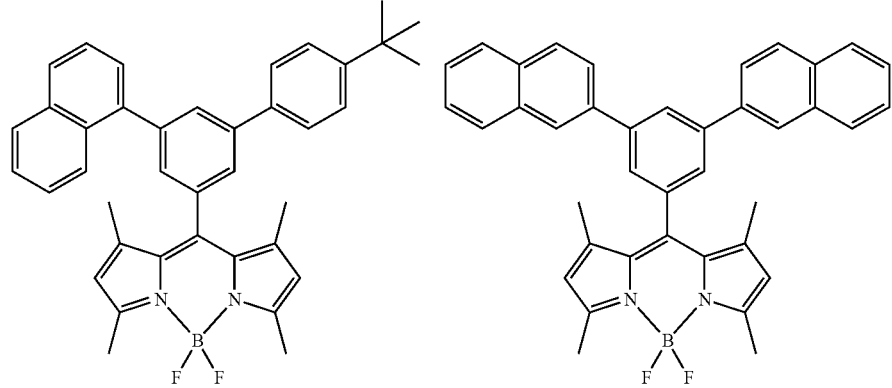

-continued
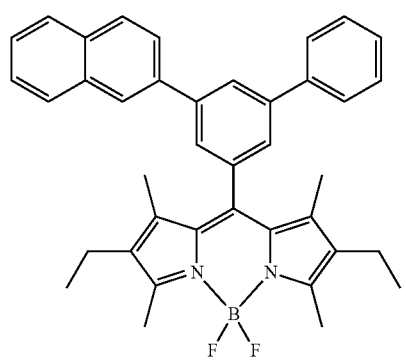
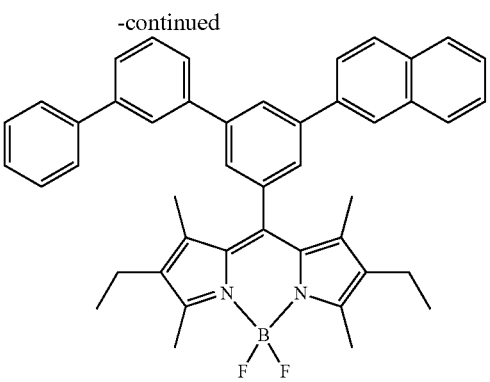
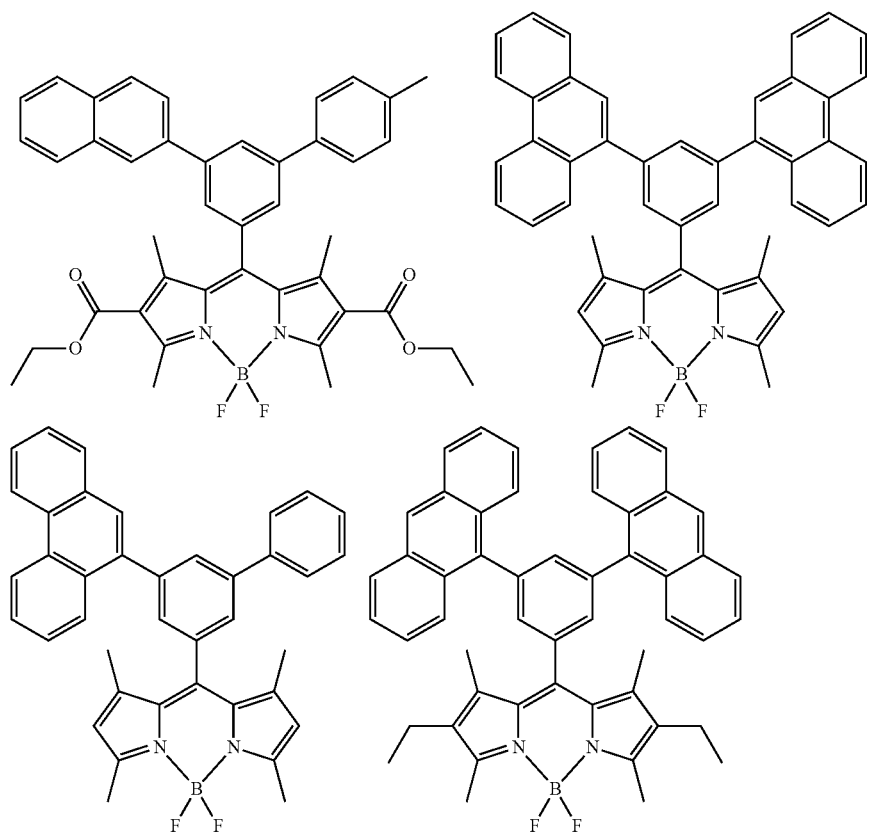
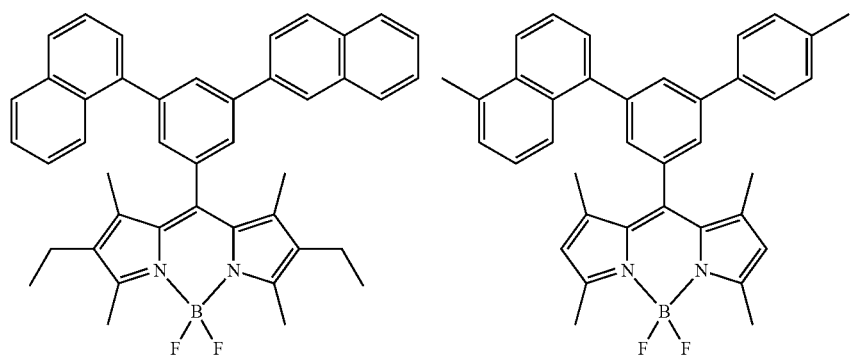

-continued
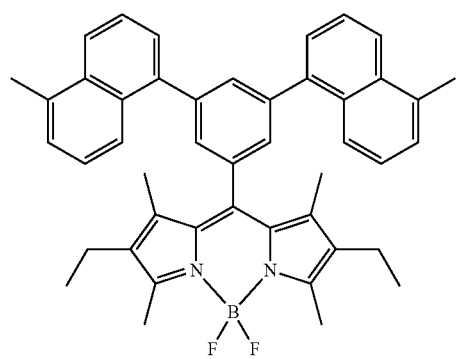
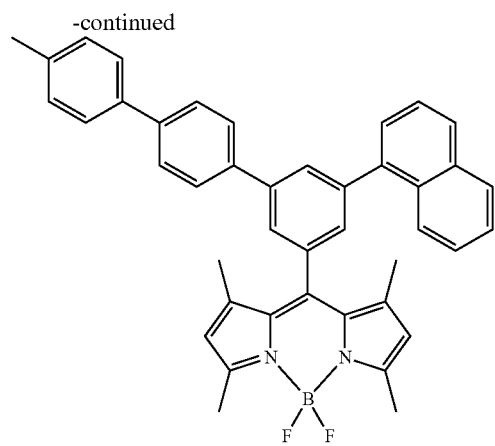
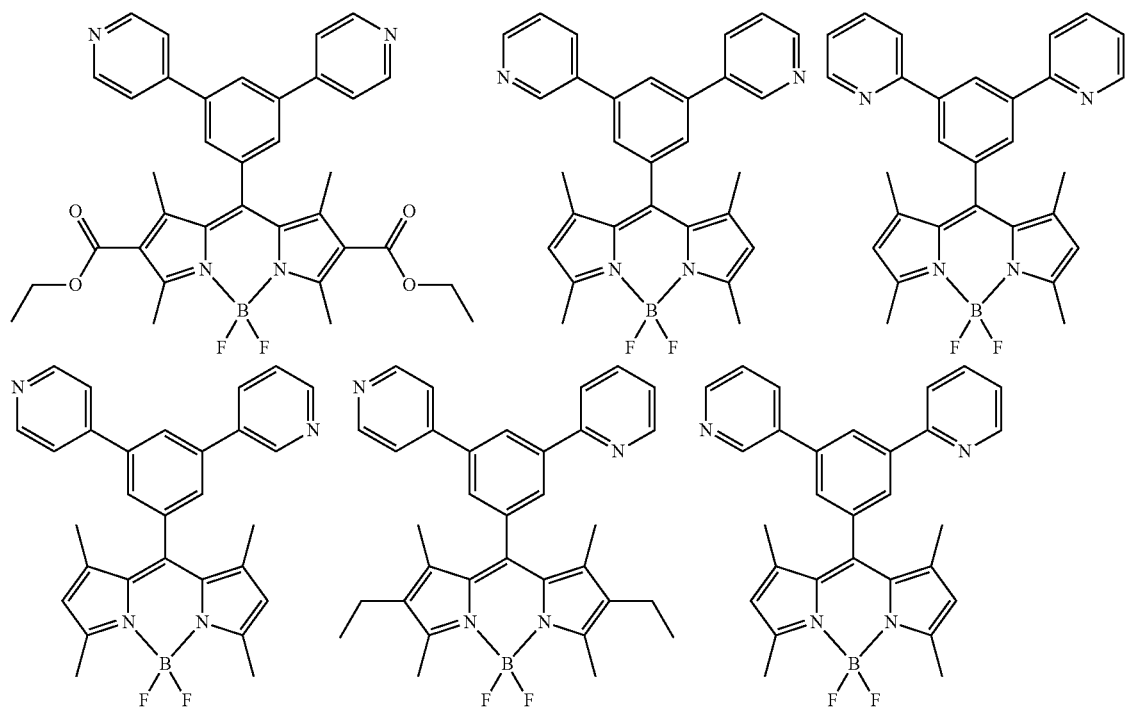
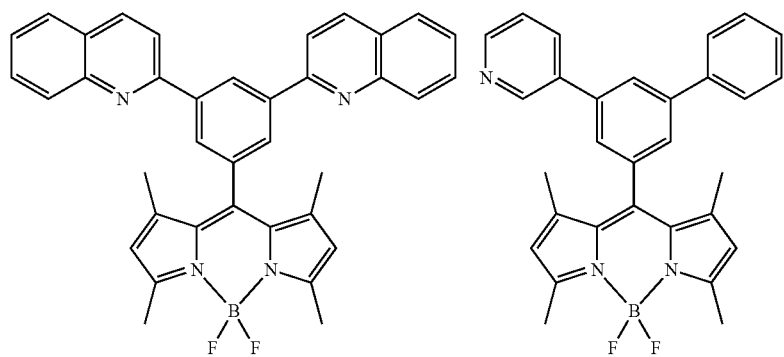

-continued
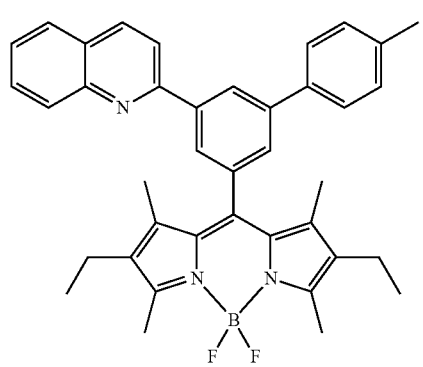
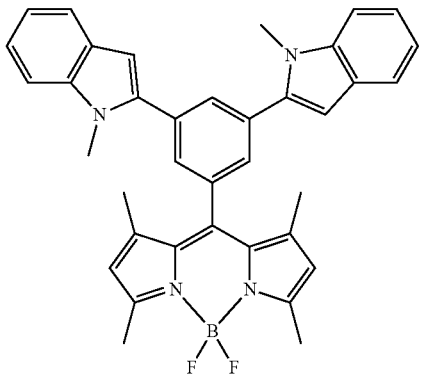
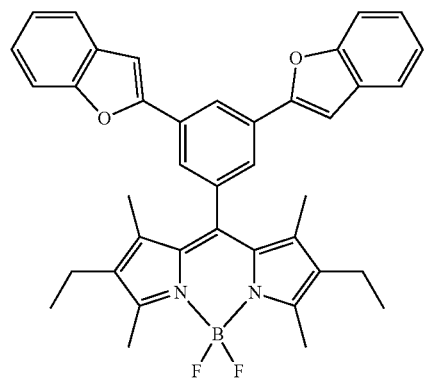
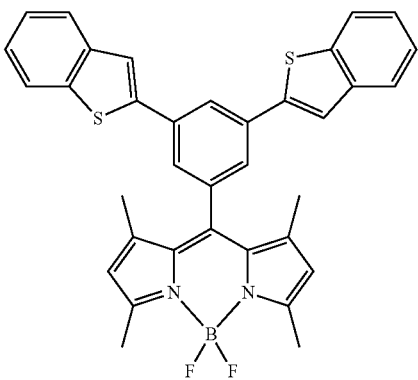
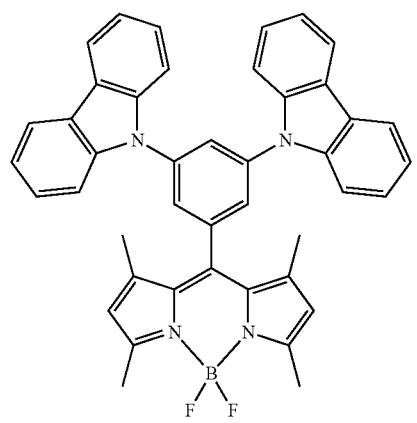
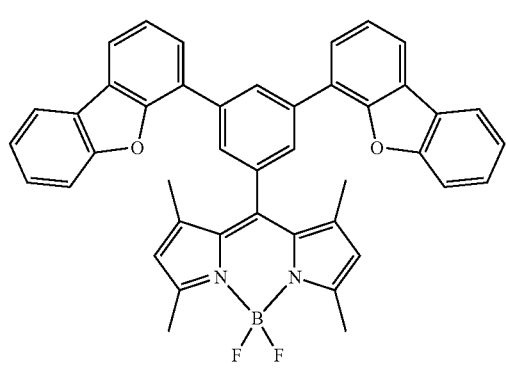
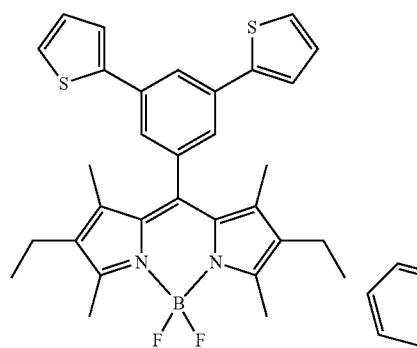
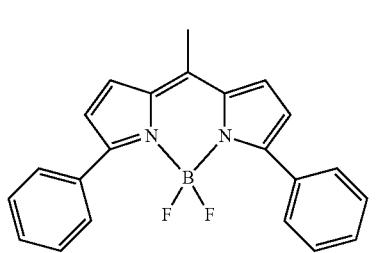
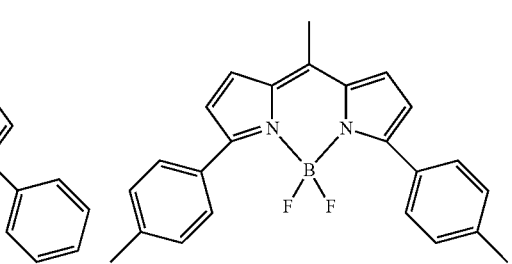

-continued
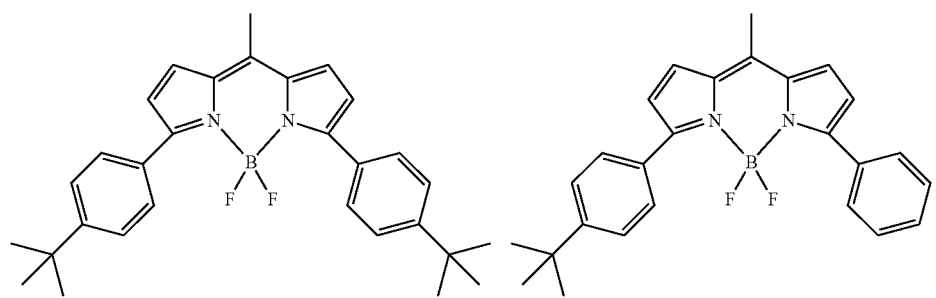
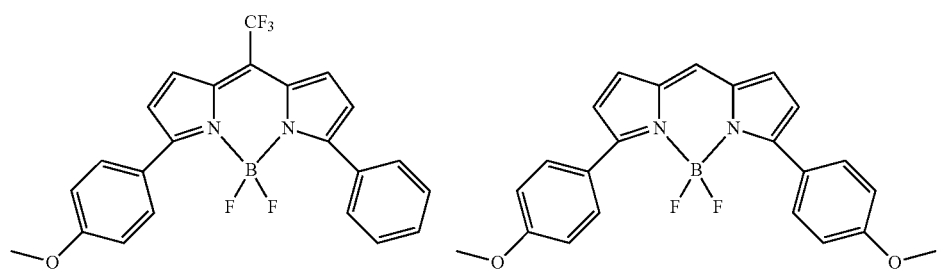
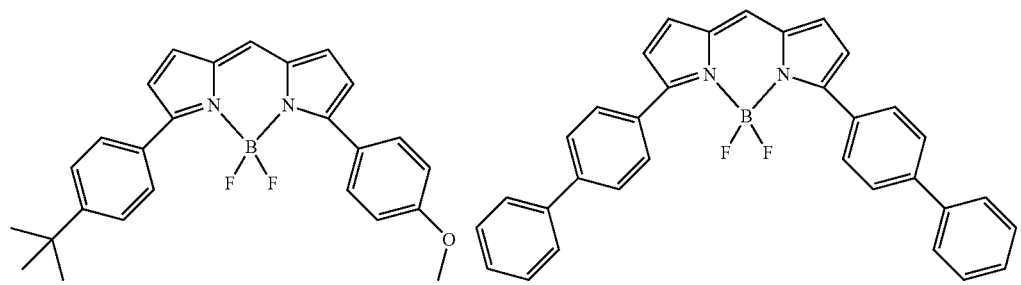
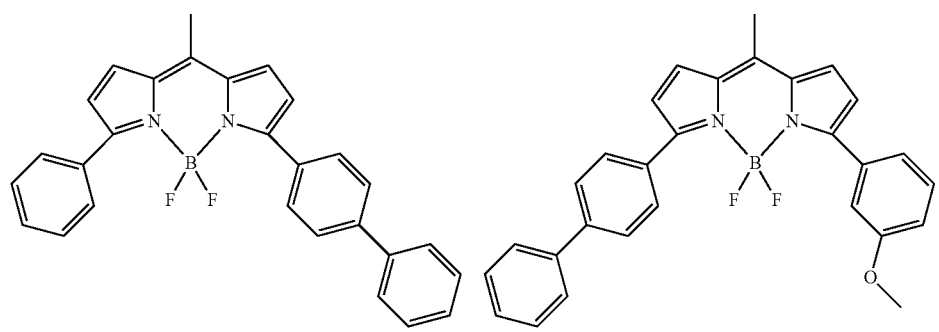
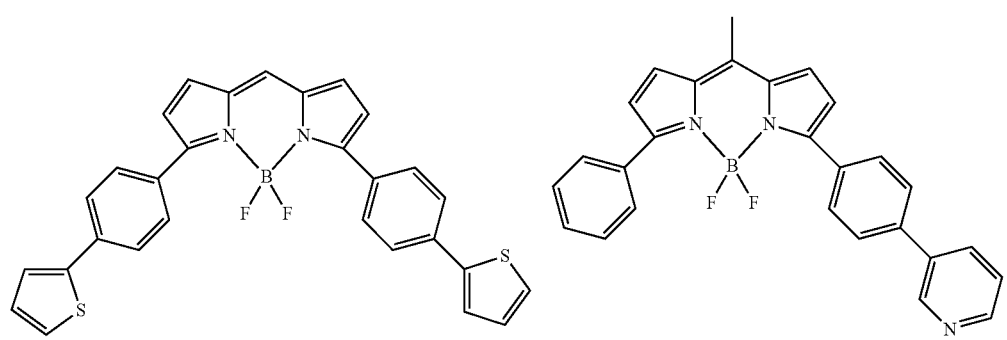

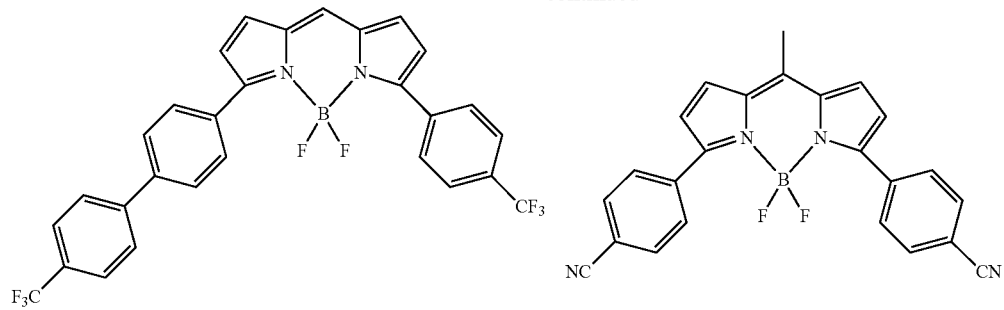
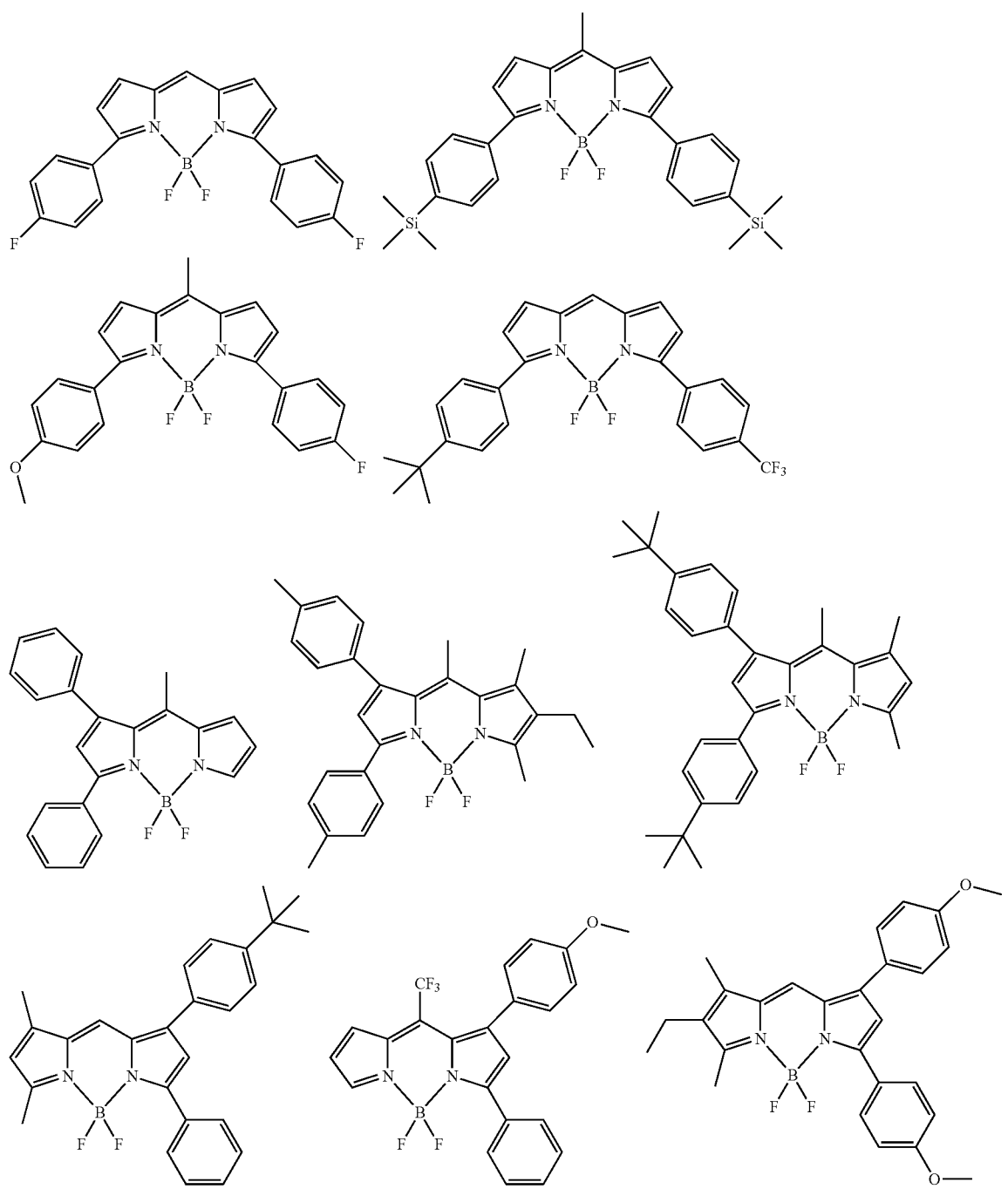

-continued
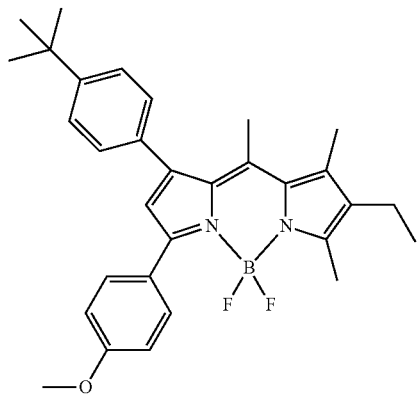
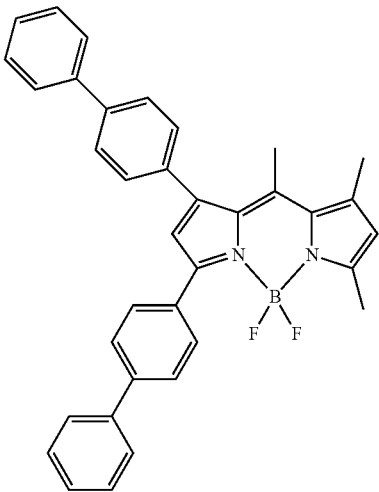
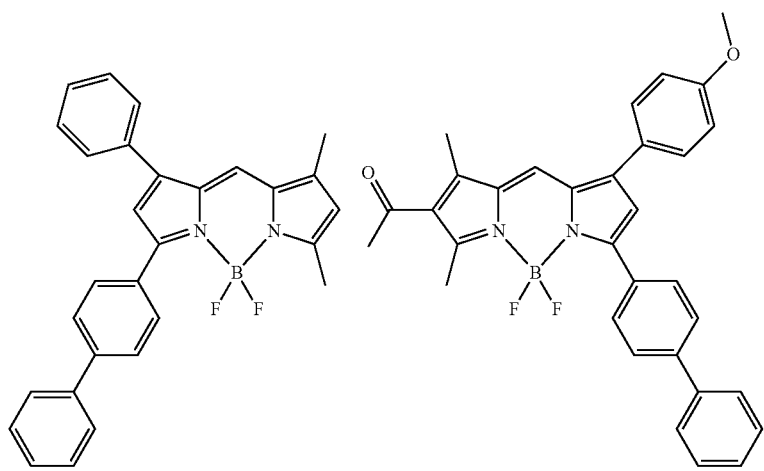
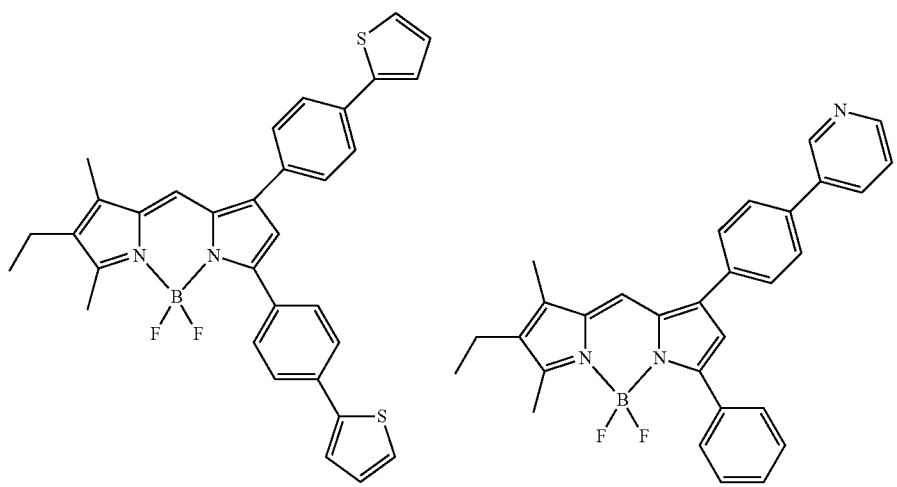

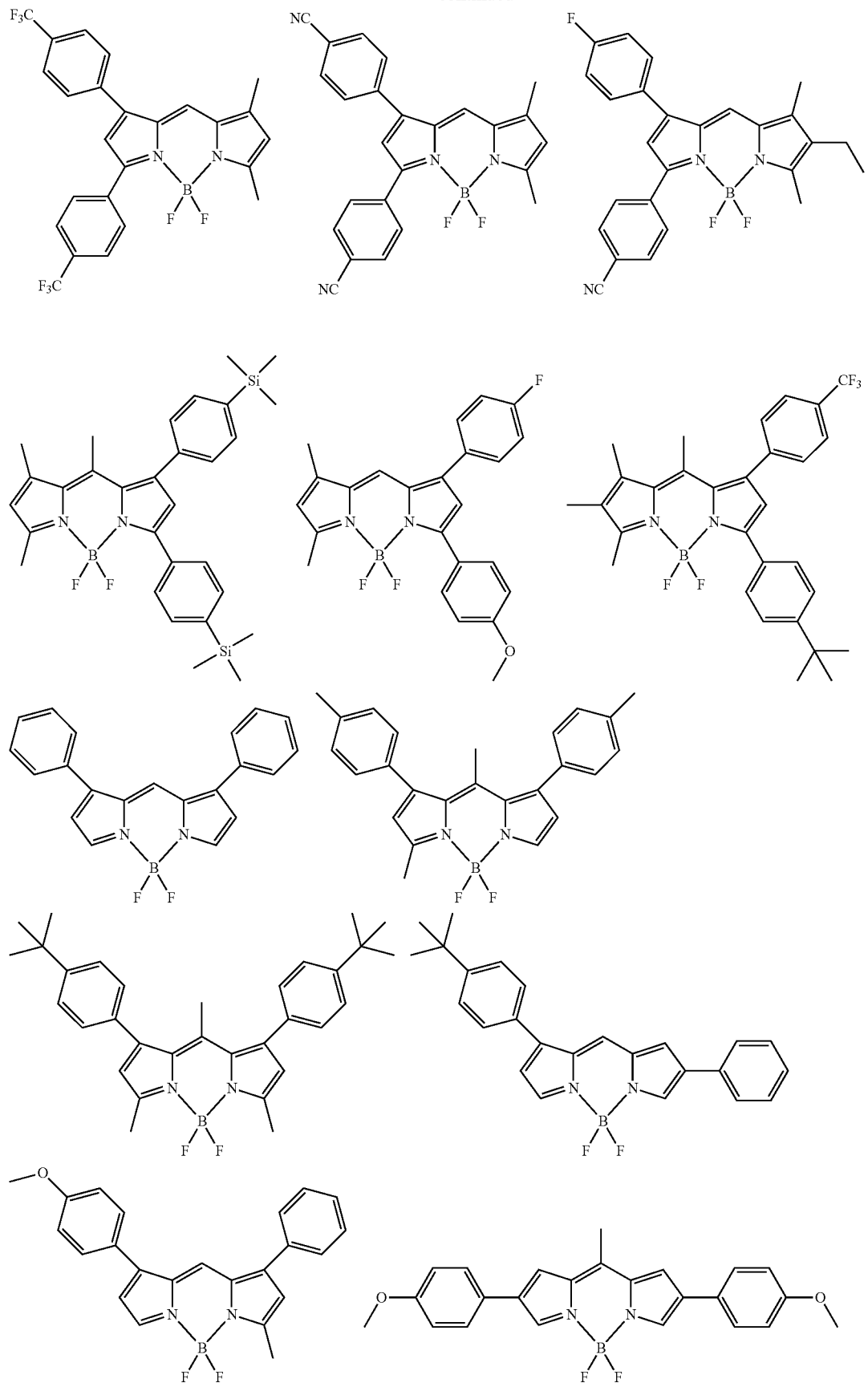

-continued
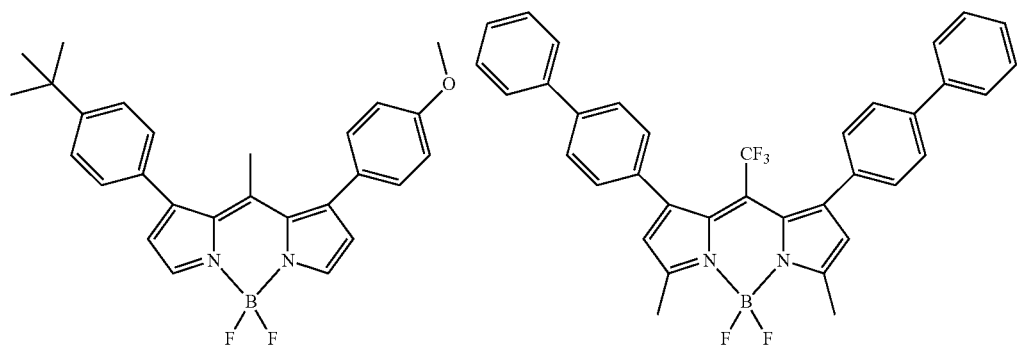
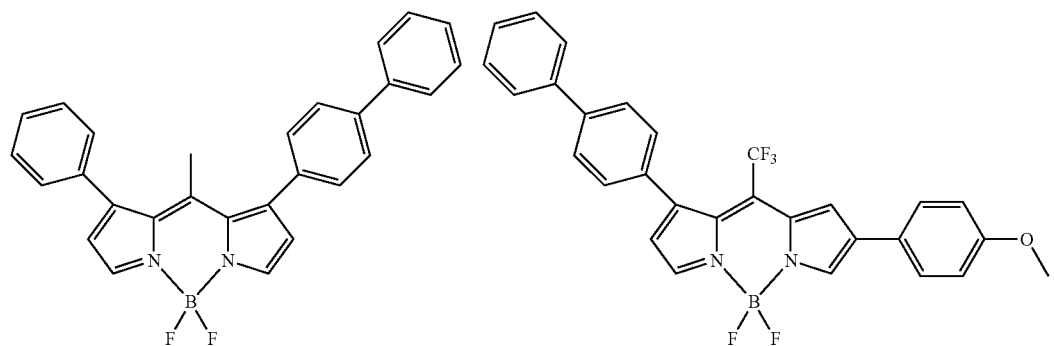
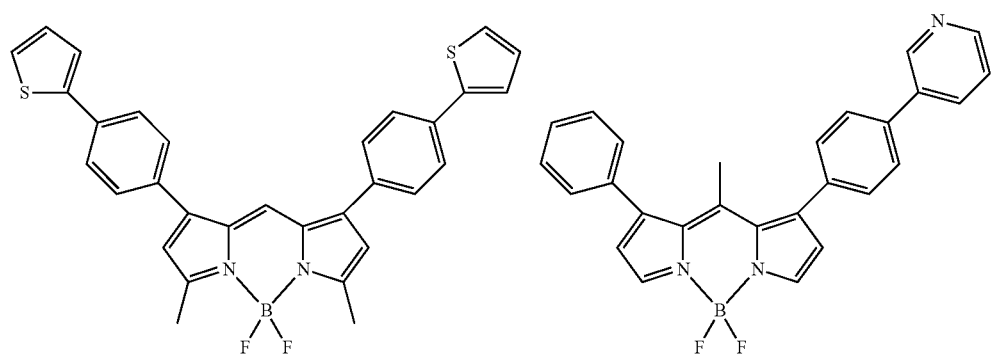
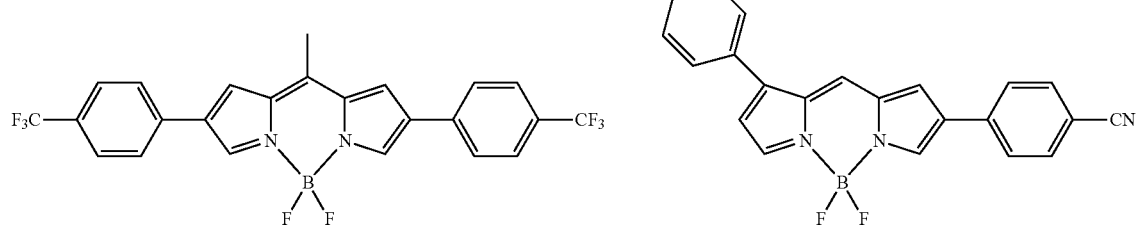
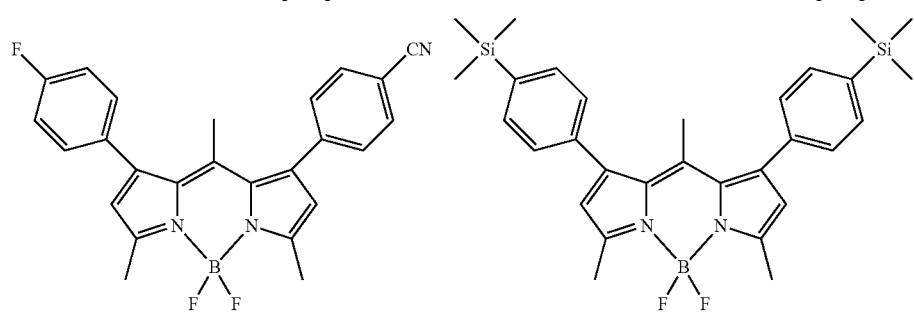

-continued
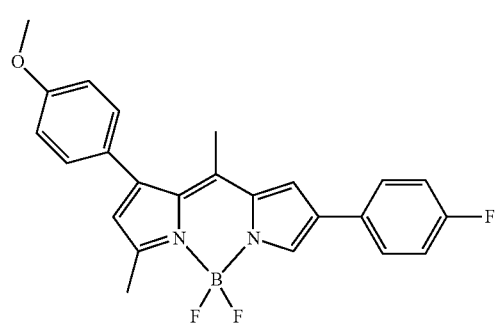
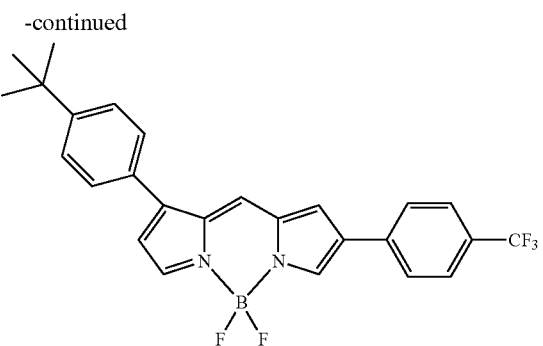
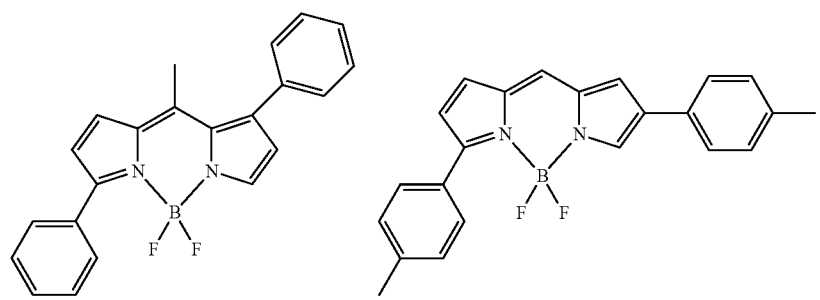
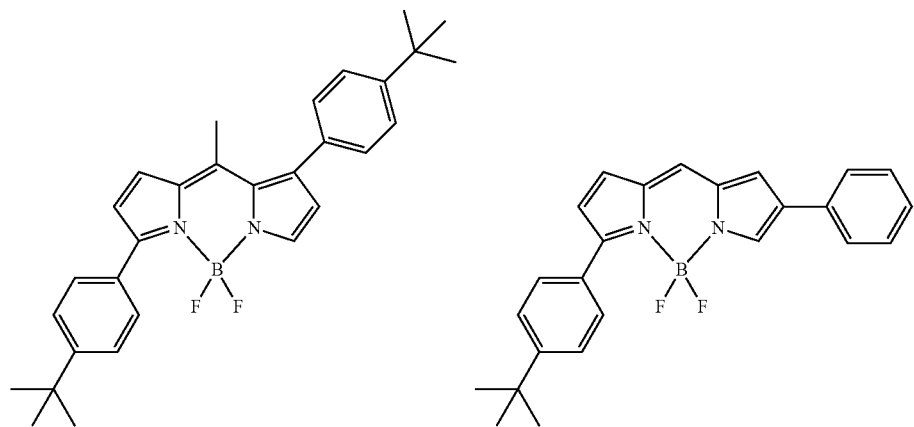
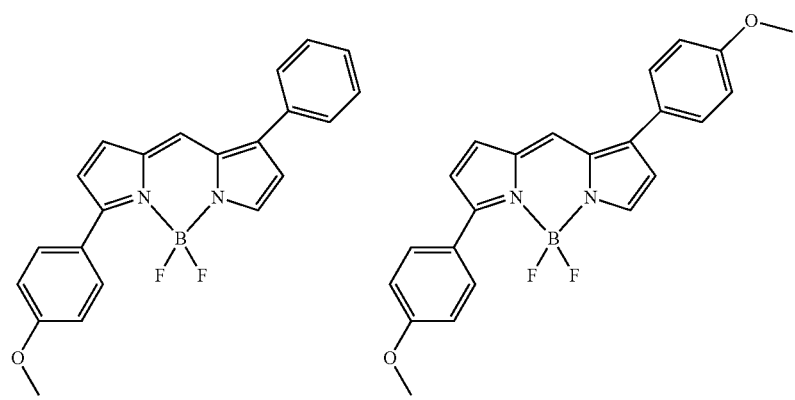

-continued
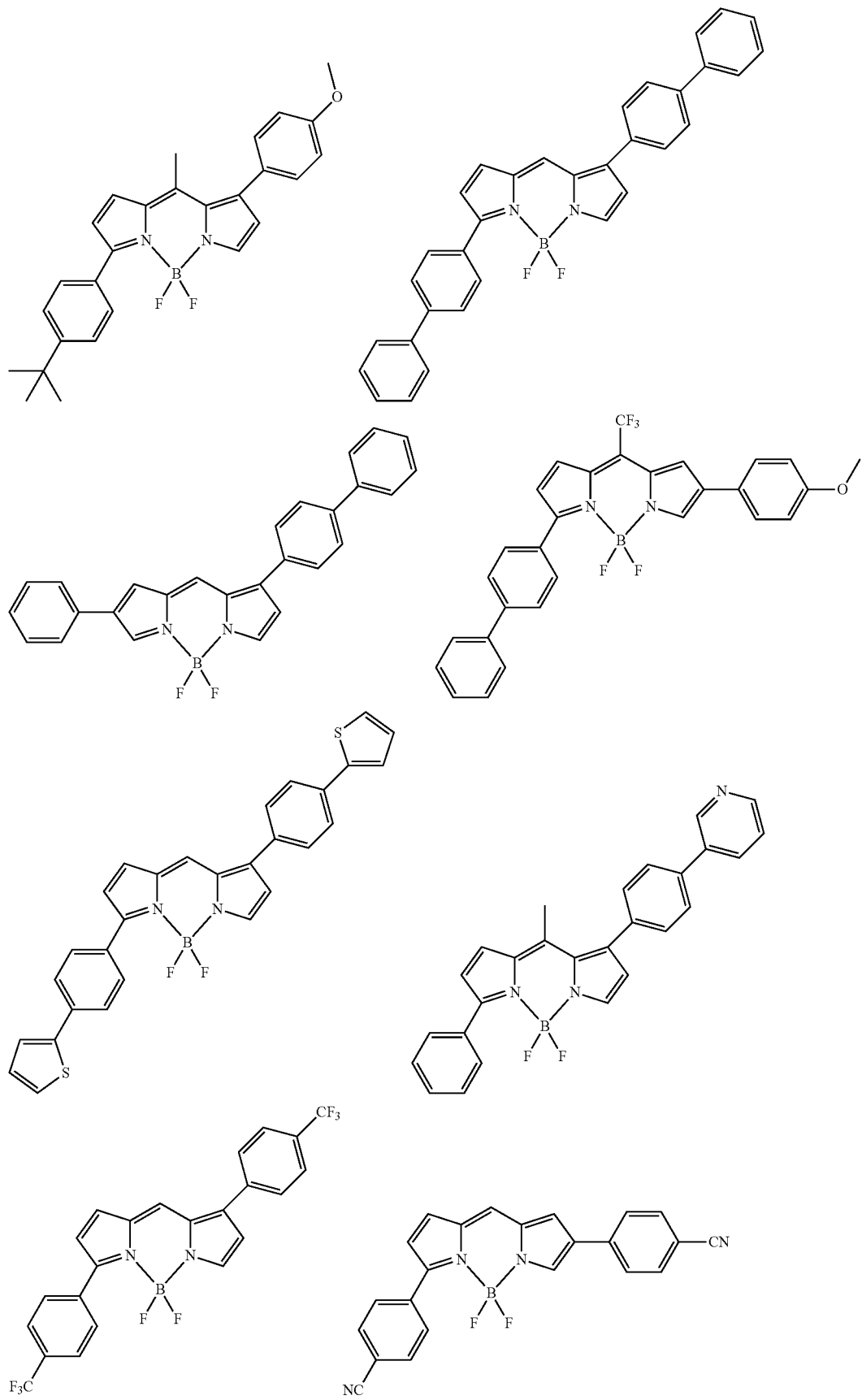

-continued
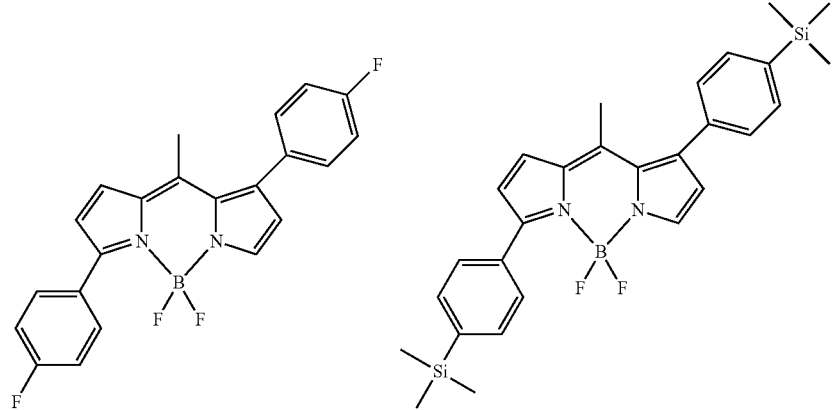
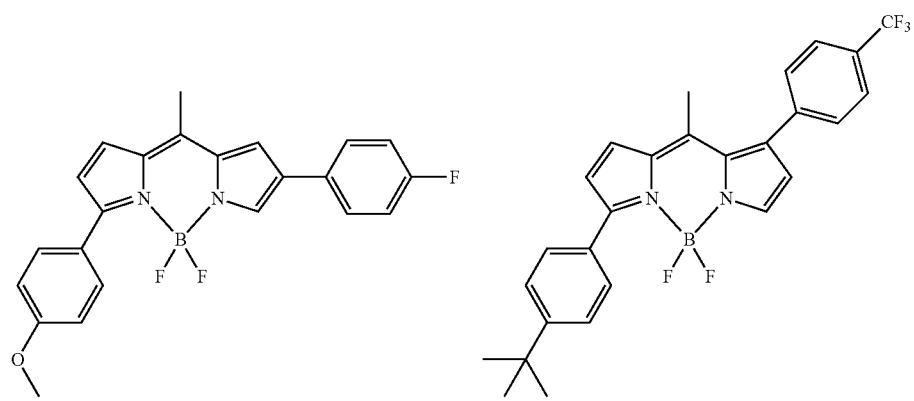
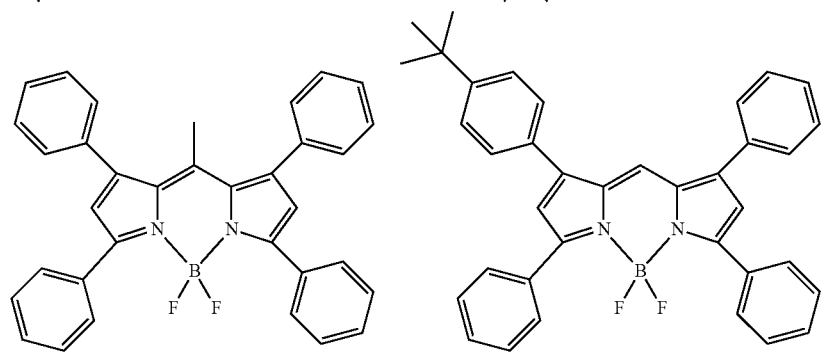
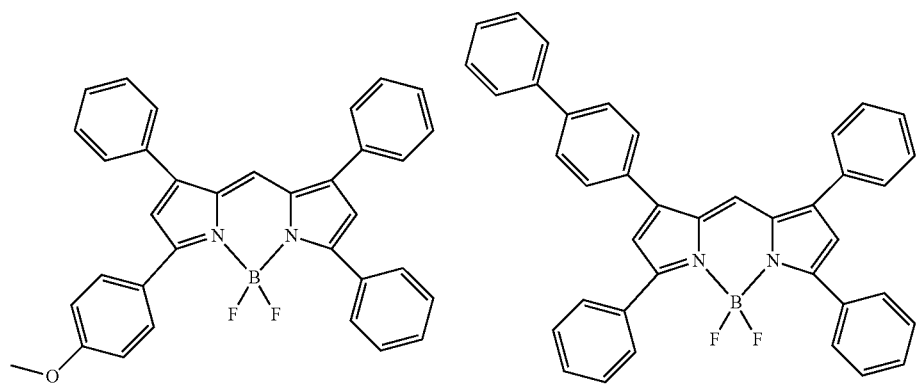

-continued
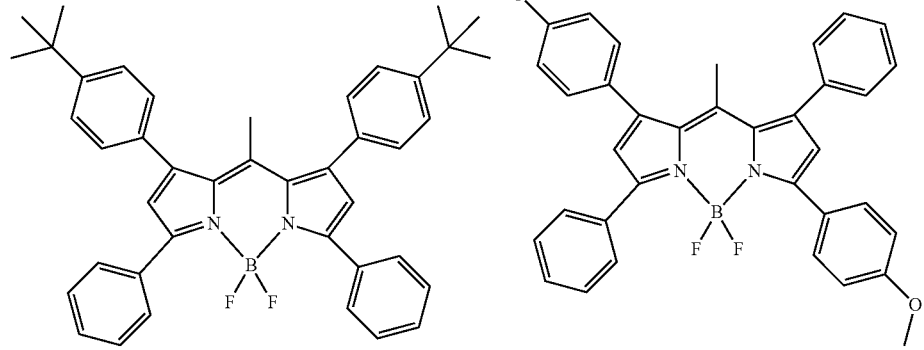
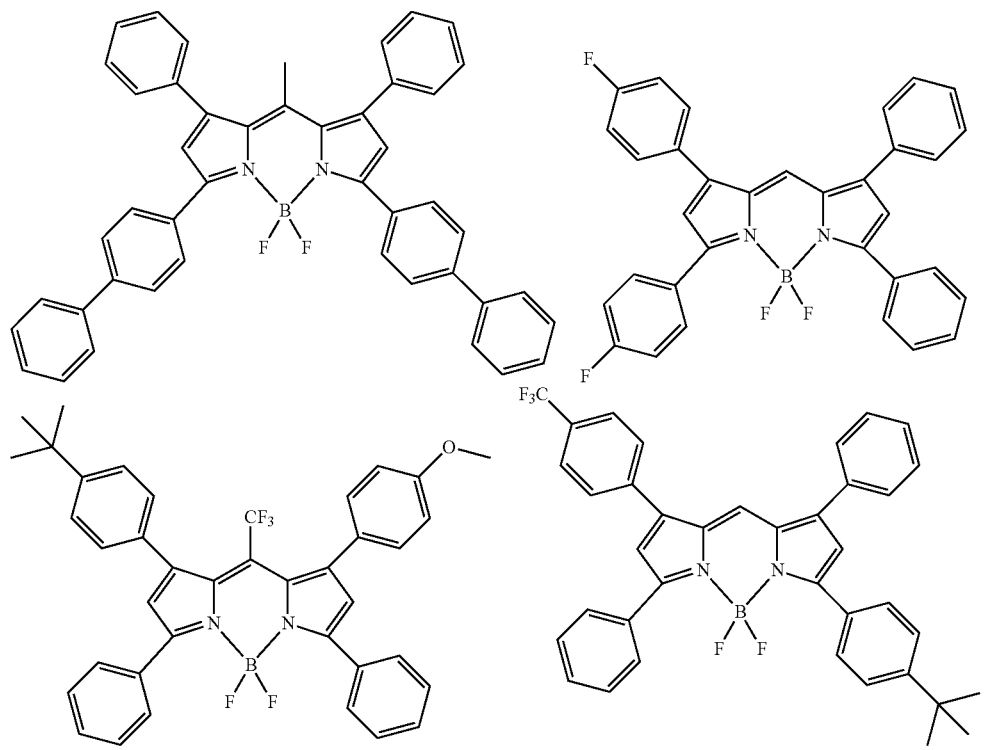
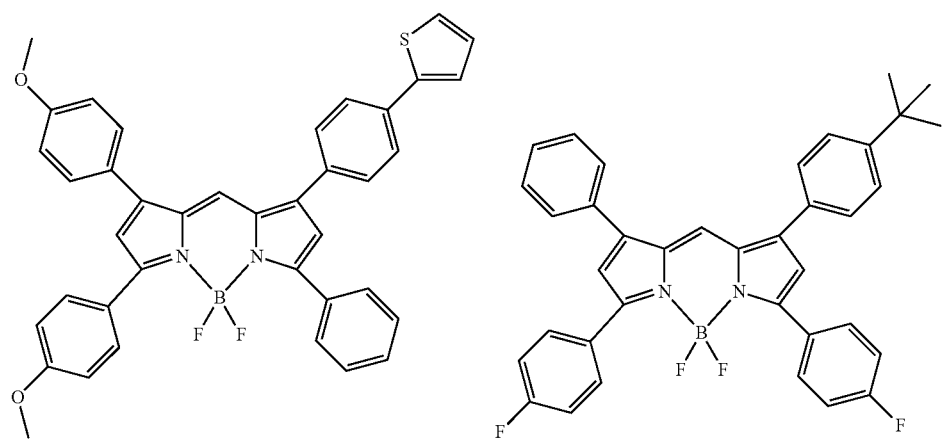

-continued
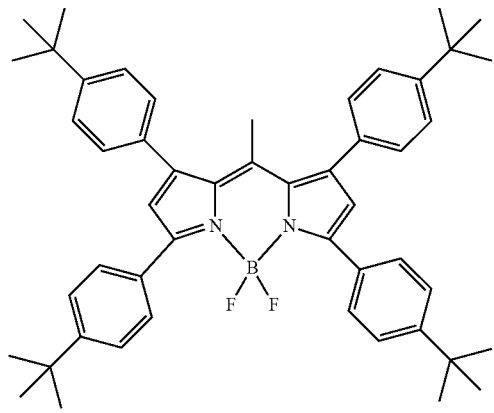
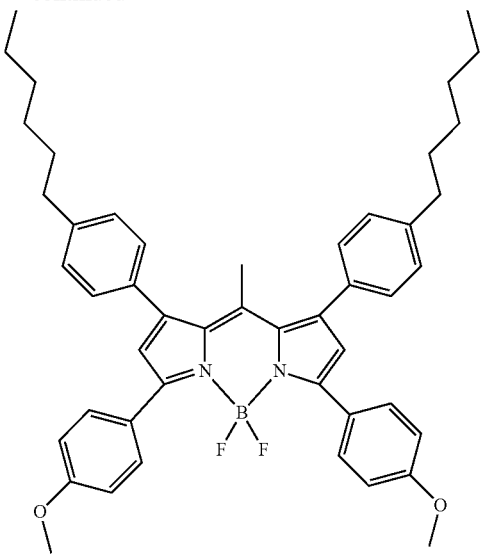
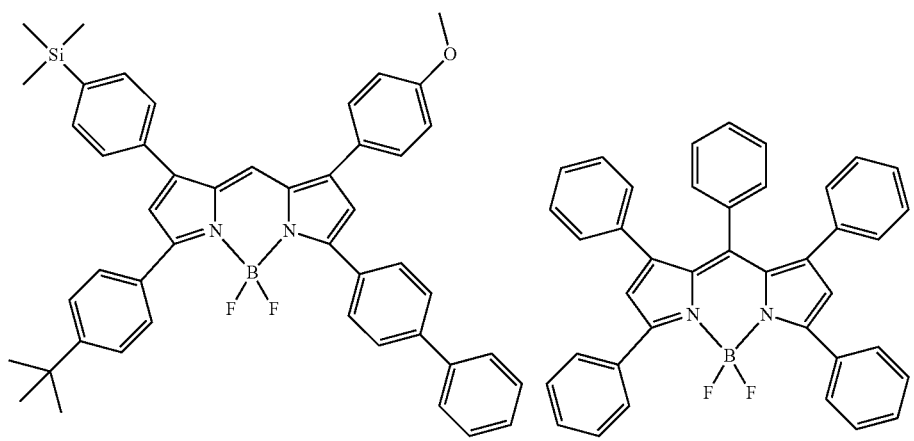
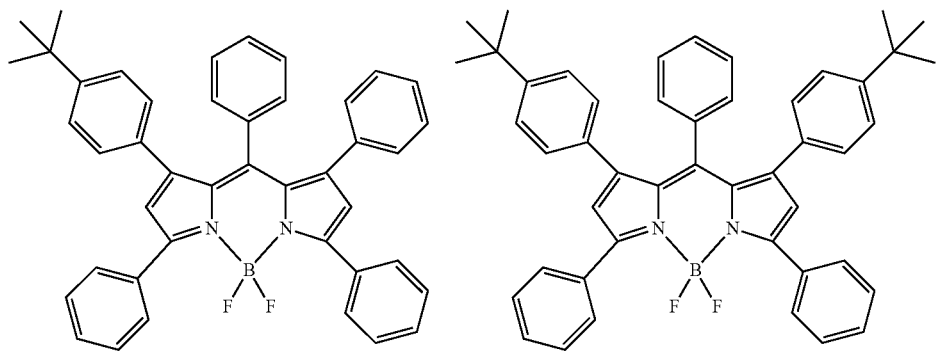

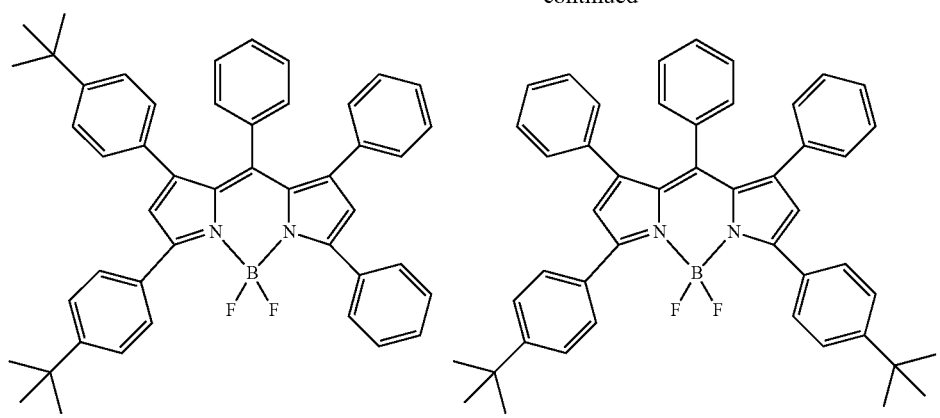
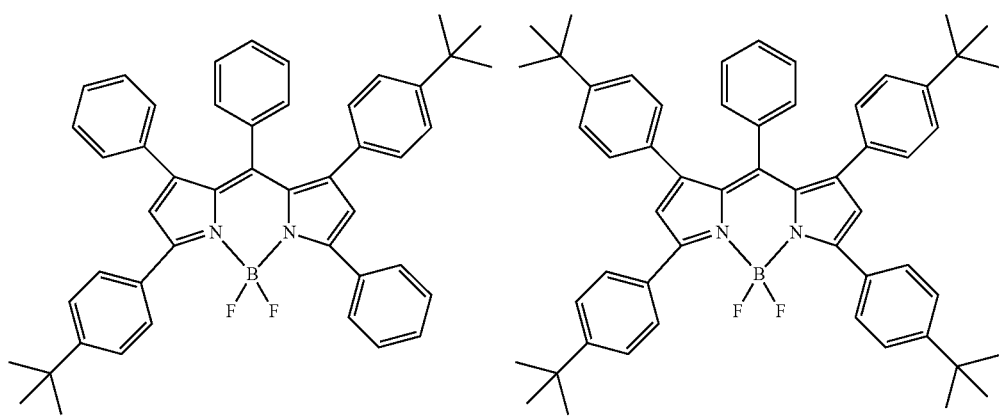
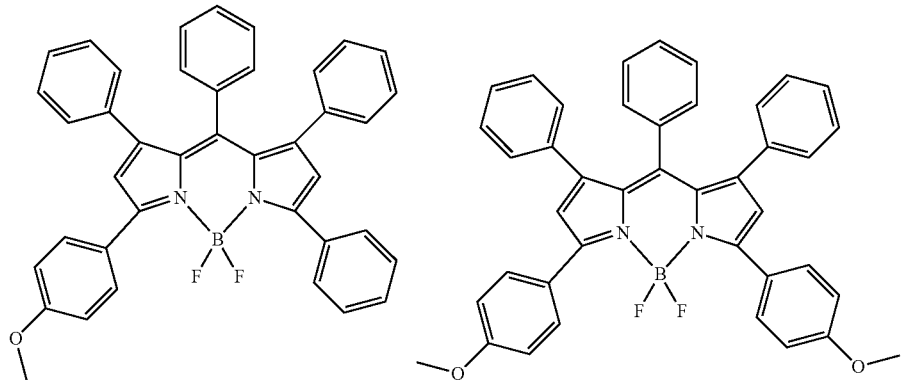
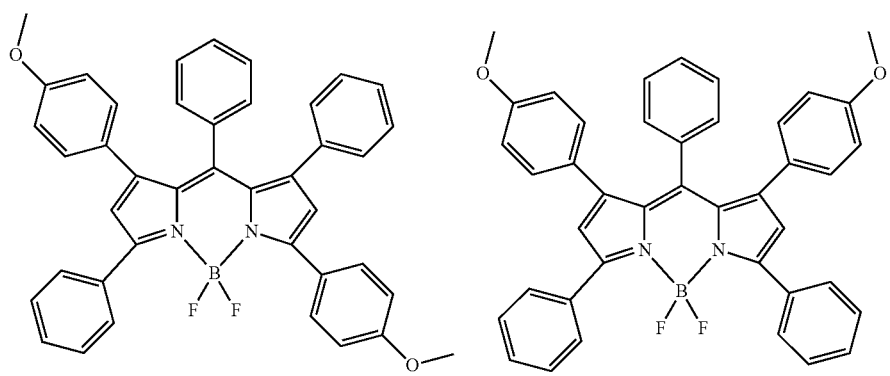

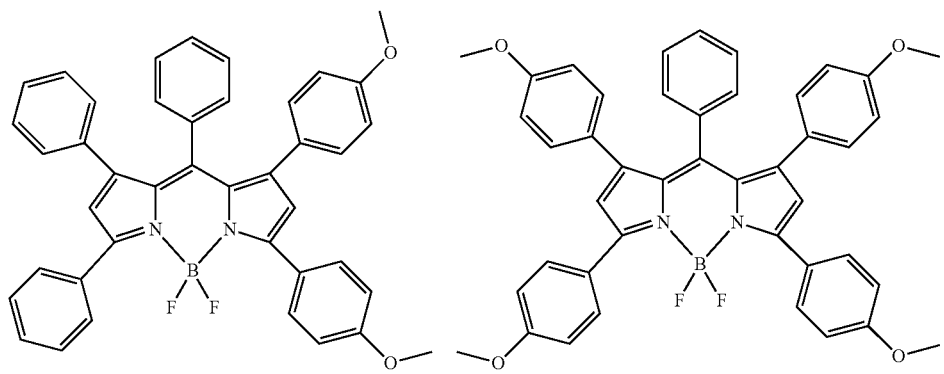
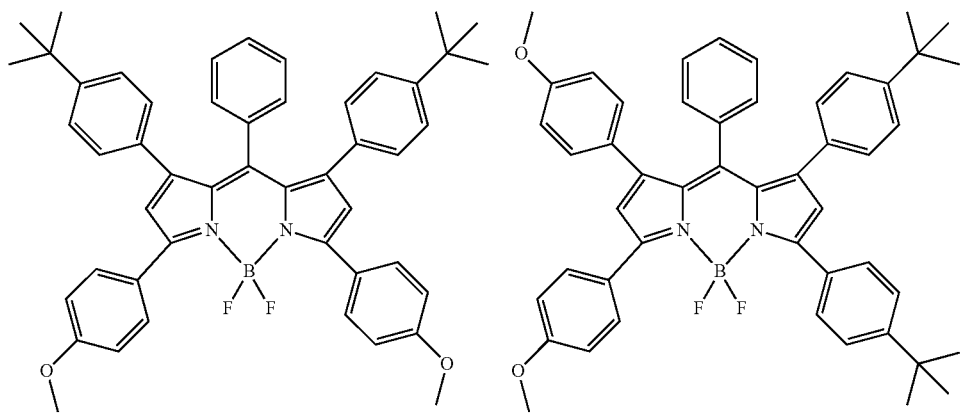
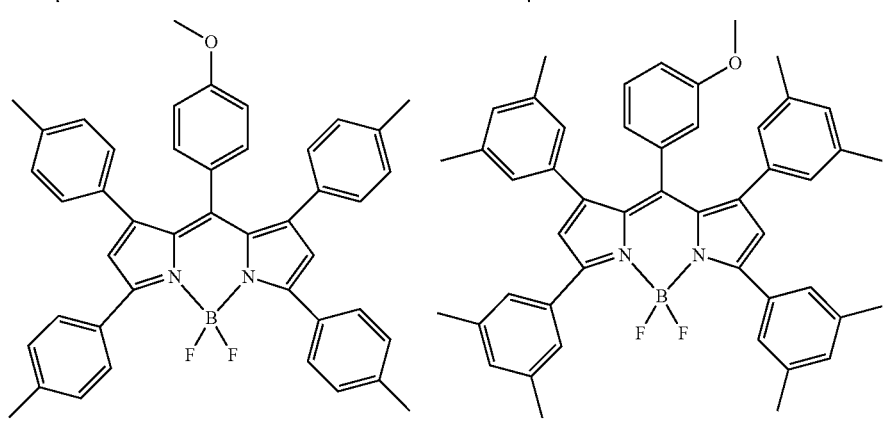
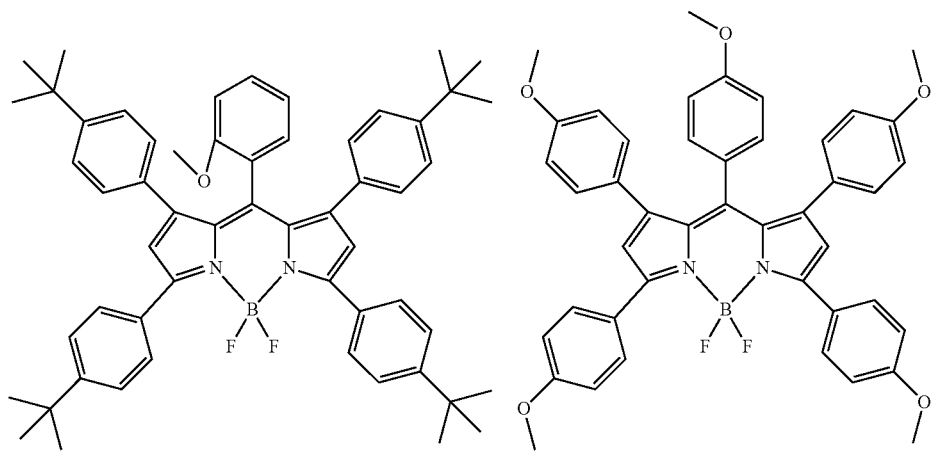

-continued
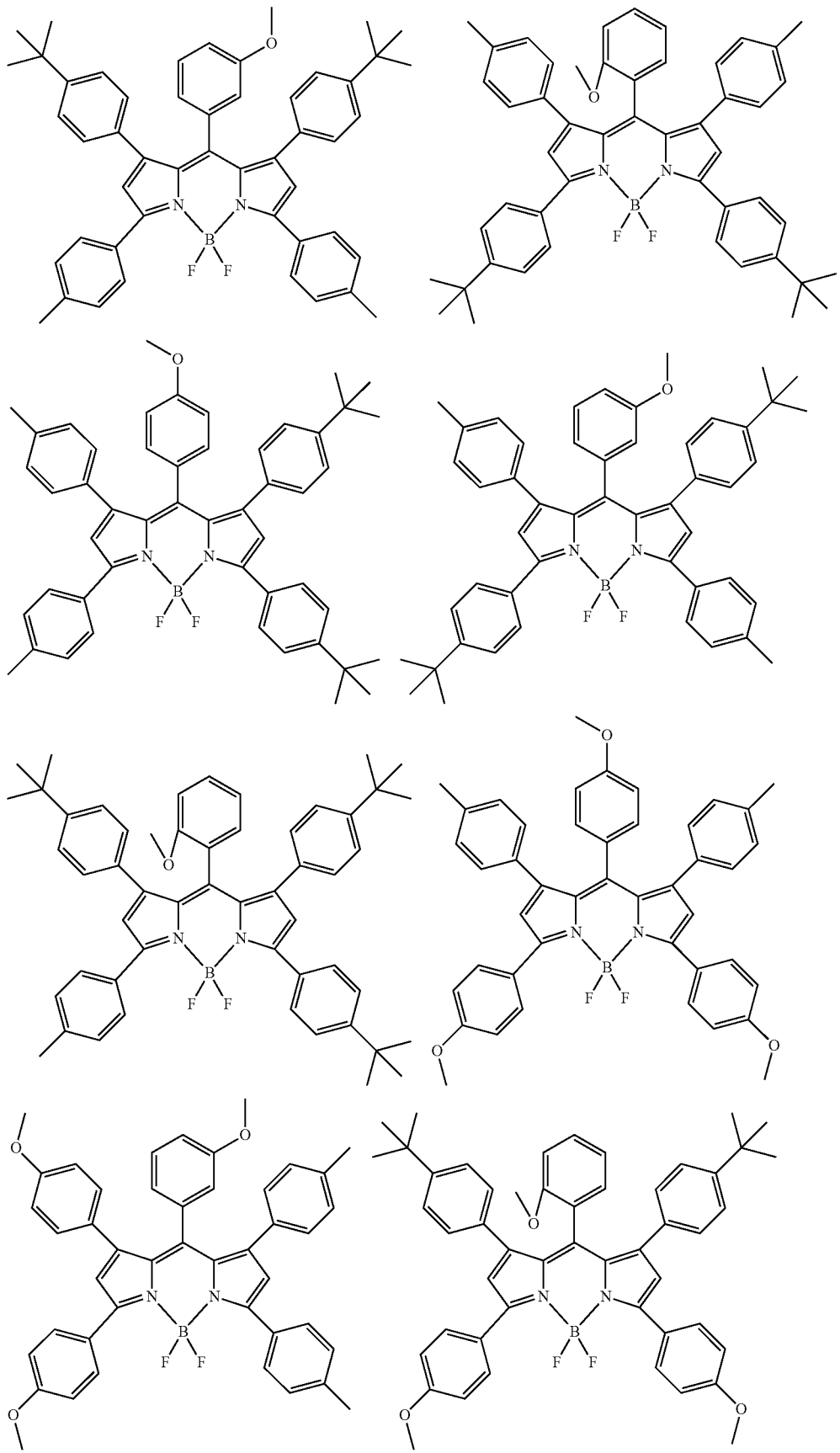

-continued
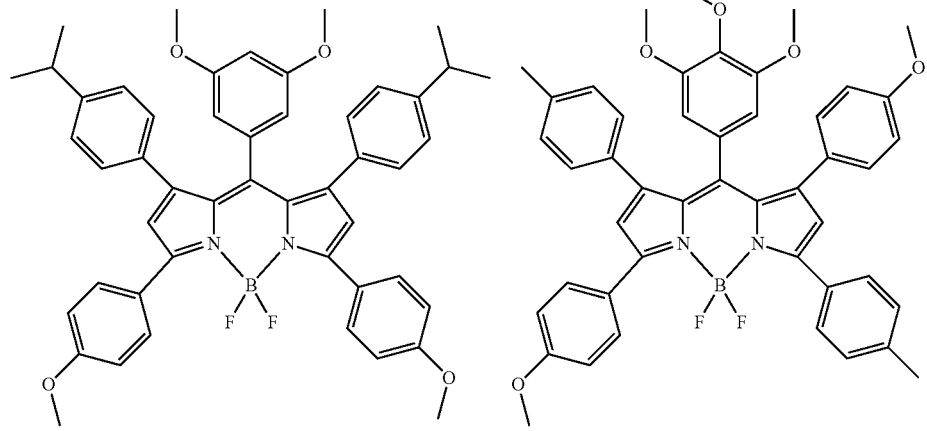
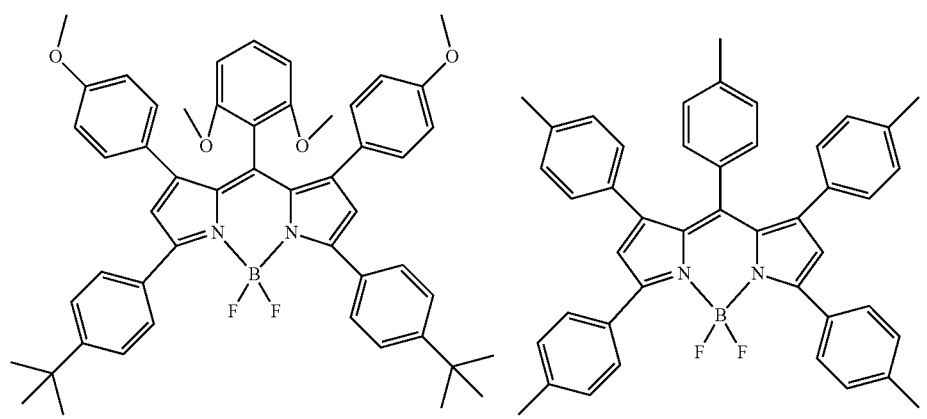
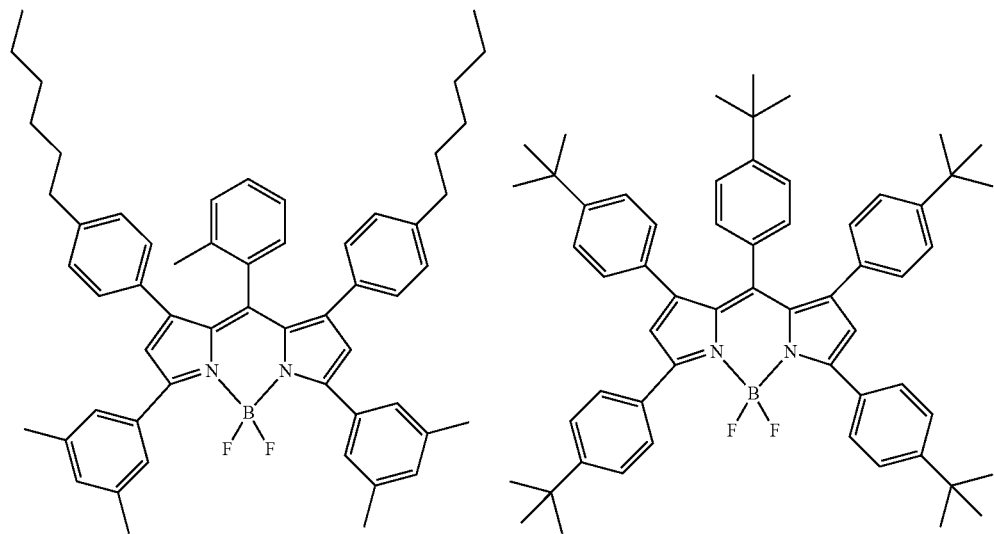

-continued
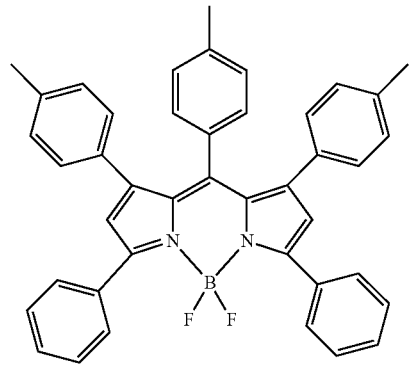
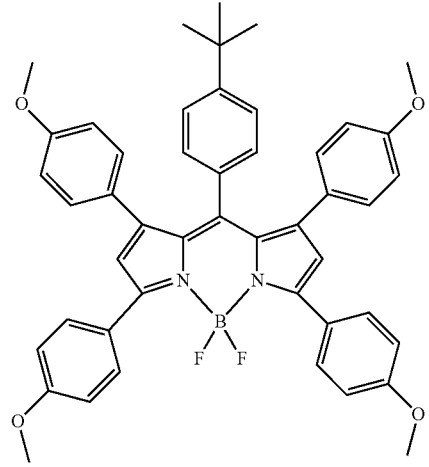
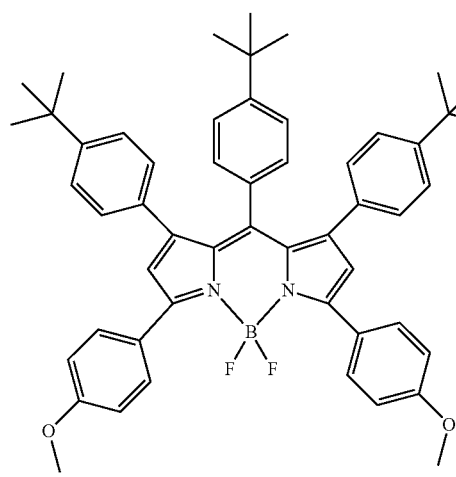
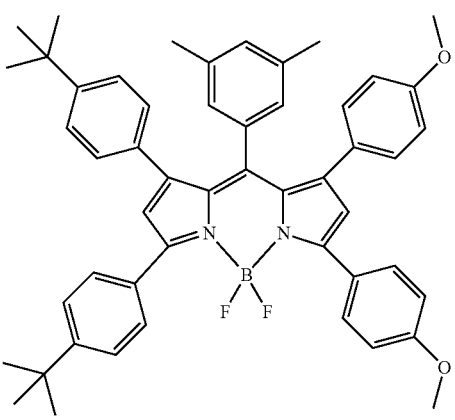
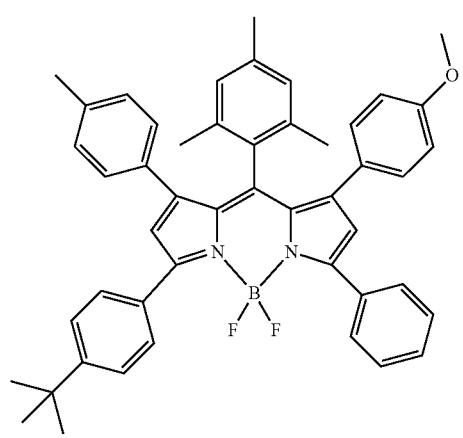
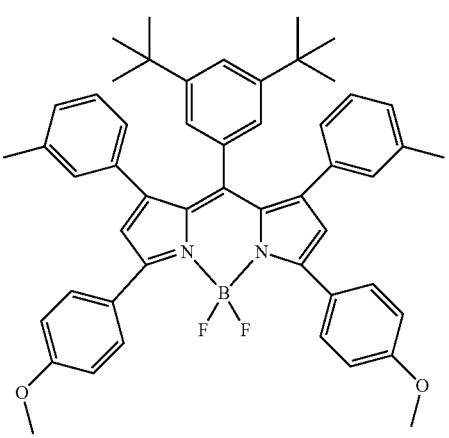

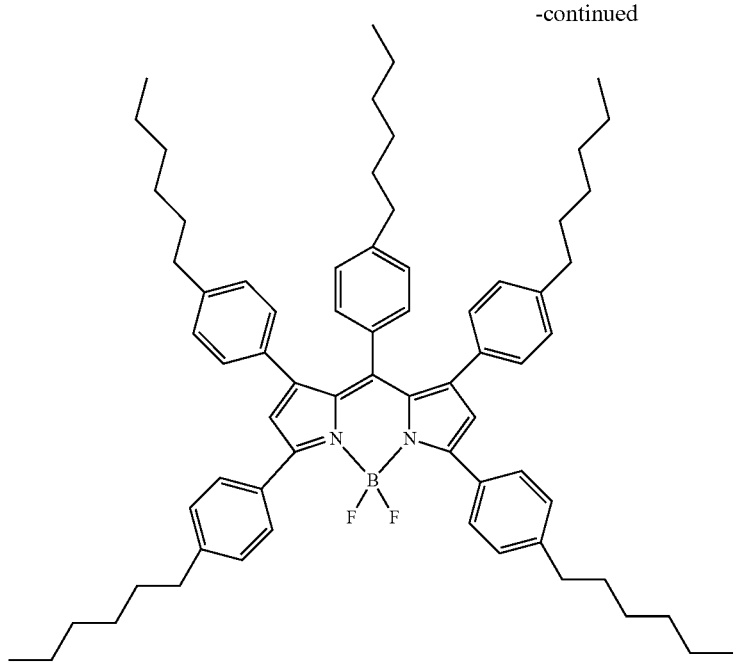
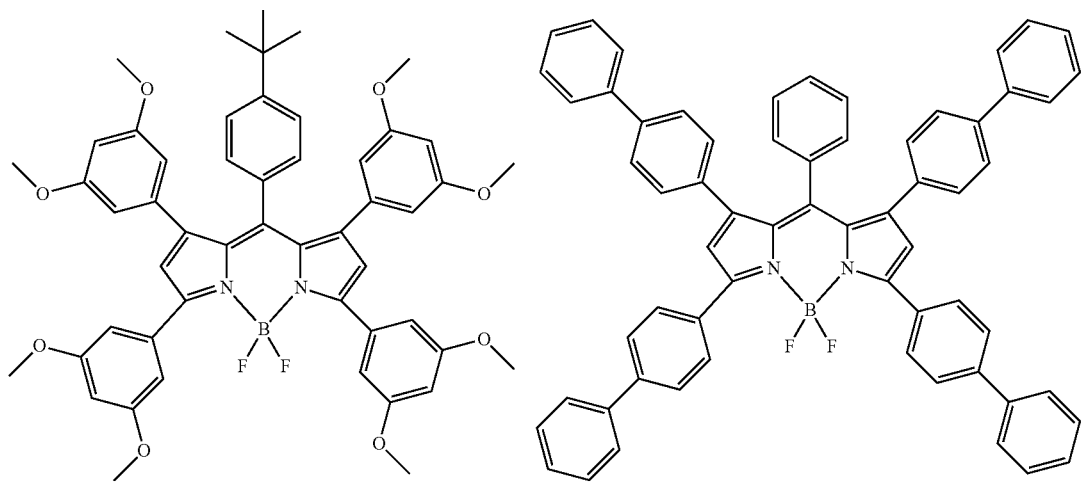
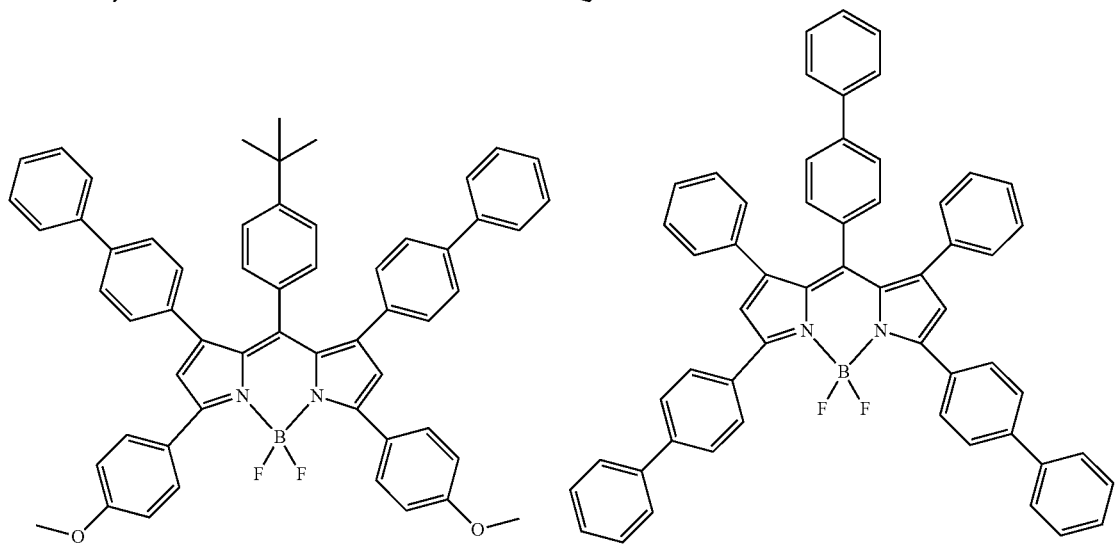

97
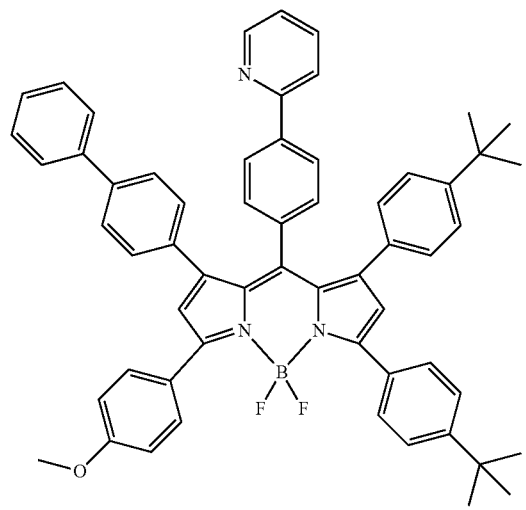
98
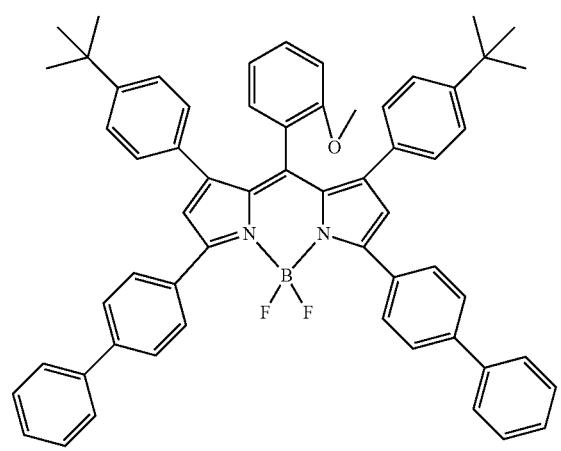
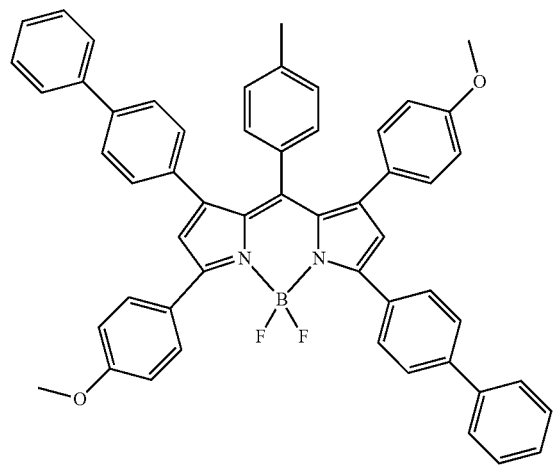
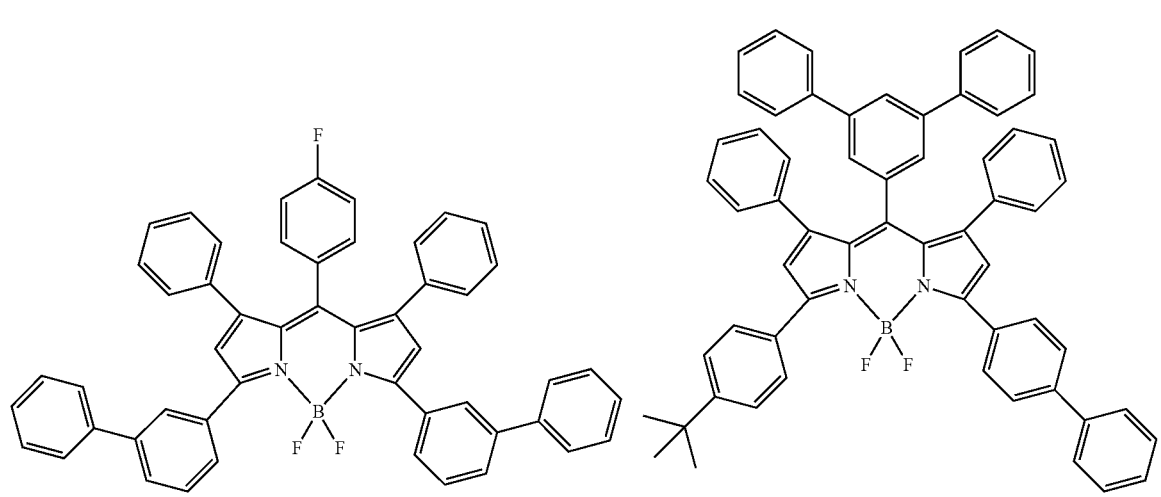

-continued
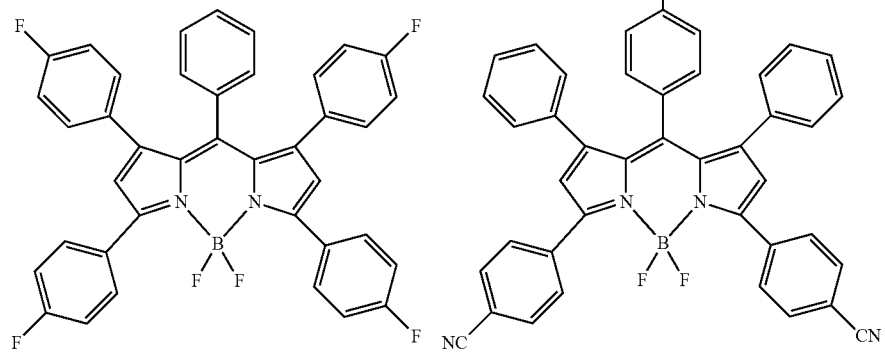
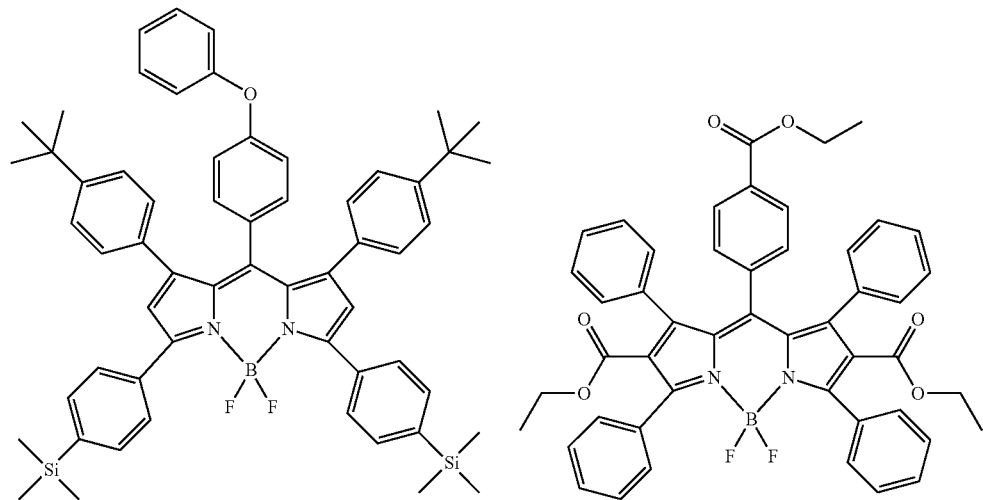
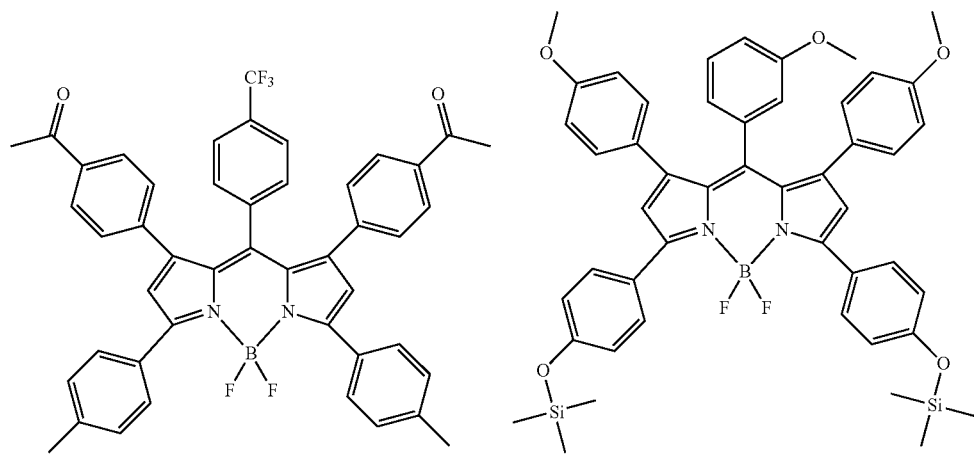

101 102
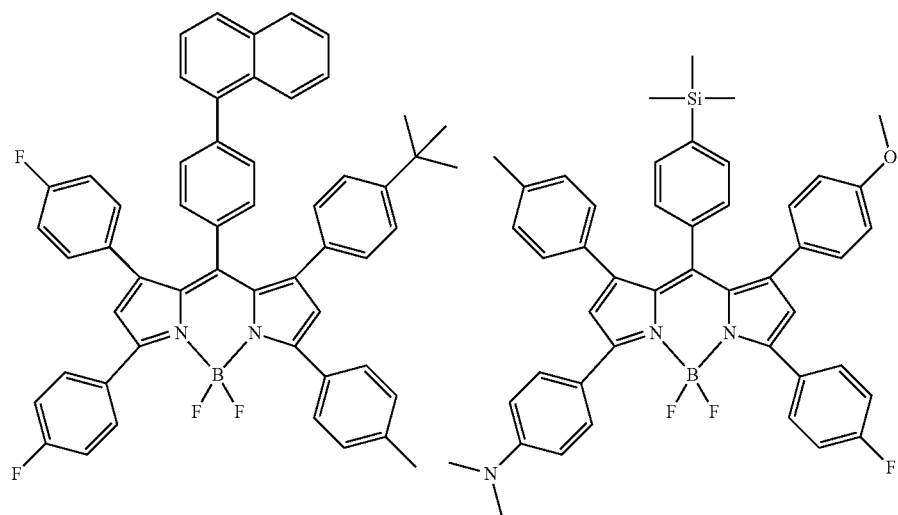
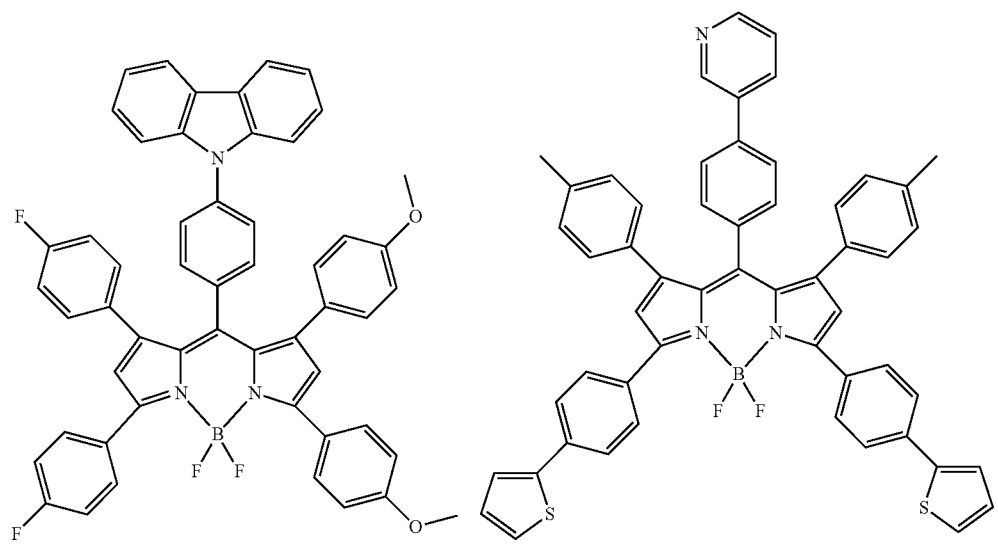
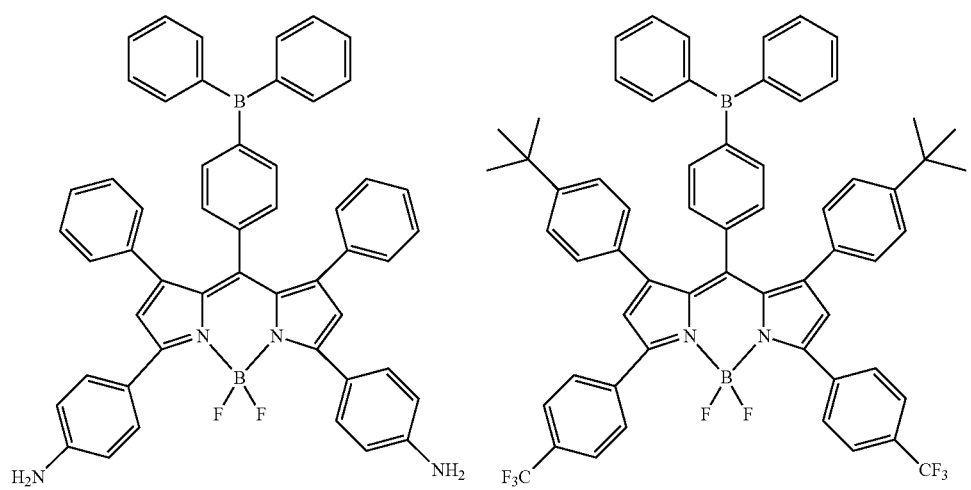

-continued
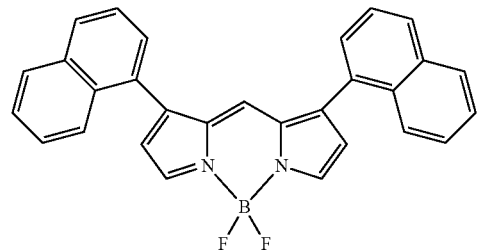
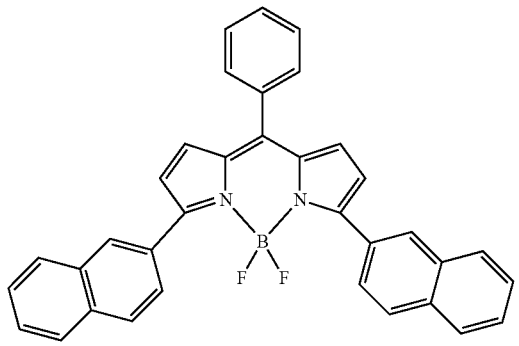
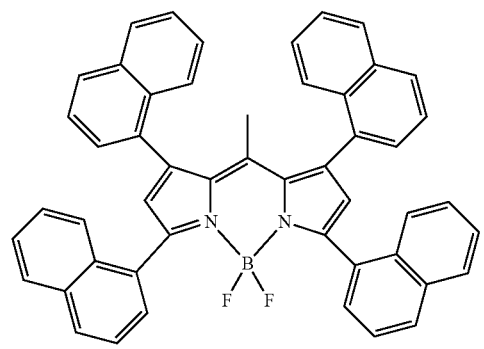
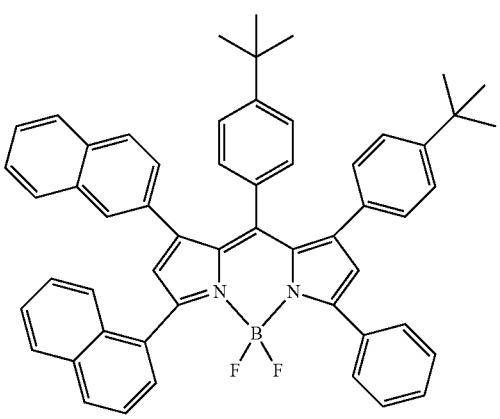
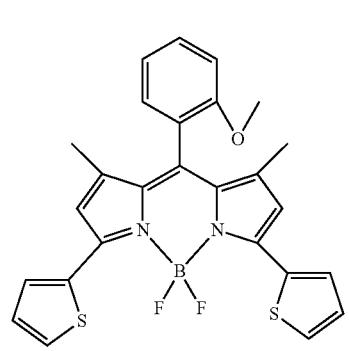
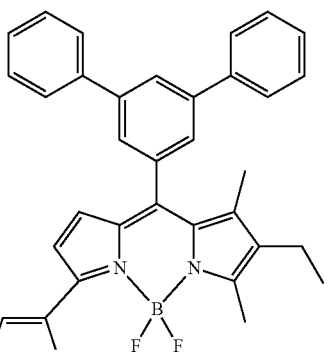
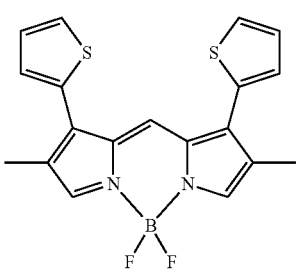
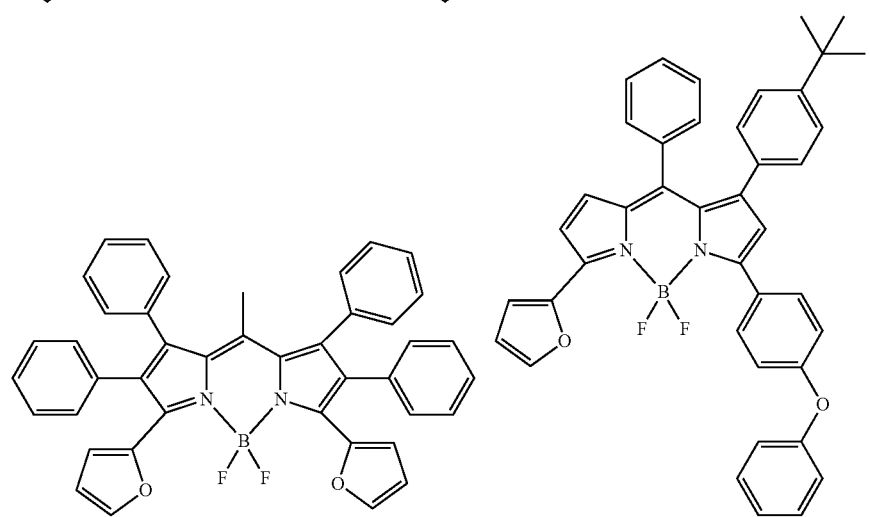

-continued
| 105 | 106 |
|---|---|
| 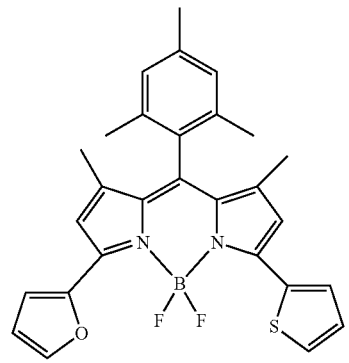 | 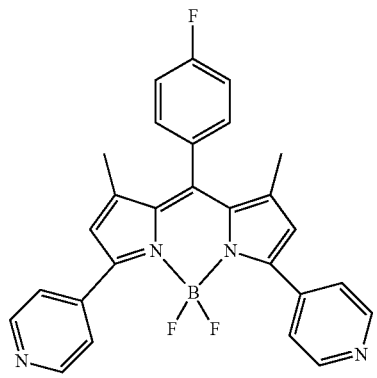 |
| 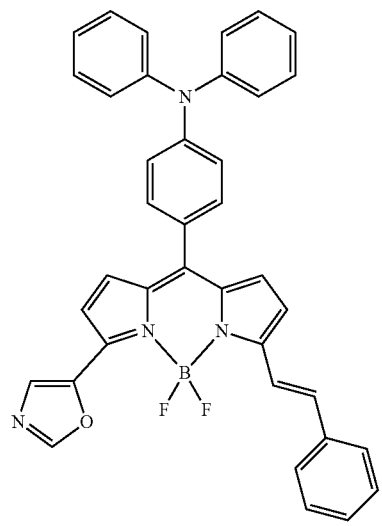 | |
| 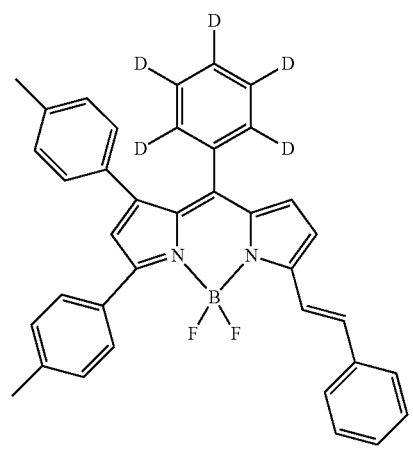 | 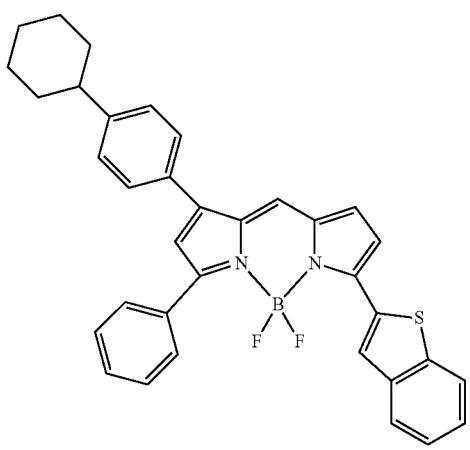 |
| 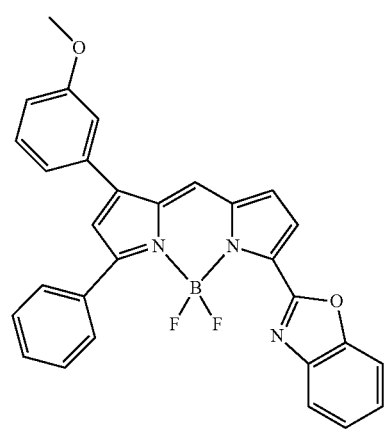 | 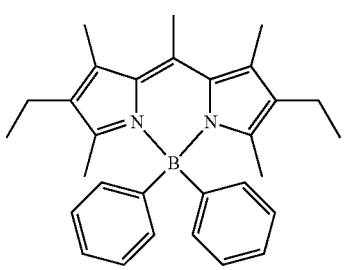 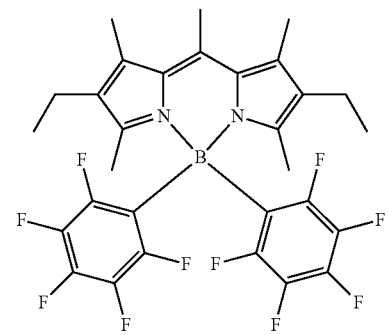 |

-continued
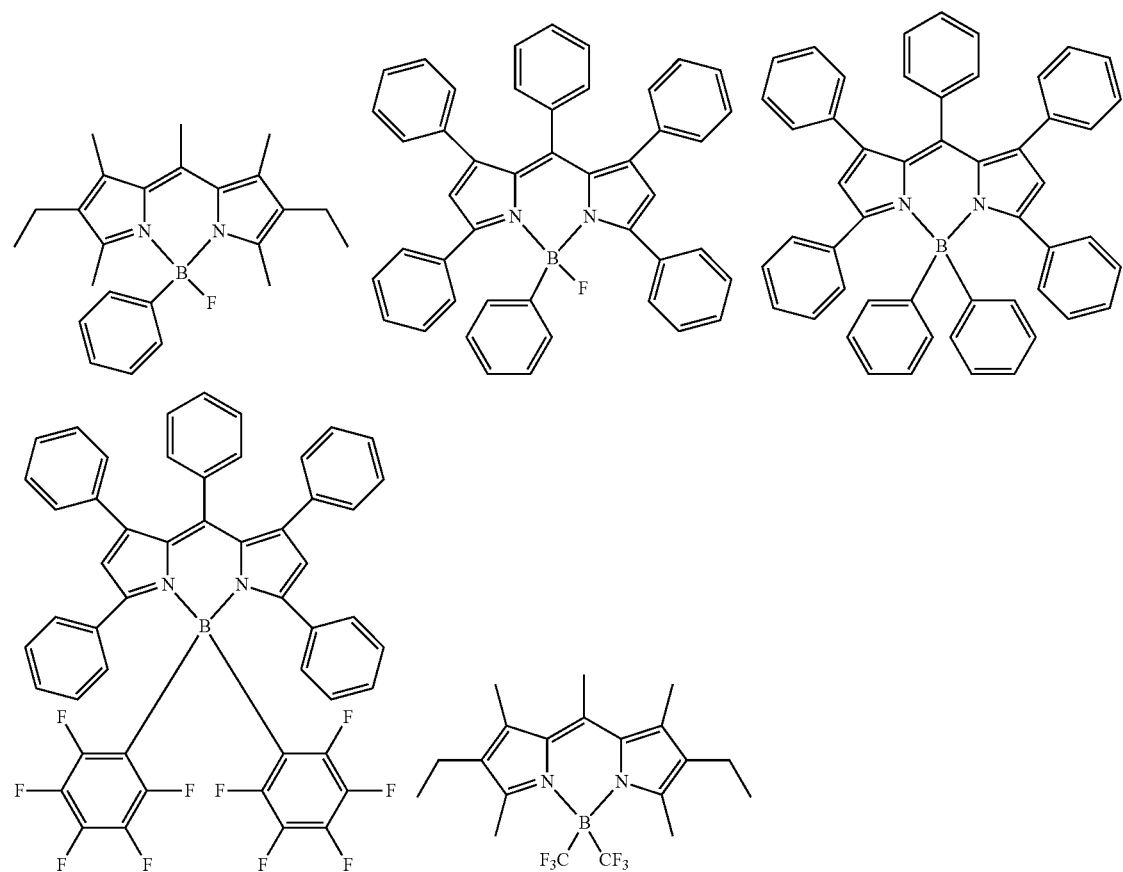
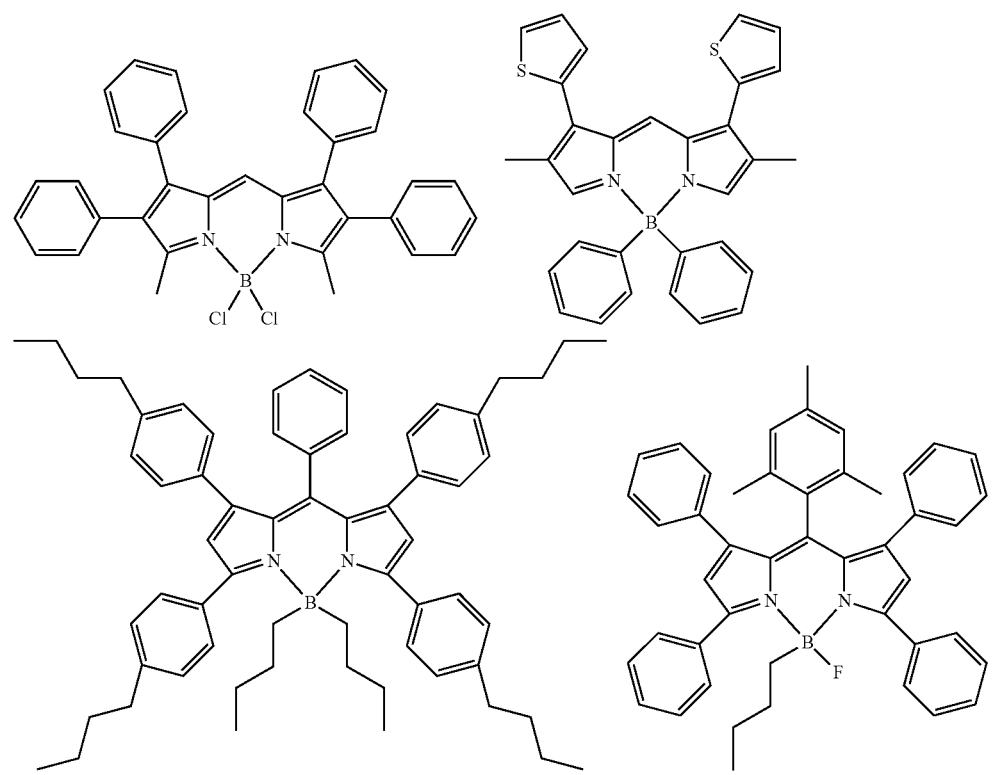

-continued
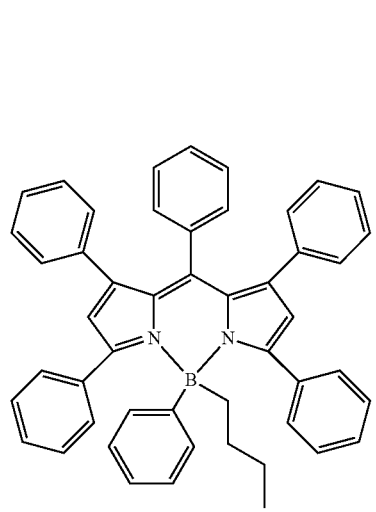
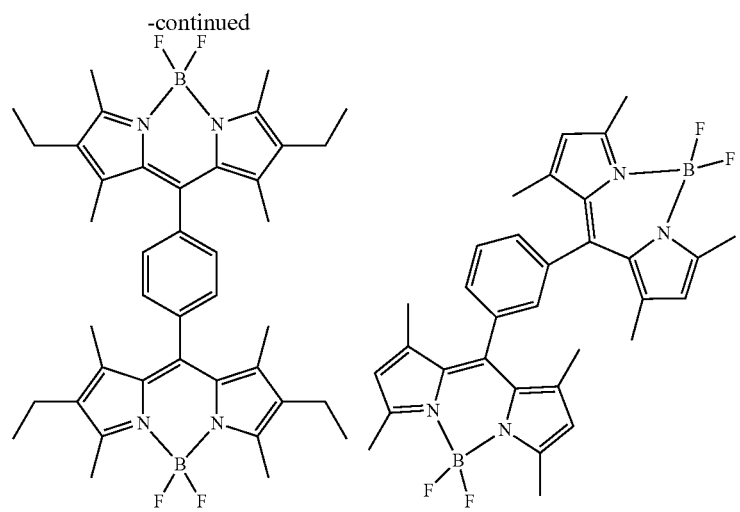
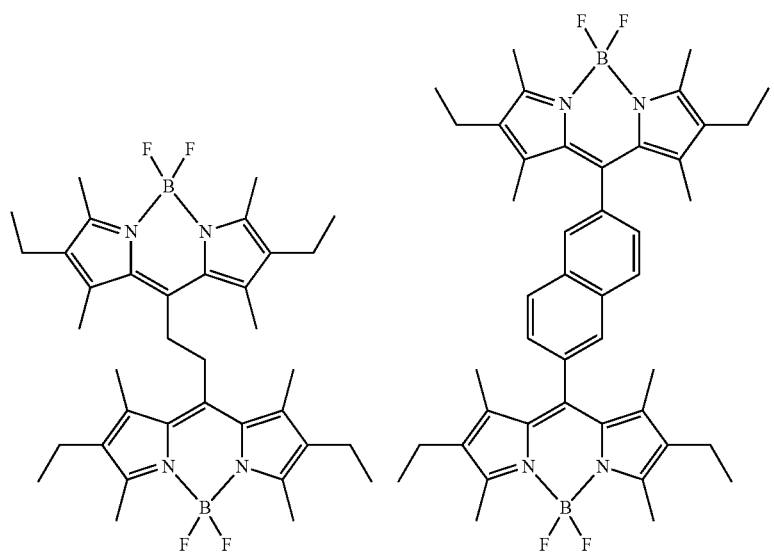
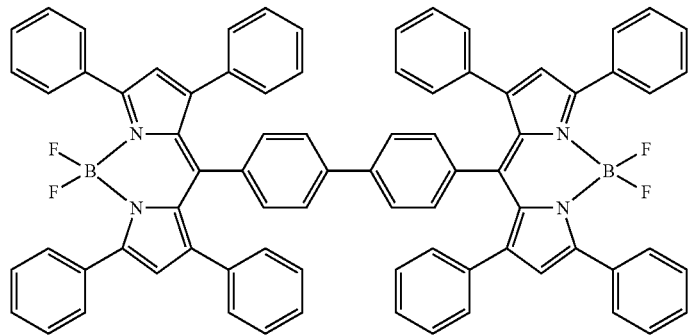
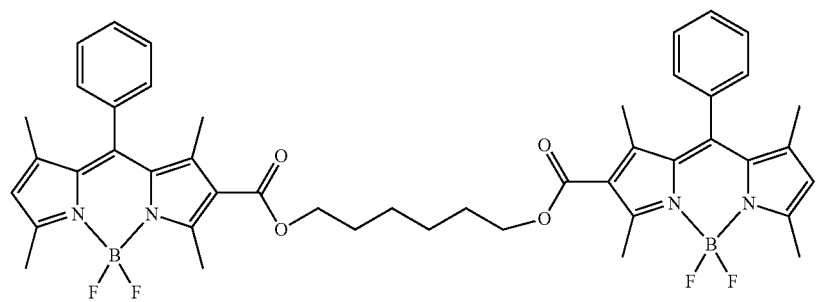

-continued
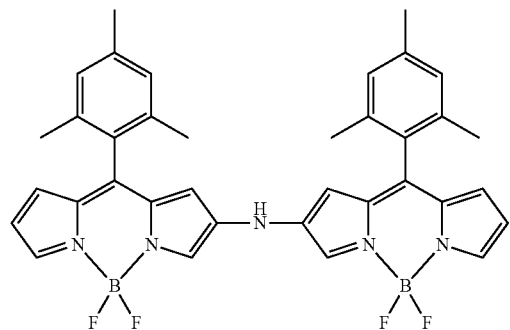
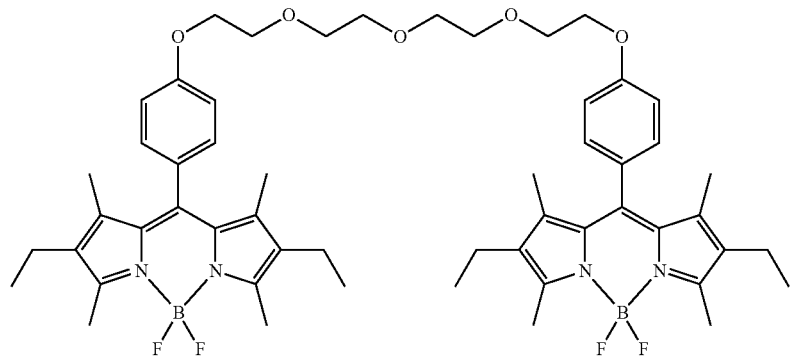
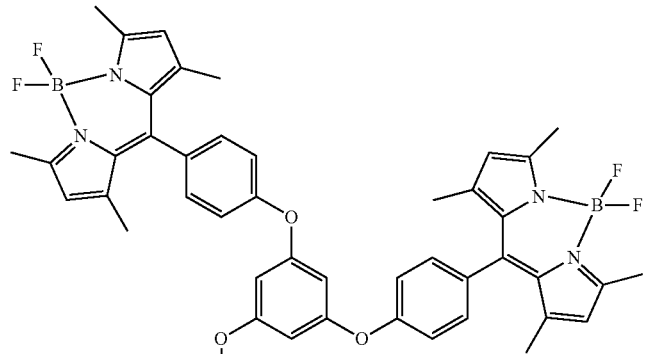
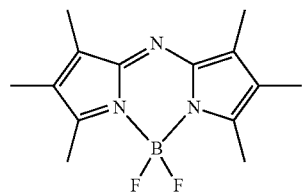
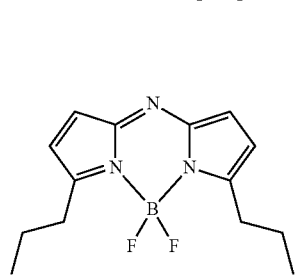
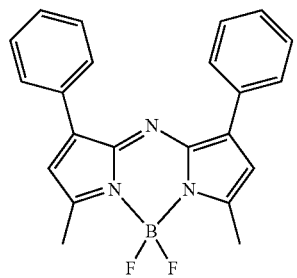
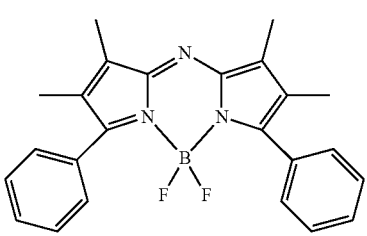

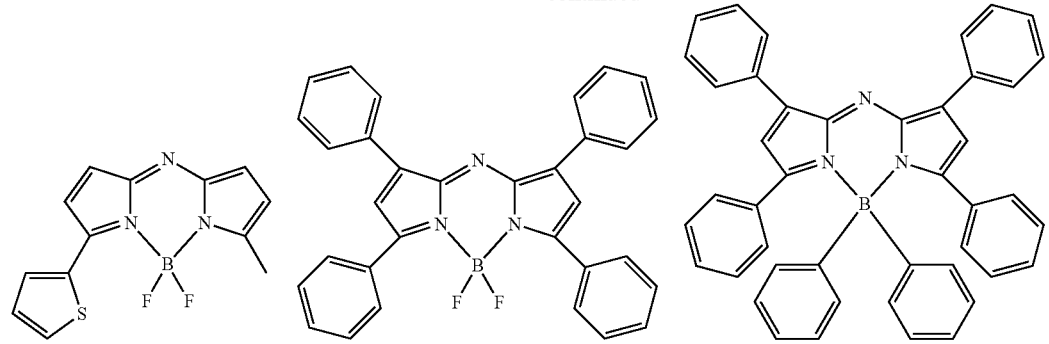
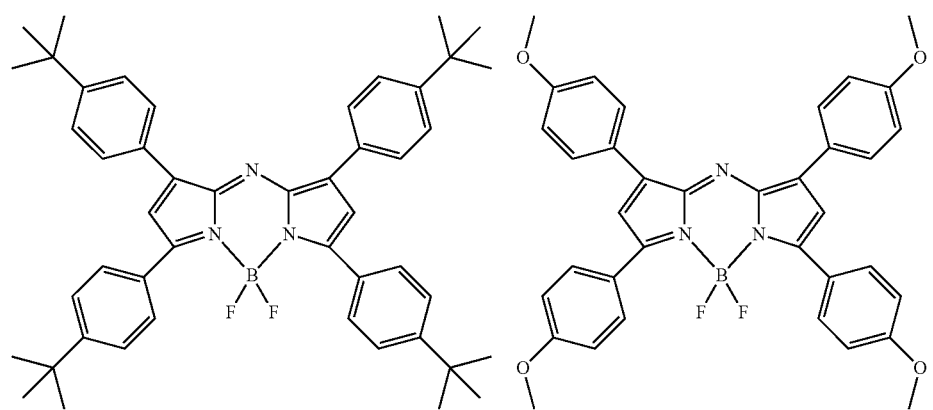
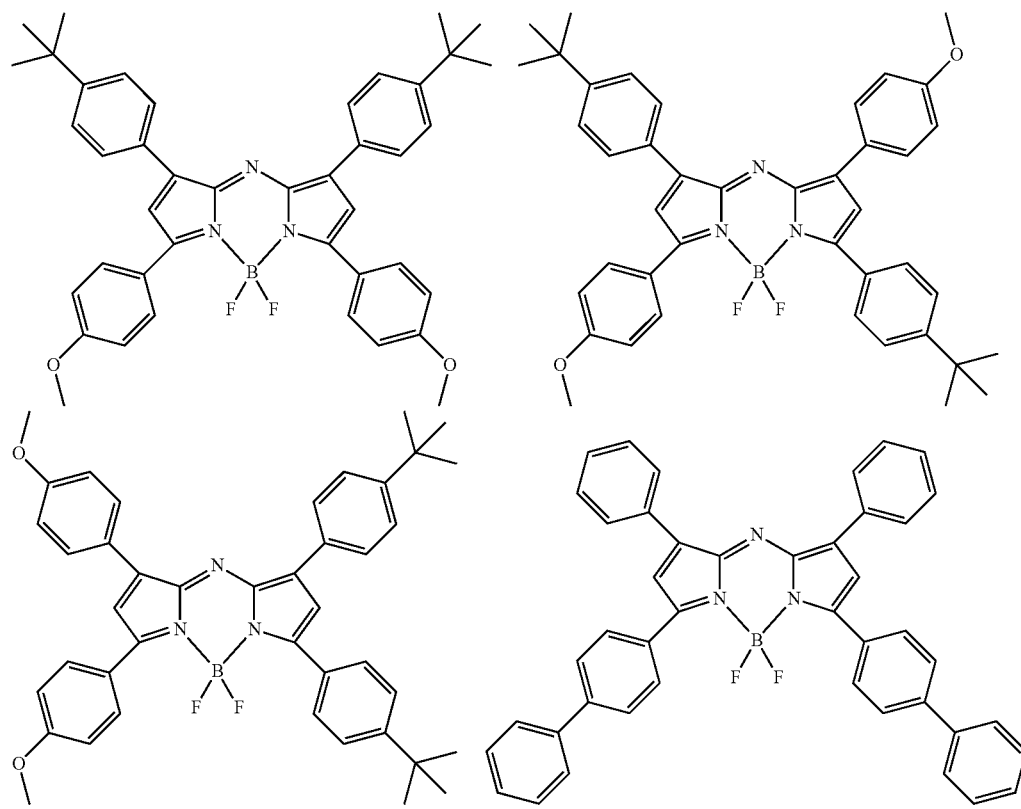

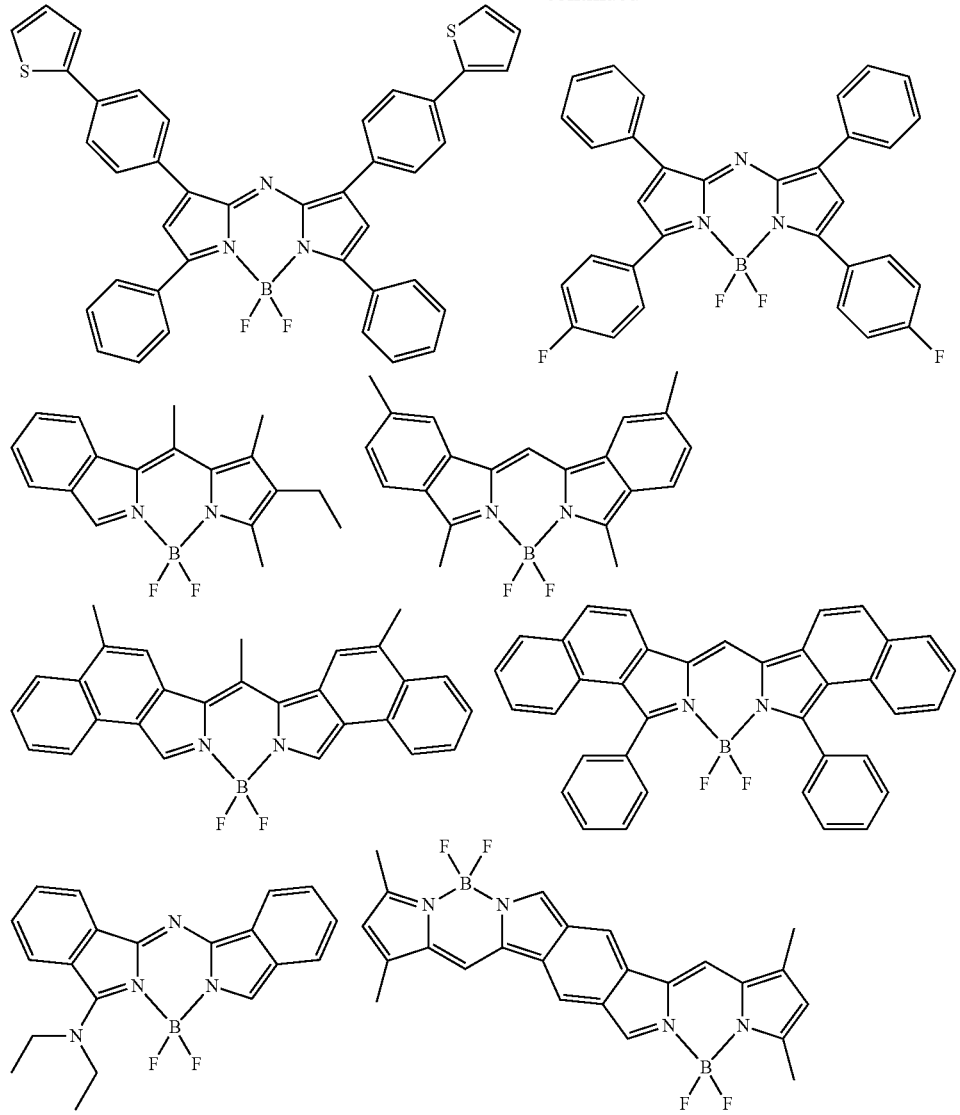

The compounds represented by the general formula (1) may be synthesized by, for example, the methods described in Japanese Patent Application Laid-open (Translation of PCT Application) No. H8-509471 and Japanese Patent Application Laid-open No. 2000-208262. Specifically, the target pyrromethene metal complex may be obtained by reacting a pyrromethene compound and a metal salt in the presence of a base.

Furthermore, regarding the synthesis of pyrromethene-boron fluoride complexes, the compounds represented by the general formula (1) may be synthesized with reference to the methods described in J. Org. Chem., Vol. 64, No. 21, pp. 7813-7819 (1999), Angew. Chem., Int. Ed. Engl., Vol. 36, pp. 1333-1335 (1997), etc. In an exemplary method, a compound represented by the general formula (3) below and a compound represented by the general formula (4) are heated in 1,2-dichloroethane in the presence of phosphorus oxychloride, and thereafter reacted with a compound represented by the general formula (5) below in 1,2-dichloroethane in the presence of triethylamine to give a compound represented by the general formula (1). However, the present invention is not limited thereto. Here, $R^1$ to $R^9$ are the same as described hereinabove. J denotes a halogen.

(3)
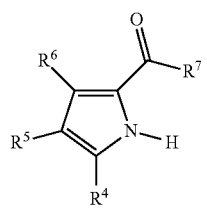

(4)
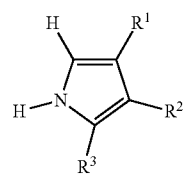

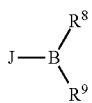
(5)

Furthermore, an aryl group or a heteroaryl group may be introduced by a method in which a carbon-carbon bond is formed using a coupling reaction of a halogenated derivative with a boronic acid or a boronate ester derivative. However, the present invention is not limited thereto. Similarly, an amino group or a carbazolyl group may be introduced by, for example, a method in which a carbon-nitrogen bond is formed using a coupling reaction of a halogenated derivative with an amine or a carbazole derivative in the presence of a metal catalyst such as palladium. However, the present invention is not limited thereto.

Where necessary, the color conversion component according to an embodiment of the present invention may appropriately include an additional compound other than the compound represented by the general formula (1). For example, the component may contain an assist dopant such as rubrene in order to further enhance the energy transfer efficiency from the excitation light to the compound represented by the general formula (1). Furthermore, when it is desired to add an emission color other than the emission color of the compound represented by the general formula (1), a desired organic light-emitting material, for example, such an organic light-emitting material as a coumarin-based dye or a rhodamine-based dye, may be added. Furthermore, besides these organic light-emitting materials, known light-emitting materials such as inorganic phosphors, fluorescent pigments, fluorescent dyes and quantum dots may be added in combination.

Some examples of the organic light-emitting materials other than the compounds represented by the general formula (1) are illustrated below, but the present invention is not particularly limited thereto.

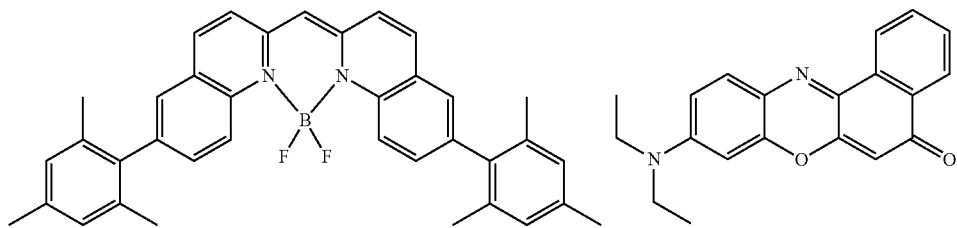

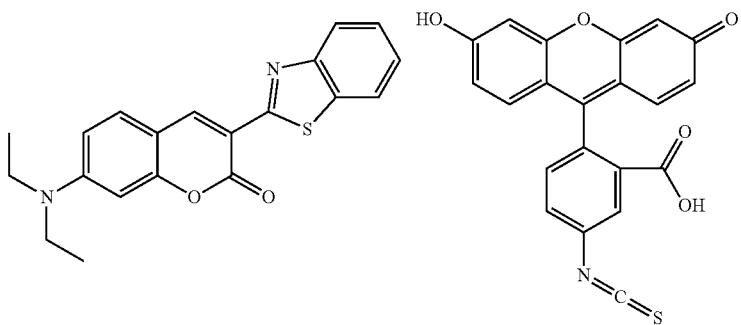

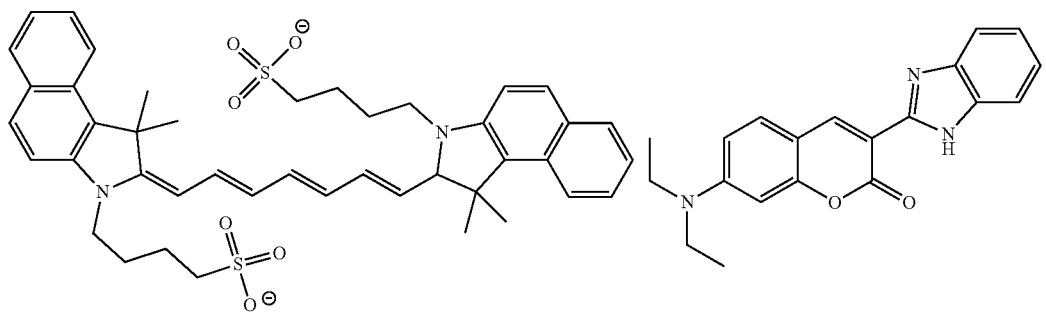

-continued
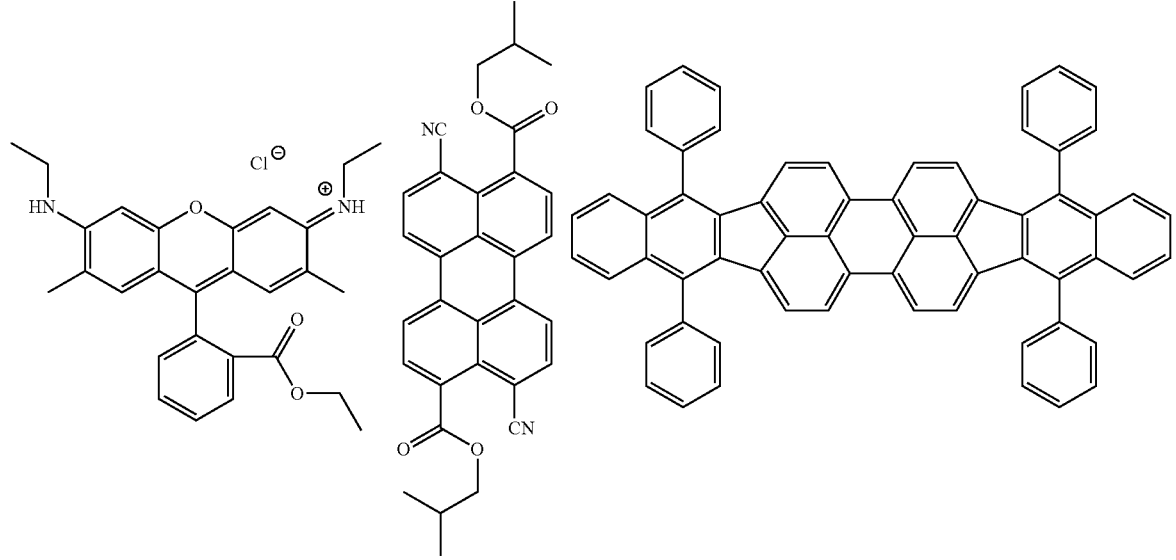
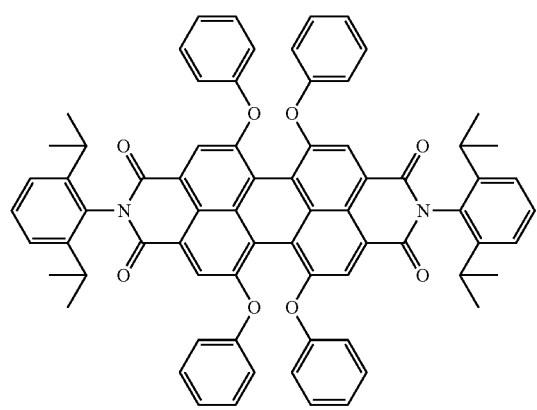
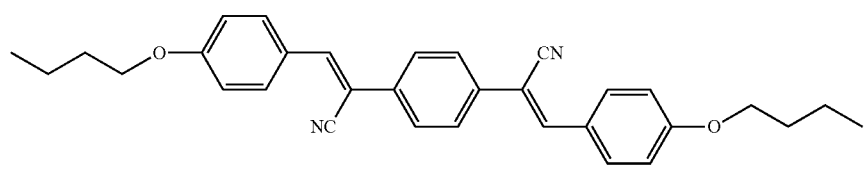
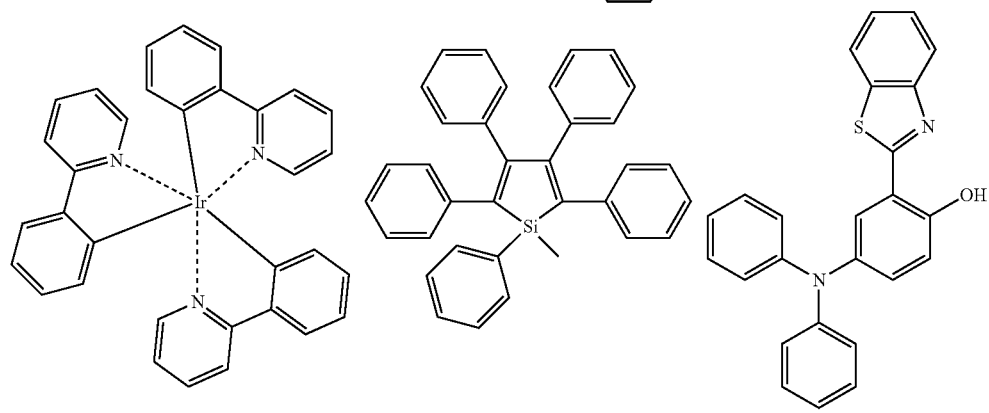

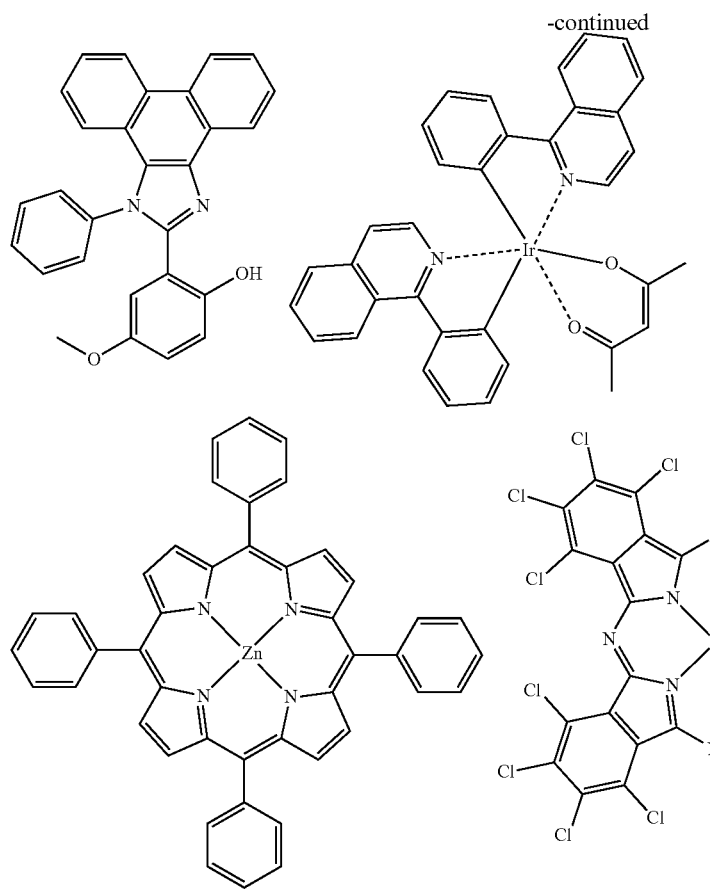

In the present invention, the pyrromethene derivative in the first example that is included in the color conversion component is preferably a pyrromethene derivative that, when excited by excitation light, shows emission having a peak wavelength observed in the region of not less than 500 nm and not more than 580 nm. That is, the color conversion component preferably includes a color conversion layer which contains a light-emitting material (a) described below. The light-emitting material (a) is a light-emitting material that, when excited by excitation light in the wavelength range of not less than 400 nm and not more than 500 nm, shows emission having a peak wavelength observed in the region of not less than 500 nm and not more than 580 nm. Hereinbelow, the emission having a peak wavelength observed in the region of not less than 500 nm and not more than 580 nm is referred to as "green emission".

Furthermore, in the present invention, the pyrromethene derivative in the second example that is included in the color conversion component is preferably a pyrromethene derivative that, when excited by excitation light, shows emission having a peak wavelength observed in the region of not less than 580 nm and not more than 750 nm. That is, the color conversion component preferably includes a color conversion layer which contains a light-emitting material (b) described below. The light-emitting material (b) is a light-emitting material that, when excited by at least one of excitation light in the wavelength range of not less than 400 nm and not more than 500 nm and the emission from the light-emitting material (a), shows emission having a peak wavelength observed in the region of not less than 580 nm and not more than 750 nm. Hereinbelow, the emission having a peak wavelength observed in the region of not less than 580 nm and not more than 750 nm is referred to as "red emission".

In general, the larger the energy of excitation light, the more likely the decomposition of a light-emitting material. However, excitation light in the wavelength range of not less than 400 nm and not more than 500 nm is of relatively small excitation energy. Thus, emission with good color purity can be obtained by the use of excitation light in the above wavelength region without causing the decomposition of the light-emitting material contained in the color conversion component (specifically, the color conversion layer).

Furthermore, the color conversion component in the present invention preferably contains the light-emitting material (a) and the light-emitting material (b) described above. That is, the color conversion component preferably includes a color conversion layer (a green conversion layer) containing the light-emitting material (a), and a color conversion layer (a red conversion layer) containing the light-emitting material (b). In addition, at least one of the light-emitting material (a) and the light-emitting material (b) is preferably the pyrromethene derivative described hereinabove. Incidentally, only a single kind or a plurality of light-emitting materials (a) may be used. Similarly, only a single kind or a plurality of light-emitting materials (b) may be used.

In the color conversion component of the present invention, part of the excitation light in the wavelength range of not less than 400 nm and not more than 500 nm does not pass through any color conversion layer and transmits through a portion other than the color conversion layers (for example, a recess without a color conversion layer). Thus, the part of the excitation light that has transmitted may be used as blue emission itself. Thus, when the color conversion component of the present invention includes the light-emitting material (a) showing green emission and the light-emitting material (b) showing red emission in respective color conversion layers, and also when the light sources that are used are blue light sources capable of emitting blue light with a sharp emission peak (for example, blue organic EL devices or blue LEDs), blue, green and red colors each show a sharp profile of emission spectrum to make it possible to obtain white light with good color purity. As a result, particularly in a display, more vivid colors and a larger color gamut can be efficiently produced. Furthermore, in illumination applications, emission characteristics particularly in the green region and the red region are improved compared with the currently prevailing white LED combining a blue LED and a yellow phosphor, and thus it is possible to obtain a favorable white light source with enhanced color-rendering property.

Preferred examples of the light-emitting materials (a) include coumarin derivatives such as coumarin 6, coumarin 7 and coumarin 153, cyanine derivatives such as indocyanine green, fluorescein derivatives such as fluorescein, fluorescein isothiocyanate and carboxyfluorescein diacetate, phthalocyanine derivatives such as phthalocyanine green, perylene derivatives such as diisobutyl-4,10-dicyanoperylene-3,9-dicarboxylate, pyrromethene derivatives, stilbene derivatives, oxazine derivatives, naphthalimide derivatives, pyrazine derivatives, benzimidazole derivatives, benzoxazole derivatives, benzothiazole derivatives, imidazopyridine derivatives, azole derivatives, compounds having a fused aryl ring such as anthracene and derivatives thereof, aromatic amine derivatives and organometal complex compounds. However, the light-emitting materials (a) are not particularly limited thereto. Of the above compounds, pyrromethene derivatives are particularly suitable because these compounds give a high emission quantum yield and have good durability. Of the pyrromethene derivatives, for example, those compounds represented by the general formula (1) described hereinabove are preferable because they show emission with high color purity.

Preferred examples of the light-emitting materials (b) include cyanine derivatives such as 4-dicyanomethylene-2-methyl-6-(p-dimethylaminostyryl)-4H-pyrane, rhodamine derivatives such as rhodamine B, rhodamine 6G, rhodamine 101 and sulforhodamine 101, pyridine derivatives such as 1-ethyl-2-(4-(p-dimethylaminophenyl)-1,3-butadienyl)-pyridinium-perchlorate, perylene derivatives such as N,N'-bis(2,6-diisopropylphenyl)-1,6,7,12-tetraphenoxyperylene-3,4:9,10-bisdicarboimide, porphyrin derivatives, pyrromethene derivatives, oxazine derivatives, pyrazine derivatives, compounds having a fused aryl ring such as naphthacene and dibenzodiindenoperylene and derivatives thereof, and organometal complex compounds. However, the light-emitting materials (b) are not particularly limited thereto. Of the above compounds, pyrromethene derivatives are particularly suitable because these compounds give a high emission quantum yield and have good durability. Of the pyrromethene derivatives, for example, those compounds represented by the general formula (1) described hereinabove are preferable because they show emission with high color purity.

In the present invention, the content of the organic light-emitting material in the color conversion component is variable depending on the molar absorption coefficient, emission quantum yield and absorption intensity at the excitation wavelength of the compound and also depending on the thickness and transmittance of the color conversion layer in the color conversion component that is fabricated, but is usually $1.0 \times 10^{-4}$ parts by weight to 30 parts by weight with respect to 100 parts by weight of the resin contained in the color conversion layer. In particular, the content of the organic light-emitting material is more preferably $1.0 \times 10^{-3}$ parts by weight to 10 parts by weight, and particularly preferably $5.0 \times 10^{-3}$ parts by weight to 5 parts by weight with respect to 100 parts by weight of the resin contained in the color conversion layer.

Furthermore, when the color conversion component contains both a light-emitting material (a) showing green emission and a light-emitting material (b) showing red emission, part of the green emission is converted to red emission. In view of this, the ratio of the molar content $n_a$ of the light-emitting material (a) to the molar content $n_b$ of the light-emitting material (b) is $n_a:n_b=100:1$ to $1:100$. This ratio ($n_a:n_b$) is preferably 20:1 to 1:20, more preferably 5:1 to 1:5, and particularly preferably 2:1 to 1:2. Here, the molar content $n_a$ and the molar content $n_b$ are the amounts of substance in the resin contained in the color conversion layer in the color conversion component.

The quantum yield measured with respect to a sample of the color conversion layer by applying blue light having a peak wavelength of not less than 440 nm and not more than 460 nm to the color conversion substrate is usually not less than 0.5, preferably not less than 0.7, more preferably not less than 0.8, and still more preferably not less than 0.9.

⟨Resins Contained in Color Conversion Layers⟩

In the present invention, the color conversion component may contain a resin in the color conversion layer. The resin contained in the color conversion layer may be any material that forms a continuous phase and is excellent in properties such as formability, transparency and heat resistance. Examples of the resins which may be used in the color conversion layers include known resins, for example, photocurable resist materials having a reactive vinyl group such as acrylic-based resins, methacrylic-based resins, polyvinyl cinnamate-based resins, polyimide-based resins and cyclic rubber-based resins, epoxy resins, silicone resins (including cured (crosslinked) organopolysiloxanes such as silicone rubbers and silicone gels), urea resins, fluororesins, polycarbonate resins, acrylic resins, methacrylic resins, polyimide resins, cycloolefins, polyethylene terephthalate resins, polypropylene resins, polystyrene resins, urethane resins, melamine resins, polyvinyl resins, polyamide resins, phenol resins, polyvinyl alcohol resins, cellulose resins, aliphatic ester resins, aromatic ester resins, aliphatic polyolefin resins and aromatic polyolefin resins. Furthermore, copolymer resins of the above resins may also be used in the color conversion layers.

Of the above resins, epoxy resins, silicone resins, acrylic resins, ester resins, or mixtures thereof may be suitably used from the point of view of transparency. Furthermore, from the point of view of heat resistance, acrylic resins and ester resins are preferably used. From the point of view of the quantum yield of green emission, acrylic resins are still more preferable.

For example, thermosetting silicone resins are formed by the hydrosilylation reaction of a compound which contains an alkenyl group bonded to a silicon atom, with a compound that has a hydrogen atom bonded to a silicon atom. Examples of such materials include those which are formed by the hydrosilylation reaction of a compound which contains an alkenyl group bonded to a silicon atom, such as vinyltrimethoxysilane, vinyltriethoxysilane, allyltrimethoxysilane, propenyltrimethoxysilane, norbornenyltrimethoxysilane or octenyltrimethoxysilane, with a compound that has a hydrogen atom bonded to a silicon atom, such as methyl hydrogen polysiloxane, dimethyl polysiloxane-CO-methyl hydrogen polysiloxane, ethyl hydrogen polysiloxane, or methyl hydrogen polysiloxane-CO-methyl phenyl polysiloxane. Furthermore, other known thermosetting silicone resins such as those described in, for example, Japanese Patent Application Laid-open No. 2010-159411 may also be used.

Furthermore, commercially available thermosetting silicone resins, for example, general LED silicone sealants may also be used. Specific examples thereof include OE-6630A/B and OE-6336A/B each manufactured by Dow Corning Toray Co., Ltd., and SCR-1012A/B and SCR-1016A/B each manufactured by Shin-Etsu Chemical Co., Ltd. Hydrosilylation reaction retarders such as acetylene alcohol are preferably added to the thermosetting silicone resins for the purpose of inhibiting curing at room temperature to extend the pot life.

Thermoplastic silicone resins are resins which are softened and exhibit fluidity when heated to the glass transition temperature or the melting point. Thermoplastic silicone resins do not undergo chemical reaction such as curing reaction even when they are softened by heating, and thus become solid again when cooled to room temperature. Furthermore, examples of the commercially available thermoplastic silicone resins include RSN series such as RSN-0805 and RSN-0217 manufactured by Dow Corning Toray Co., Ltd.

Furthermore, in the present invention, the oxygen permeability of the resin contained in the color conversion layer is preferably not less than 0.1 cc/m$^2$·day·atm. As a result of the oxygen permeability of the resin being not less than 0.1 cc/m$^2$·day·atm, oxygen is allowed to be contained in the color conversion layer (the wavelength conversion layer). During the process in which the light-emitting material in the color conversion layer is excited and emits light, part of the light-emitting material is excited in the triplet state which is instable and causes the light-emitting material itself to degrade, resulting in a deterioration in durability. On the other hand, when oxygen is present in the color conversion layer, the light-emitting material quickly transfers the excitation energy to oxygen and quickly returns to the stable ground state. Thus, the degradation of the light-emitting material in the color conversion layer is prevented, and consequently the durability of the color conversion layer is enhanced.

The oxygen permeability is preferably not less than 10 cc/m$^2$·day·atm, and more preferably not less than 1000 cc/m$^2$·day·atm. On the other hand, the upper limit of the oxygen permeability is preferably not more than 10000 cc/m$^2$·day·atm.

Incidentally, the oxygen permeability is a value measured based on the electrolytic sensor method described in JIS K7126-2 (2006) using an oxygen permeability meter manufactured by MOCON (the United States) (model name: "OXTRAN" (registered trademark) 2/20) under conditions of a temperature of 20° C. and a humidity of 0% RH with respect to a flat test piece having a film thickness of 20 microns.

Furthermore, when the color conversion layer is covered with other layer, there is a risk that the amount of oxygen in the color conversion layer is reduced and the durability is deteriorated. Thus, the layer disposed adjacent to the color conversion layer is preferably a layer of an oxygen-containing gas such as air. In other cases, where the color conversion layer is covered with a layer of a resin or the like, the oxygen permeability of this layer is, similarly to the resin in the color conversion layer, preferably not less than 0.1 cc/m2·day·atm.

⟨Other Additives⟩

In the color conversion component of the present invention, the color conversion layers may include additives without impairing the advantageous effects of the present invention. Examples of the additives include, specifically, dispersion stabilizers, leveling agents, antioxidants, flame retardants, defoamers, plasticizers, crosslinking agents, curing agents, light resistance stabilizers such as UV absorbers, and adhesion aids such as silane coupling agents.

Furthermore, the color conversion layers may include inorganic particles for the purpose of enhancing the light extraction efficiency of the color conversion layers. Specifically, examples of the inorganic particles include microparticles composed of glass, titania, silica, alumina, silicone, zirconia, ceria, aluminum nitride, silicon carbide, silicon nitride, barium titanate and the like. These may be used singly, or two or more may be used in combination. In particular, silica, alumina, titania and zirconia are preferable from the point of view of availability.

⟨Methods for Producing Color Conversion Layers⟩

In the present invention, as described hereinabove, the color conversion layers are formed in recesses defined by the partition walls of the color conversion component. The color conversion layers may be formed in recesses by, for example, a method in which an ink including materials for constituting the color conversion layers is prepared and spread over the entire surface of a transparent substrate using an application method such as a spin coating method, and the resultant film is patterned by a photolithographic method or the like to accomplish the formation. Furthermore, the formation of the color conversion layers is not limited to the photolithographic method, and the pattern may be formed by a screen printing method or the like, or the pattern may be formed by an inkjet method.

⟨Color Conversion Substrates⟩

In the present invention, the color conversion substrate includes a plurality of color conversion layers on a transparent substrate. Furthermore, the color conversion substrate includes a pyrromethene derivative in at least one of the color conversion layers. It is preferable that both of the color conversion layers include a pyrromethene derivative. Furthermore, the color conversion layers in the color conversion substrate preferably include a red conversion layer and a green conversion layer. The red conversion layer is formed of a fluorescent material that absorbs at least blue light to emit red light. The green conversion layer is formed of a fluorescent material that absorbs at least blue light to emit green light. Furthermore, partition walls may be disposed on the transparent substrate of the color conversion substrate, and the color conversion layers are preferably arranged between a partition wall and a partition wall (in recesses) disposed on the transparent substrate. The color conversion substrate may be such that excitation light is incident through the transparent substrate side onto the color conversion layers, and the colors of lights converted by the color conversion layers are visible from the side opposite to the transparent substrate. Alternatively, the color conversion substrate may be such that excitation light is incident from the color conversion layer side onto the color conversion layers, and the colors of lights converted by the color conversion layers are visible through the transparent substrate side. The quantum yield measured with respect to a sample of the color conversion substrate by applying blue light having a peak wavelength of not less than 440 nm and not more than 460 nm to the color conversion substrate is usually not less than 0.5, preferably not less than 0.7, more preferably not less than 0.8, and still more preferably not less than 0.9.

⟨Color Filters⟩

Furthermore, the light-emitting device and the color conversion substrate in the present invention preferably have color filters as exemplified by the aforementioned red color filter 18R and green color filter 18G (see FIGS. 1 and 2). A color filter is a layer which transmits visible light in a specific wavelength region to create a desired hue of the transmitted light and to enhance the color purity of the transmitted light. When blue light is converted in the color conversion layers in the absence of any color filters in the color conversion substrate, the blue light from the excitation light sources cannot be sufficiently blocked and the blue light is mixed into the converted light. Consequently, the converted light cannot be obtained in a selective manner and sometimes fails to attain high color purity. To prevent this, color filters may be used in the color conversion substrate to make it possible to selectively filter out only blue light and to extract the converted light exclusively, and consequently the color purity is enhanced.

The color filters used in the light-emitting device and the color conversion substrate of the present invention may be formed using materials used in flat panel displays such as liquid crystal displays. Such materials frequently used in recent years are pigment-dispersed materials in which a pigment is dispersed in a photoresist. The color filters that are used are preferably blue color filters which transmit light in the wavelength range of not less than 400 nm and not more than 550 nm, green color filters which transmit light in the wavelength range of not less than 500 nm and not more than 600 nm, yellow color filters which transmit light in the wavelength range of 500 nm and above, red color filters which transmit light in the wavelength range of 600 nm and above, or the like. Furthermore, the color filters may be staked on the color conversion component with a space therebetween, or may be stacked into an integral unit. Furthermore, the color filters may be formed on the color conversion substrate, or a color filter substrate may be fabricated separately from the color conversion substrate, and the color conversion substrate and the color filter substrate may be stacked together. Furthermore, it is preferable that the color conversion component and the color filters be stacked in this order from the light source side.

The color filters in the present invention are preferably cured products of a color filter-forming composition including a color material and a binder resin, and are more preferably cured products of a color filter-forming composition including a color material, a binder resin, a reactive monomer and a photopolymerization initiator. Examples of the color materials include pigments and dyes. Examples of the pigments include organic pigments and inorganic pigments. The color material may include two or more kinds thereof. In particular, organic pigments and dyes are preferable, and in this case the light transmittance of the color filters can be enhanced.

Examples of the organic pigments as red color materials include C. I. Pigment Reds 9, 48, 97, 122, 123, 144, 149, 166, 168, 177, 179, 180, 192, 209, 215, 216, 217, 220, 223, 224, 226, 227, 228, 240, 254, 255, 256, 257, 258, 260, 261, 264, 266, 267, 268, 269, 273, 274 and 291.

Examples of the organic pigments as yellow color materials include C. I. Pigment Yellows 12, 13, 17, 20, 24, 83, 86, 93, 95, 109, 110, 117, 125, 129, 137, 138, 139, 147, 148, 150, 153, 154, 166, 168, 180, 185 and 231.

Examples of the color materials of other colors include orange pigments such as C. I. Pigment Oranges 13, 31, 36, 38, 40, 42, 43, 51, 55, 59, 61, 64, 65 and 71.

Examples of the dyes include oil-soluble dyes, acid dyes, direct dyes, basic dyes and acid mordant dyes. The dyes may be formed into lakes or may be formed into salt-forming compounds of the dyes and nitrogen-containing compounds. Specifically, examples include azo-based dyes, benzoquinone-based dyes, naphthoquinone-based dyes, anthraquinone-based dyes, xanthene-based dyes, cyanine-based dyes, squarylium-based dyes, croconium-based dyes, merocyanine-based dyes, stilbene-based dyes, diarylmethane-based dyes, triarylmethane-based dyes, fluoran-based dyes, spiropyran-based dyes, phthalocyanine-based dyes, indigo-based dyes, fulgide-based dyes, nickel complex-based dyes and azulene-based dyes.

Examples of the color materials used in the green color filters include pigments such as C. I. Pigment Greens 1, 2, 4, 7, 8, 10, 13, 14, 15, 17, 18, 19, 26, 36, 45, 48, 50, 51, 54, 55, 58 and 59, C. I. Pigment Yellows 1, 1:1, 2, 3, 4, 5, 6, 9, 10, 12, 13, 14, 16, 17, 24, 31, 32, 34, 35, 35:1, 36, 36:1, 37, 37:1, 40, 41, 42, 43, 48, 53, 55, 61, 62, 62:1, 63, 65, 73, 74, 75, 81, 83, 87, 93, 94, 95, 97, 100, 101, 104, 105, 108, 109, 110, 111, 116, 117, 119, 120, 126, 127, 127:1, 128, 129, 133, 134, 136, 138, 139, 142, 147, 148, 150, 151, 153, 154, 155, 157, 158, 159, 160, 161, 162, 163, 164, 165, 166, 167, 168, 169, 170, 172, 173, 174, 175, 176, 180, 181, 182, 183, 184, 185, 188, 189, 190, 191, 191:1, 192, 193, 194, 195, 196, 197, 198, 199, 200, 202, 203, 204, 205, 206, 207, 211, 213, 218, 220, 221 and 228, and C. I. Pigment Blues 15, 15:1, 15:2, 15:3, 15:4, 15:5, 15:6, 16 and 60.

Examples of the color materials used in the blue color filters include blue pigments such as C. I. Pigment Blues 15, 15:3, 15:4, 15:6, 16, 22, 60 and 64, purple pigments such as C. I. Pigment Violets 19, 23, 29, 30, 32, 37, 40 and 50, Acid Reds 59 and 289, and the color materials described in Japanese Patent Application Laid-open No. 2011-032298.

The color material may be dissolved in the color filter-forming composition, or may be dispersed in the form of particles. The color filters (in particular, the red color filters) preferably include, among the above color materials, a red color material and a yellow color material from the point of view of further enhancing the brightness. Furthermore, this yellow color material is more preferably at least one of C. I. Pigment Yellow 138, C. I. Pigment Yellow 139, C. I. Pigment Yellow 150, C. I. Pigment Yellow 180, C. I. Pigment Yellow 185 and C. I. Pigment Yellow 231.

The color conversion substrate in the present invention absorbs light other than red in the color conversion layers and thereby increases the light intensity of the red region. Thus, the color conversion substrate, by its including the color materials described above, attains enhanced selectivity of the wavelength of the color converted in the color conversion layers, and can further enhance the color purity.

The binder resin is preferably one which can prevent the aggregation of the color material and allows the components such as the color material to be uniformly dispersed in the color filter layer. Specifically, examples of the binder resins include those examples described hereinabove as the resins contained in the color conversion layers.

Furthermore, in the present invention, T1+T2 is preferably not less than 2 μm and not more than 8 μm wherein T1 is the film thickness of the color filter layer and T2 is the film thickness of the color conversion layer. By controlling T1+T2 to 2 μm or above, the color purity can be further enhanced. On the other hand, the pattern formability of the color filter layers and the color conversion layers can be enhanced by controlling T1+T2 to 8 μm or below.

Furthermore, the ratio T1/T2 is preferably not less than 0.5 and not more than 3. By controlling T1/T2 to 0.5 or above, the effects of the color conversion layer can be produced more effectively. On the other hand, the pattern formability of the color filter layers and the color conversion layers can be enhanced by controlling T1/T2 to 3 or below. Furthermore, mixing of different colors when viewed at an angle can be prevented and the color purity can be further enhanced.

The thicknesses of the color filter and of the color conversion layer can be calculated by measuring the height of the step using a contact-type film thickness measuring apparatus. More specifically, the color filter layer or the color conversion layer is partly scratched with a needle or the like to expose the underlayer such as the substrate, and an observation may be made vertically from above the color filter layer or the color conversion layer using a contact-type film thickness meter to determine the thickness of the layer of interest.

Furthermore, in the present invention, W1−W2 is preferably not less than 1 μm and not more than 30 μm wherein W1 is the line width of the color filter layer and W2 is the line width of the color conversion layer. When W1−W2 is controlled to 1 μm or above, the color conversion layer comes to exert a reduced influence on the light passing through a color layer of different color when the layers are viewed at an angle, and the color purity and the brightness can be further enhanced. When, on the other hand, W1−W2 is controlled to 30 μm or below, an increased proportion of light can pass through the color conversion layer and through the color filter, and the brightness and the color purity can be further enhanced. The line widths of the color filters and the color conversion layers may be determined by magnified observation of the pattern of the color filter layers or the color conversion layers using an optical microscope with 100 times magnification.

Furthermore, the color conversion substrate in the present invention may further include a resin black matrix which is disposed between the color filters of different colors, and an overcoat layer which covers the constituent components such as the color filters on the substrate. Examples of the overcoat layers include films made of epoxy resins, acrylic epoxy resins, acrylic resins, siloxane resins, polyimide resins, silicon-containing polyimide resins, polyimide siloxane resins, etc.

Examples of the materials for forming the resin black matrixes include materials containing a binder resin such as an acrylic resin or a polyimide resin, and a black pigment. Examples of the black pigments include C. I. Pigment Black 7, carbon black, graphite, iron oxide, manganese oxide and titanium black. The resin black matrix may include two or more kinds of these materials, and may further include pigments of other colors. The black pigment may be a surface-treated pigment. The thickness of the resin black matrix is preferably not less than 0.5 μm and not more than 2 μm.

⟨Sealing Layers⟩

In order to prevent the oxidation of the organic layers and electrodes in the elements such as the light sources, the light-emitting device in the present invention may have a sealing layer on the elements. In order to prevent the entry of moisture through a sealing layer, a sealing plate such as a glass plate is bonded using an adhesive resin layer such as a commercially available low hygroscopic photocurable adhesive, epoxy-based adhesive, silicone-based adhesive, or crosslinked ethylene-vinyl acetate copolymer adhesive sheet. In this manner, the sealing layer is sealed. Some sealing plates which may be used other than glass plates are metal plates and plastic plates.

⟨Displays⟩

The light-emitting devices according to an embodiment of the present invention may be used in displays such as organic EL displays, micro LED displays, and partially drivable LED backlight liquid crystal displays. The display according to an embodiment of the present invention includes at least the light-emitting device described above. Typical examples of the light-emitting devices applied to the displays of the present invention include those described below. For example, the light-emitting devices applied to organic EL displays include partially drivable blue organic electroluminescent device light sources, color conversion components and color filters. The light-emitting devices applied to micro LED displays include partially drivable blue LED light sources, color conversion components and color filters. The light-emitting devices applied to partially drivable blue LED backlight liquid crystal displays include partially drivable blue LED backlights, color conversion components, liquid crystal layers and color filters.

EXAMPLES

The present invention and the advantageous effects will be described based on specific EXAMPLES hereinbelow, but the EXAMPLES presented below do not limit the scope of the present invention. Furthermore, evaluation methods in EXAMPLES and COMPARATIVE EXAMPLE are described below.

(Evaluation of BT 2020 Coverage)

In the evaluation of BT 2020 coverage, organic EL displays fabricated in EXAMPLES and COMPARATIVE EXAMPLE described later were driven to emit each of colors at 10 mA/cm$^2$, and the chromaticities of the colors were measured with spectroradiometer SR-LEDW manufactured by TOPCON CORPORATION. From the chromaticities obtained, the BT 2020 standard coverage in the CIE u'v' chromaticity diagram was determined. The BT 2020 standard coverage was evaluated as good when the coverage was 80% or above, and as excellent when the coverage was 90% or above.

(Evaluation of Durability)

In the evaluation of durability, organic EL displays fabricated in EXAMPLES and COMPARATIVE EXAMPLE described below were driven in full illumination mode (white), and changes in chromaticity were measured. The durability was evaluated based on the time to a change of ±0.01 from the initial value of CIE u'v'.

Example 1

Hereinbelow, examples of the fabrication of the color conversion substrates of the present invention and the fabrication of organic EL displays using the color conversion substrates will be described. An organic EL display formed in EXAMPLE 1 of the present invention had a pixel count of 160×120×RGB and a pixel pitch of 0.33 mm.

(Fabrication of Color Conversion Substrate)
(First Item: Fabrication of Partition Walls)

In the first item, a method for fabricating partition walls in the color conversion substrate of EXAMPLE 1 is described. In this partition wall fabrication method, VPA204/P5.4-2 (manufactured by New Nippon Steel Chemical Co., Ltd.) as a partition wall material was spin coated over a transparent substrate (Corning 1737 glass: 50×50×1.1 mm), then exposed to UV light through a photomask having a grid pattern, developed with a 2% aqueous sodium carbonate solution, and baked at 200° C. to form a pattern of transparent partition walls (film thickness 25 μm).

(Second Item: Fabrication of Red Conversion Layers)

In the second item, a method for fabricating red conversion layers in the color conversion substrate of EXAMPLE 1 is described. In this method for fabricating red conversion layers, an ink was prepared by mixing red pyrromethene derivative RD-1 (0.2 wt %) and polymethyl methacrylate (PMMA) (manufactured by KURARAY CO., LTD.) (3 wt %) together in tetralin solvent. The oxygen permeability of this PMMA was about 6000. The ink prepared was attached to the surface of red conversion layer regions of the transparent substrate in a nitrogen atmosphere using an inkjet method. Thereafter, the transparent substrate was dried at 200° C. for 30 minutes. Thus, red conversion layers having a film thickness of 300 nm were fabricated.

(Third Item: Fabrication of Green Conversion Layers)

In the third item, a method for fabricating green conversion layers in the color conversion substrate of EXAMPLE 1 is described. In this method for fabricating green conversion layers, an ink was prepared by mixing green pyrromethene derivative GD-1 (1.5 wt %) and polymethyl methacrylate (PMMA) (manufactured by KURARAY CO., LTD.) (3 wt %) together in tetralin solvent. The ink prepared was attached to the surface of green conversion layer regions of the transparent substrate in a nitrogen atmosphere using an inkjet method. Thereafter, the transparent substrate was dried at 200° C. for 30 minutes. Thus, green conversion layers having a film thickness of 300 nm were fabricated.

(Fourth Item: Fabrication of Color Filters)

In the fourth item, a method for fabricating color filters in the color conversion substrate of EXAMPLE 1 is described. In this color filter fabrication method, the transparent substrate resulting from the treatments described in the first item to the third item was spin coated with a red color filter material (manufactured by FUJIFILM Electronic Materials Co., Ltd.: COLOR MOSAIC CR-7001). The resultant film was patterned by a photolithographic method. As a result, red color filters having a line pattern with a line width of 0.1 mm, a pitch of 0.33 mm and a film thickness of 2 m were fabricated on the red conversion layers.

Next, green color filters were fabricated on the green conversion layers in the same manner as the red color filters, except that a green color filter material (manufactured by FUJIFILM Electronic Materials Co., Ltd.: COLOR MOSAIC CG-7001) was used. Similarly to the red color filters, the green color filters that were fabricated had a line pattern with a line width of 0.1 mm, a pitch of 0.33 mm and a film thickness of 2 μm. In the manner described above, a color conversion substrate was fabricated that had blue light-transmitting pixels, pixels composed of the red conversion layers and the red color filters thereon, and pixels composed of the green conversion layers and the green color filters thereon.

(Fabrication of Organic EL Substrate)

Next, a method for fabricating an organic EL substrate in EXAMPLE 1 is described. In this method for fabricating an organic EL substrate, TFTs were arranged on a substrate for organic EL so as to correspond to the array of the pixels patterned on the color conversion substrate that had been fabricated above. Subsequently, an Ag film was formed on the substrate using a sputtering method, and an ITO transparent conductive film was formed in a pattern with a thickness of 165 nm. The substrate thus obtained was ultrasonically washed with Semico Clean 56 (product name, manufactured by Furuuchi Chemical Corporation) for 15 minutes and was washed with ultrapure water. Immediately before the fabrication of organic EL devices on the substrate, the substrate was treated with UV-ozone for 1 hour and was placed in a vacuum deposition apparatus. The apparatus was then evacuated to a degree of vacuum of not more than $5 \times 10^{-4}$ Pa. By a resistance heating method, first, Compound HAT-CN$_6$ was deposited to form a hole injection layer with a thickness of 5 nm, and subsequently Compound HT-1 was deposited to form a hole transport layer with a thickness of 50 nm. Next, Compound H-1 as a host material and Compound BD-1 as a blue dopant material were deposited with a thickness of 20 nm so that the dopant concentration would be 5 wt %, thereby forming an emission layer. Furthermore, Compound 2E-1 as a donor material and Compound ET-1 as an electron transport layer were stacked with a thickness of 35 nm in such a manner that the ratio of the deposition rate of Compound ET-1 to that of Compound 2E-1 would be 1:1. Next, Compound 2E-1 was deposited to form an electron injection layer with a thickness of 0.5 nm. Thereafter, magnesium and silver were co-deposited with a thickness of 60 nm to form a cathode, and tris(8-quinolinolato)aluminum (Alq$_3$) was deposited with a thickness of 60 nm. A sealing glass plate was bonded to the substrate resulting from the film formation. Thus, a partially drivable top emission-type organic EL substrate was obtained.

(Fabrication of Organic EL Display)

Next, a method for fabricating an organic EL display in EXAMPLE 1 is described. In this method for fabricating an organic EL display, the color conversion substrate and the organic EL substrate fabricated as described above were joined together and thereby an organic EL display was fabricated. Using the organic EL display fabricated, and their chromaticities were measured. The BT 2020 standard coverage in the CIE u'v' chromaticity diagram was determined to be 88.2%. Furthermore, the organic EL display was driven in full illumination mode (white), and changes in chromaticity were measured. The time to a change of ±0.01 from the initial value of CIE u'v' was 120 hours. The evaluation results of EXAMPLE 1 are described in Table 2 later.

Examples 2 to 8, and Comparative Example 1

Next, EXAMPLES 2 to 8 of the present invention and COMPARATIVE EXAMPLE 1 in comparison with the present invention will be described. In EXAMPLES 2 to 8 and COMPARATIVE EXAMPLE 1, light-emitting devices and displays were fabricated and evaluated in the same manner as in EXAMPLE 1, except that the compounds described in Table 2 were used. The evaluation results of EXAMPLES 2 to 8 and COMPARATIVE EXAMPLE 1 are described in Table 2.

TABLE 2

| | Materials | | | | Emission characteristics | |
| --- | --- | --- | --- | --- | --- | --- |
| | Organic EL substrate | | Color conversion substrate | | | |
| | Host material | Blue dopant material | Green material | Red material | BT 2020 coverage (%) | Durability (h) |
| EX. 1 | H-1 | BD-1 | GD-1 | RD-1 | 88.2 | 120 |
| EX. 2 | H-1 | BD-2 | GD-1 | RD-1 | 90.2 | 110 |
| EX. 3 | H-1 | BD-2 | GD-2 | RD-1 | 90.1 | 420 |
| EX. 4 | H-1 | BD-2 | GD-3 | RD-1 | 90.1 | 610 |
| EX. 5 | H-1 | BD-2 | GD-4 | RD-1 | 90.2 | 1080 |
| EX. 6 | H-1 | BD-2 | GD-5 | RD-1 | 90.2 | 400 |
| EX. 7 | H-1 | BD-2 | GD-6 | RD-1 | 90.1 | 410 |
| EX. 8 | H-1 | BD-2 | GD-7 | RD-1 | 90.1 | 400 |
| COMP. EX. 1 | H-1 | DPVBi | AlClq$_3$ | DCJTB | 70.2 | 30 |

Incidentally, red pyrromethene derivative RD-1, green pyrromethene derivatives GD-1 to GD-7, and Compounds BD-1, BD-2, HAT-CN$_6$, HT-1, H-1, ET-1, 2E-1, DPVBi and DCJTB used appropriately in the above EXAMPLES 1 to 8 and COMPARATIVE EXAMPLE 1 are the compounds illustrated below.

-continued

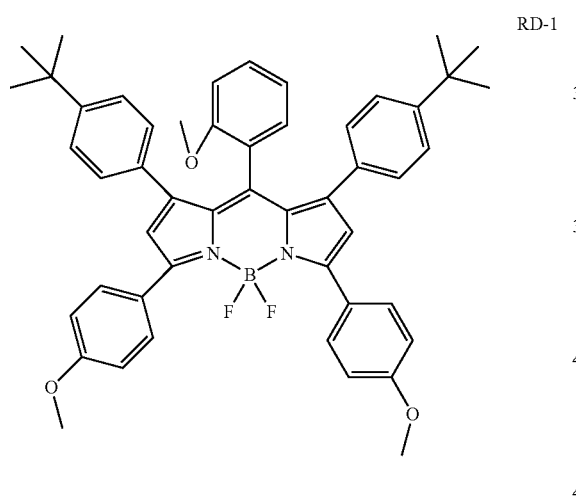

RD-1

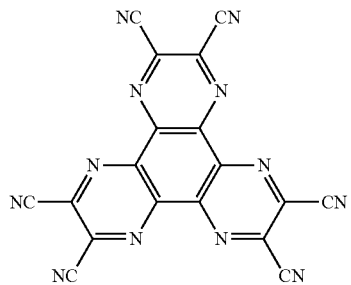

HAT-CN$_6$

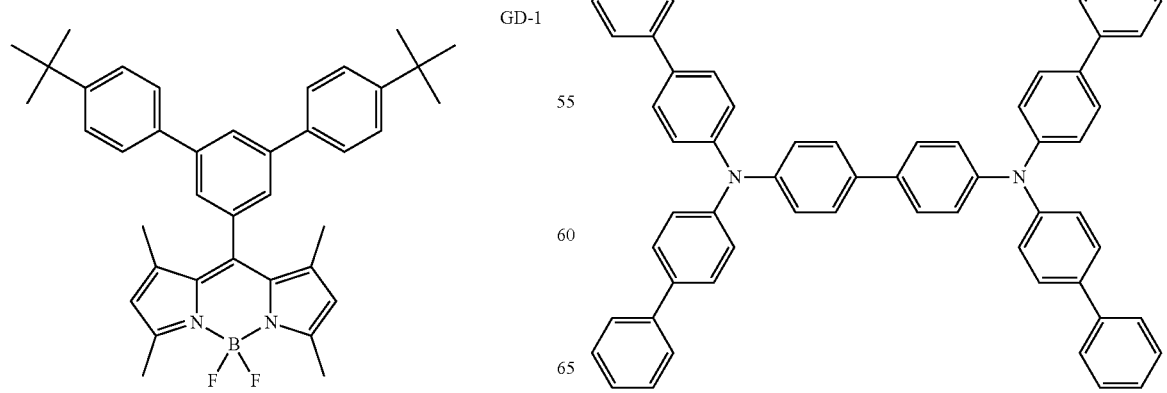

GD-1

HT-1

135
-continued
H-1
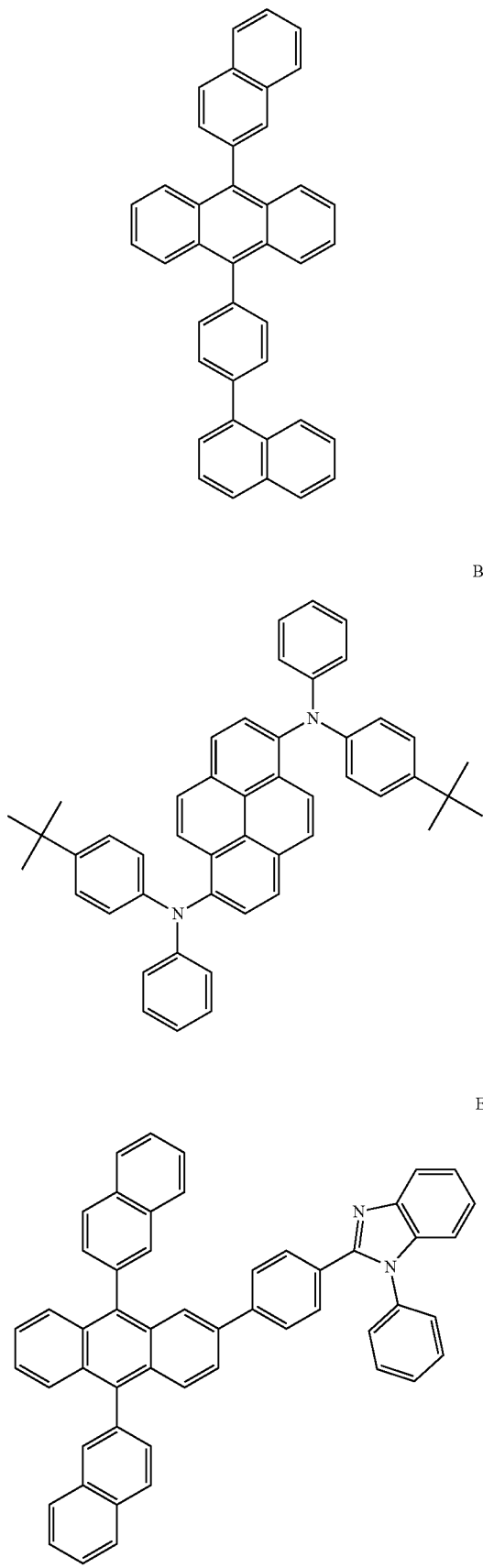
BD-1
ET-1
136
-continued
2E-1
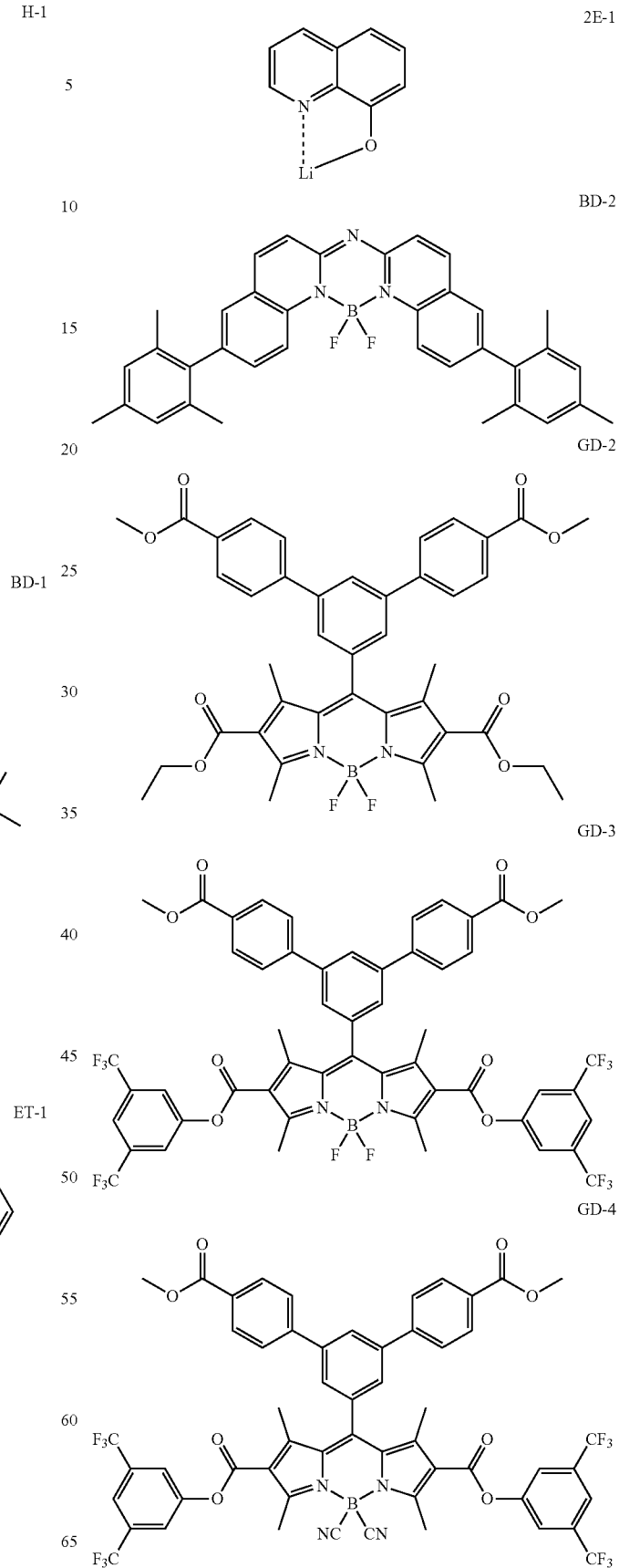
BD-2
GD-2
GD-3
GD-4

-continued

GD-5
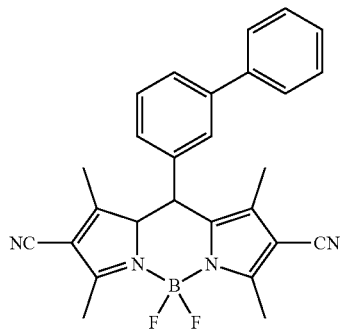

GD-6
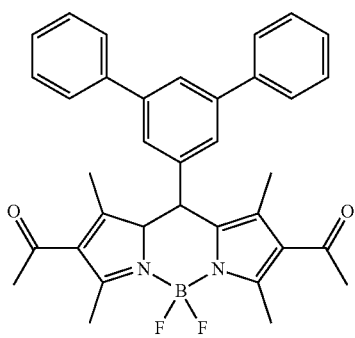

GD-7
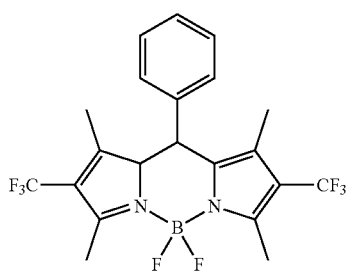

DPVBi
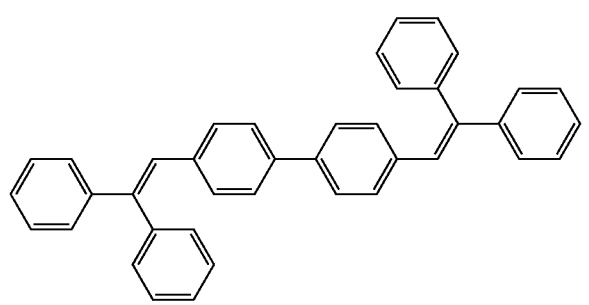

DCJTB
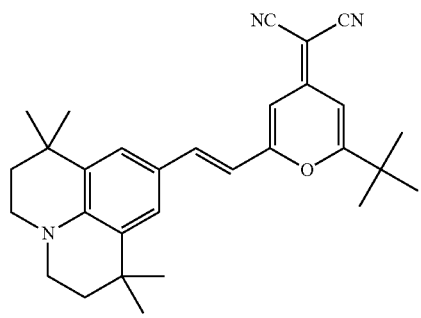

INDUSTRIAL APPLICABILITY

As described hereinabove, the light-emitting devices, the displays and the color conversion substrates according to the present invention are suited for the concurrent satisfaction of enhanced color reproducibility and high durability while maintaining response speed and contrast.

REFERENCE SIGNS LIST

11 LIGHT-EMITTING DEVICE
12 ORGANIC EL SUBSTRATE
13 ORGANIC EL DEVICE
14 TRANSPARENT SUBSTRATE
15 SEALING LAYER
16 COLOR CONVERSION SUBSTRATE
17G GREEN CONVERSION LAYER
17R RED CONVERSION LAYER
18G GREEN COLOR FILTER
18R RED COLOR FILTER
19 PARTITION WALL
110 SUBSTRATE
21 LIGHT-EMITTING DEVICE
22 LED SUBSTRATE
23 LED
24 TRANSPARENT SUBSTRATE
26 COLOR CONVERSION SUBSTRATE
27G GREEN CONVERSION LAYER
27R RED CONVERSION LAYER
28G GREEN COLOR FILTER
28R RED COLOR FILTER
29 PARTITION WALL
210 SUBSTRATE

The invention claimed is:
1. A light-emitting device comprising:
a plurality of partially drivable light sources, and
a color conversion component configured to convert at least part of incident light from at least part of the light sources and emit outgoing light falling in a different wavelength region from the incident light,
the color conversion component comprising a pyrromethene derivative,
wherein the pyrromethene derivative is a compound represented by the general formula (1) below:

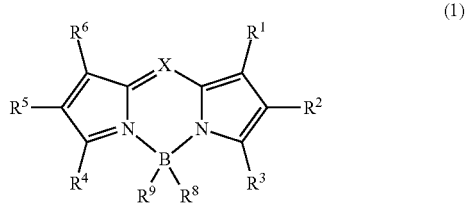

where in the general formula (1), X is C—$R^7$ or N, and $R^1$ to $R^9$ are the same as or different from one another and are each selected from hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, ester group, carbamoyl group, amino group, nitro group, silyl group, siloxanyl group, boryl group, sulfo group, phosphine oxide group, and fused ring and aliphatic ring formed with an adjacent substituent, and wherein either $R^8$ or $R^9$ in the general formula (1) is a cyano group.

2. The light-emitting device according to claim 1, wherein emission from the light sources is blue light emission or blue-green light emission.

3. The light-emitting device according to claim 1, wherein the color conversion component comprises:
partition walls disposed to form a pattern of recesses corresponding to the light sources, and
color conversion layers disposed in the recesses.

4. The light-emitting device according to claim 3, wherein the color conversion layers comprise two or more kinds of color conversion layers configured to emit outgoing lights falling in different wavelength regions from one another.

5. The light-emitting device according to claim 3, wherein part of the recesses includes no color conversion layers.

6. The light-emitting device according to claim 1, further comprising a color filter.

7. The light-emitting device according to claim 1, wherein the light sources are light-emitting diodes.

8. The light-emitting device according to claim 1, wherein the light sources are organic electroluminescent devices including an organic layer between an anode and a cathode, the organic electroluminescent devices being configured to emit light using electric energy.

9. The light-emitting device according to claim 1, wherein X in the general formula (1) is C—$R^7$, and $R^7$ is a group represented by the general formula (2) below:

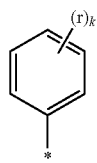

(2)

where in the general formula (2), r is selected from the group consisting of hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, ester group, carbamoyl group, amino group, nitro group, silyl group, siloxanyl group, boryl group, sulfo group and phosphine oxide group, k is an integer of 1 to 3, and when k is 2 or greater, r is the same as or different from one another.

10. The light-emitting device according to claim 1, wherein at least one of $R^1$ to $R^6$ in the general formula (1) is an electron withdrawing group.

11. The light-emitting device according to claim 10, wherein in the general formula (1), the electron withdrawing group is a group containing a fluorine atom.

12. The light-emitting device according to claim 1, wherein the pyrromethene derivative is a pyrromethene derivative that, when excited by excitation light, shows emission having a peak wavelength observed in a region of not less than 500 nm and not more than 580 nm.

13. The light-emitting device according to claim 1, wherein the pyrromethene derivative is a pyrromethene derivative that, when excited by excitation light, shows emission having a peak wavelength observed in a region of not less than 580 nm and not more than 750 nm.

14. The light-emitting device according to claim 1, wherein the color conversion component comprises a resin.

15. The light-emitting device according to claim 14, wherein the resin has an oxygen permeability of not less than 0.1 cc/m²·day·atm.

16. A display comprising:
the light-emitting device according to claim 1.

17. A color conversion substrate comprising:
a pyrromethene derivative, wherein the pyrromethene derivative is a compound represented by the general formula (1) below:

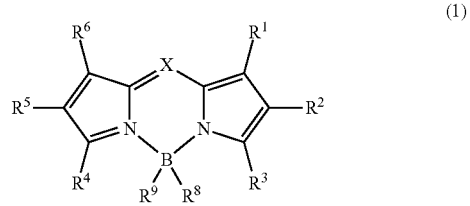

(1)

where in the general formula (1), X is C—$R^7$ or N, and $R^1$ to $R^9$ are the same as or different from one another and are each selected from hydrogen, alkyl group, cycloalkyl group, heterocyclic group, alkenyl group, cycloalkenyl group, alkynyl group, hydroxy group, thiol group, alkoxy group, alkylthio group, aryl ether group, aryl thioether group, aryl group, heteroaryl group, halogen, cyano group, aldehyde group, carbonyl group, carboxy group, ester group, carbamoyl group, amino group, nitro group, silyl group, siloxanyl group, boryl group, sulfo group, phosphine oxide group, and fused ring and aliphatic ring formed with an adjacent substituent, and wherein either $R^8$ or $R^9$ in the general formula (1) is a cyano group.

18. The light-emitting device according to claim 1, wherein the color conversion component further comprises an assist dopant.

19. (New The light-emitting device according to claim 10, wherein $R^1$, $R^3$, $R^4$ and $R^6$ in the general formula (1) are the same as one another and are each a substituted or unsubstituted alkyl group.

20. The light-emitting device according to claim 10, wherein $R^1$, $R^3$, $R^4$ and $R^6$ in the general formula (1) are different from one another and are each a substituted or unsubstituted alkyl group.

* * * * *

UNITED STATES PATENT AND TRADEMARK OFFICE
CERTIFICATE OF CORRECTION

PATENT NO. : 11,957,020 B2
APPLICATION NO. : 16/962967
DATED : April 9, 2024
INVENTOR(S) : Yasunori Ichihashi et al.

Page 1 of 1

It is certified that error appears in the above-identified patent and that said Letters Patent is hereby corrected as shown below:

In the Claims

In Column 140, Line 50 in Claim 19 delete the word "(New".

Signed and Sealed this
Fifth Day of August, 2025

Coke Morgan Stewart
*Acting Director of the United States Patent and Trademark Office*